US012201018B2

(12) United States Patent
Kawakami et al.

(10) Patent No.: US 12,201,018 B2
(45) Date of Patent: Jan. 14, 2025

(54) LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Kanagawa-ken (JP)

(72) Inventors: Sachiko Kawakami, Kanagawa (JP); Nozomi Komatsu, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 699 days.

(21) Appl. No.: 17/606,152

(22) PCT Filed: Apr. 24, 2020

(86) PCT No.: PCT/IB2020/053875
§ 371 (c)(1),
(2) Date: Oct. 25, 2021

(87) PCT Pub. No.: WO2020/222097
PCT Pub. Date: Nov. 5, 2020

(65) Prior Publication Data

US 2022/0209136 A1 Jun. 30, 2022

(30) Foreign Application Priority Data

Apr. 30, 2019 (JP) ................................ 2019-087091

(51) Int. Cl.

| | |
|---|---|
| ***H10K 50/11*** | (2023.01) |
| ***H10K 85/60*** | (2023.01) |
| *H10K 50/15* | (2023.01) |
| *H10K 50/16* | (2023.01) |
| *H10K 50/84* | (2023.01) |
| *H10K 101/10* | (2023.01) |

(52) U.S. Cl.
CPC ....... *H10K 85/6572* (2023.02); *H10K 85/622* (2023.02); *H10K 85/626* (2023.02); *H10K 85/654* (2023.02); *H10K 50/11* (2023.02); *H10K 50/15* (2023.02); *H10K 50/16* (2023.02); *H10K 50/841* (2023.02); *H10K 2101/10* (2023.02)

(58) Field of Classification Search
None
See application file for complete search history.

(56) References Cited

U.S. PATENT DOCUMENTS

| | | | |
|---|---|---|---|
| 8,796,917 B2 | 8/2014 | Kang et al. | |
| 9,175,213 B2 | 11/2015 | Seo et al. | |
| 9,634,279 B2 | 4/2017 | Seo et al. | |
| 10,367,160 B2 | 7/2019 | Seo et al. | |
| 10,978,661 B2 | 4/2021 | Seo et al. | |
| 2012/0205632 A1 | 8/2012 | Shitagaki et al. | |
| 2012/0206035 A1 | 8/2012 | Shitagaki et al. | |
| 2012/0242219 A1 | 9/2012 | Seo et al. | |
| 2012/0280613 A1 | 11/2012 | Kang et al. | |
| 2014/0330013 A1 | 11/2014 | Aihara et al. | |
| 2021/0226146 A1 | 7/2021 | Seo et al. | |
| 2023/0209859 A1 * | 6/2023 | Seo .................... | H10K 85/6572 257/40 |

FOREIGN PATENT DOCUMENTS

| | | |
|---|---|---|
| CN | 103443950 A | 12/2013 |
| CN | 107879993 A | 4/2018 |
| DE | 11 2012 001 364 B4 | 12/2013 |
| EP | 2 508 585 A1 | 10/2012 |
| JP | 2012-212879 A | 11/2012 |
| JP | 2014-508130 | 4/2014 |
| JP | 2014-111548 A | 6/2014 |

(Continued)

OTHER PUBLICATIONS

International Search Report (Application No. PCT/IB2020/053875) Dated Aug. 4, 2020.
Written Opinion (Application No. PCT/IB2020/053875) Dated Aug. 4, 2020.

*Primary Examiner* — Robert S Loewe
(74) *Attorney, Agent, or Firm* — Husch Blackwell LLP

(57) ABSTRACT

A novel light-emitting device is provided. A light-emitting device with a long lifetime is provided. The light-emitting device includes an anode, a cathode, and an EL layer. The light-emitting layer is positioned between the anode and the cathode. The EL layer includes a light-emitting layer and an electron-transport layer. The electron-transport layer is positioned between the light-emitting layer and the cathode. The light-emitting layer contains a first organic compound, a second organic compound, and an emission center substance. The combination of the first organic compound and the second organic compound can form an exciplex. The electron-transport layer contains an organic compound represented by General Formula (G1) below. (Note that in General Formula (G1) below, Ar1 represents a benzoquinolyl group or a benzoisoquinolyl group, and Ar2 represents a triphenylenylnaphthylene group or a naphthylenyltriphenylene-diyl group.)

(G1)

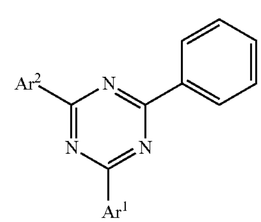

20 Claims, 16 Drawing Sheets

(56) References Cited

FOREIGN PATENT DOCUMENTS

| | | | | | |
|---|---|---|---|---|---|
| KR | 2012-0078302 | A | | 7/2012 | |
| KR | 2014-0033051 | A | | 3/2014 | |
| KR | 2017-0065317 | A | | 6/2017 | |
| KR | 20190064508 | A | * | 6/2019 | ........... C07D 401/14 |
| KR | 2019-0081970 | A | | 7/2019 | |
| TW | 201244166 | | | 11/2012 | |
| WO | WO 2012/091225 | A1 | | 7/2012 | |
| WO | WO 2012/127990 | A1 | | 9/2012 | |
| WO | WO-2017095100 | A1 | * | 6/2017 | ........... C07D 251/12 |

* cited by examiner

LIGHT-EMITTING DEVICE, LIGHT-EMITTING APPARATUS, ELECTRONIC DEVICE, AND LIGHTING DEVICE

This application is a 371 of international application PCT/IB2020/053875 filed on Apr. 24, 2020 which is incorporated herein by reference.

TECHNICAL FIELD

Embodiments of the present invention relate to a light-emitting element, a light-emitting device, a display module, a lighting module, a display device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Thus, more specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL elements) including organic compounds and utilizing electroluminescence (EL) have been put into practical use. In the basic structure of such light-emitting devices, an organic compound layer containing a light-emitting material (an EL layer) is interposed between a pair of electrodes. Carriers are injected by application of voltage to the element, and recombination energy of the carriers is used, whereby light emission can be obtained from the light-emitting material.

Such light-emitting devices are of a self-light-emitting type and thus have advantages over liquid crystal displays, such as high visibility and no need for backlight when used as pixels of a display, and are suitable as flat panel display elements which may replace liquid crystals. Displays including such light-emitting devices are also highly advantageous in that they can be fabricated to be thin and lightweight. Moreover, an extremely fast response speed is also a feature.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be applied to lighting and the like.

Displays or lighting devices using light-emitting devices can be suitably used for a variety of electronic devices as described above, and research and development of light-emitting devices have progressed for higher efficiency and a longer lifetime.

Patent Document 1 discloses a cyclic azine compound having a nitrogen-containing fused aromatic group that can be used as an electron-transport material.

The characteristics of light-emitting devices have been improved considerably, but are still insufficient to satisfy advanced requirements for various characteristics such as efficiency and durability.

REFERENCE

Patent Document

[Patent Document 1] Japanese Published Patent Application No. 2014-111548

SUMMARY OF THE INVENTION

Problems to be Solved by the Invention

Thus, an object of one embodiment of the present invention is to provide a novel light-emitting device. Another object is to provide a light-emitting device with high emission efficiency. Another object is to provide a light-emitting device with a long lifetime. Another object is to provide a light-emitting device with low driving voltage.

Alternatively, an object of another embodiment of the present invention is to provide a light-emitting apparatus, an electronic device, and a display device each having high reliability. Alternatively, an object of another embodiment of the present invention is to provide a light-emitting apparatus, an electronic device, and a display device each with low power consumption.

It is only necessary that at least one of the above-described objects be achieved in the present invention.

Means for Solving the Problems

One embodiment of the present invention is a light-emitting device which includes an anode, a cathode, and an EL layer and in which the EL layer is positioned between the anode and the cathode, the EL layer includes a light-emitting layer and an electron-transport layer, the electron-transport layer is positioned between the light-emitting layer and the cathode, the light-emitting layer contains a host material and an emission center substance, an absorption band positioned on the longest wavelength side in an absorption spectrum of the emission center substance overlaps with a peak of an emission spectrum of the host material, and the electron-transport layer contains an organic compound represented by General Formula (G1) below.

[Chemical Formula 1]

(G1)

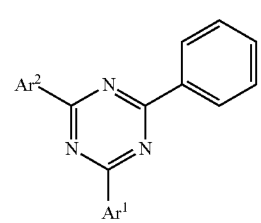

Note that in General Formula (G1) above, $Ar^1$ represents a benzoquinolyl group or a benzoisoquinolyl group, and $Ar^2$ represents a triphenylenylnaphthylene group or a naphthylenyltriphenylene-diyl group.

Another embodiment of the present invention is a light-emitting device which includes an anode, a cathode, and an EL layer and in which the EL layer is positioned between the anode and the cathode, the EL layer includes a light-emitting layer and an electron-transport layer, the electron-transport layer is positioned between the light-emitting layer and the cathode, the light-emitting layer contains a first organic compound, a second organic compound, and an emission center substance, the combination of the first organic compound and the second organic compound can form an exciplex, and the electron-transport layer contains an organic compound represented by General Formula (G1) below.

[Chemical Formula 2]

(G1)

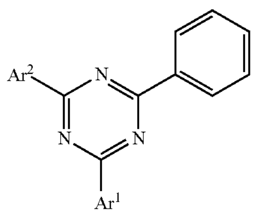

Note that in General Formula (G1) above, $Ar^1$ represents a benzoquinolyl group or a benzoisoquinolyl group, and $Ar^2$ represents a triphenylenylnaphthylene group or a naphthylenyltriphenylene-diyl group.

Another embodiment of the present invention is a light-emitting device with the above-described structure, in which the absorption band positioned on the longest wavelength side in the absorption spectrum of the emission center substance overlaps with the peak of the emission spectrum of the exciplex.

Another embodiment of the present invention is a light-emitting device in which the above $Ar^1$ is any of groups represented by Structural Formulae (1-1) to (1-11) below.

[Chemical Formula 3]

(1-1)

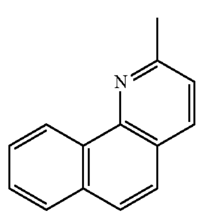

(1-2)

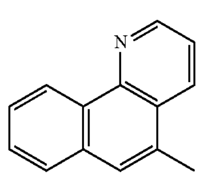

(1-3)

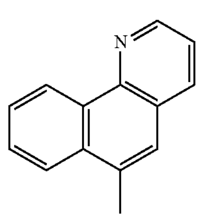

-continued (1-4)

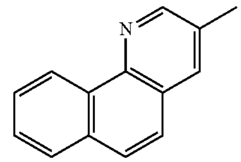

(1-5)

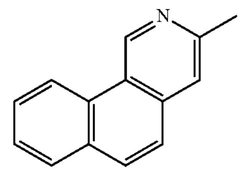

(1-6)

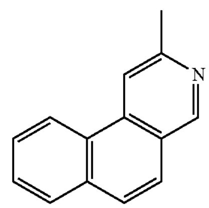

(1-7)

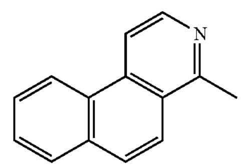

(1-8)

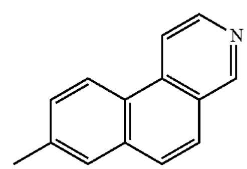

(1-9)

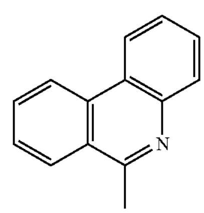

(1-10)

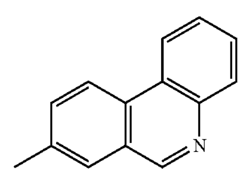

(1-11)

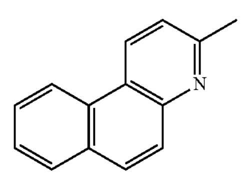

Another embodiment of the present invention is a light-emitting device with the above-described structure, in which the above $Ar^2$ is any of groups represented by Structural Formulae (2-1) to (2-12) below.

[Chemical Formula 4]
(2-1)
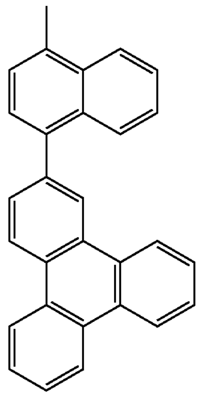
(2-2)
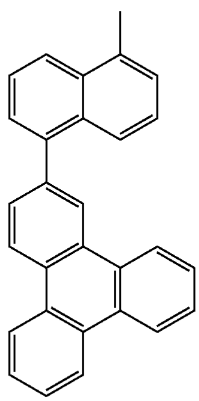
(2-3)
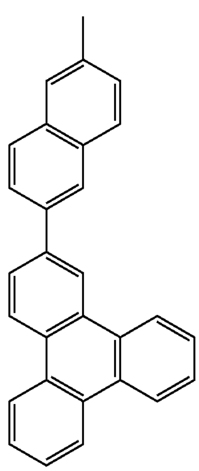
-continued
(2-4)
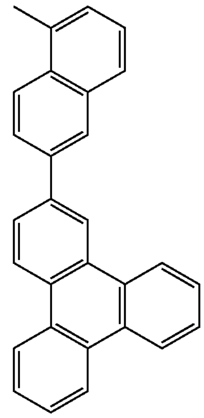
(2-5)
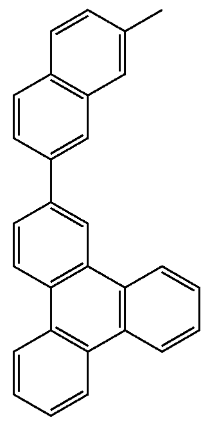
(2-6)
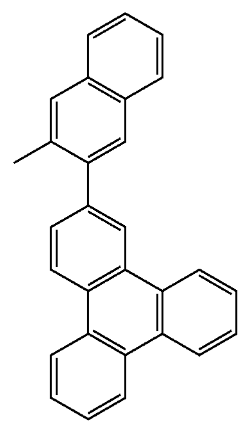
(2-7)
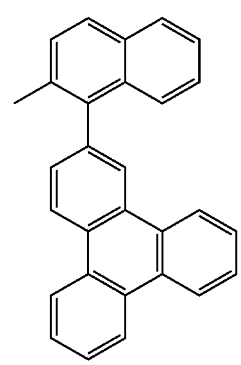

-continued (2-8)

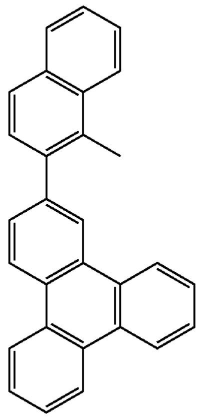

(2-9)

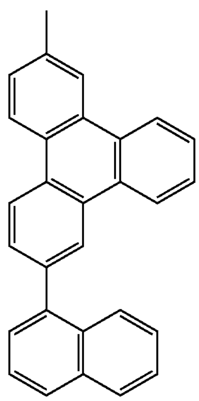

(2-10)

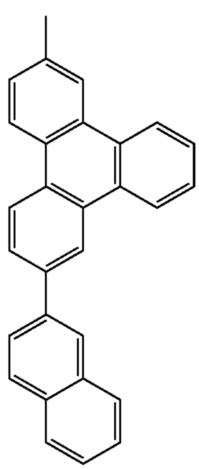

(2-11)

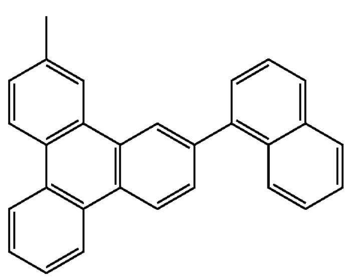

-continued (2-12)

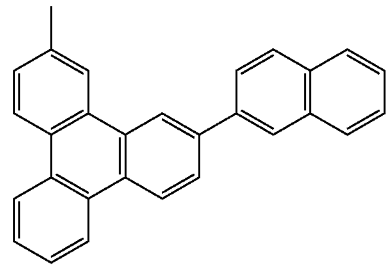

Another embodiment of the present invention is a light-emitting device with the above-described structure, in which the organic compound represented by General Formula (G1) above is the organic compound represented by Structural Formula (100) below.

[Chemical Formula 5]

(100)

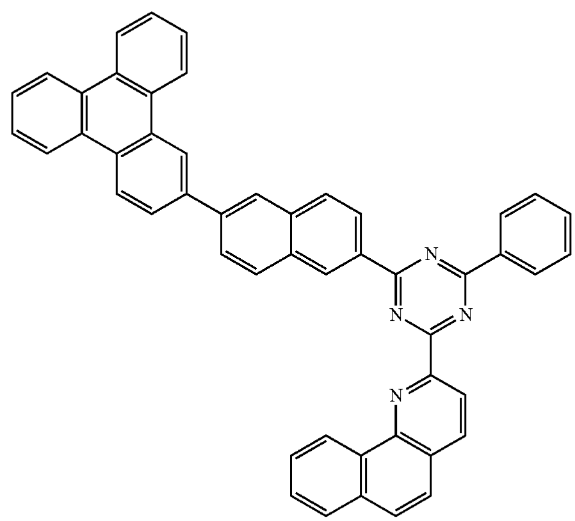

Another embodiment of the present invention is a light-emitting device with the above structure, in which the emission center substance is a phosphorescent substance.

Another embodiment of the present invention is a light-emitting device with the above structure, in which the first organic compound is an organic compound having an electron-transport property, and the second organic compound is an organic compound having a hole-transport property.

Another embodiment of the present invention is an electronic device with the above structure, including at least one of a sensor, an operation button, a speaker, or a microphone.

Another embodiment of the present invention is a light-emitting apparatus with the above structure, including a transistor or a substrate.

Another embodiment of the present invention is a lighting device with the above structure, including a housing.

Note that the light-emitting apparatus in this specification includes, in its category, an image display device that uses a light-emitting device. The light-emitting apparatus may also include a module in which a light-emitting device is provided with a connector such as an anisotropic conductive film or a TCP (Tape Carrier Package), a module in which a printed wiring board is provided at the end of a TCP, and a module in which an IC (integrated circuit) is directly mounted on a light-emitting device by a COG (Chip On Glass) method. Furthermore, in some cases, lighting equipment or the like includes the light-emitting apparatus.

Effect of the Invention

One embodiment of the present invention can provide a novel light-emitting device. Another embodiment of the present invention can provide a light-emitting device with a long lifetime. Another embodiment of the present invention can provide a light-emitting device with high emission efficiency.

Another embodiment of the present invention can provide a light-emitting apparatus, an electronic device, and a display device each having high reliability. Another embodiment of the present invention can provide a light-emitting apparatus, an electronic device, and a display device each with low power consumption.

Note that the description of these effects does not preclude the existence of other effects. Note that one embodiment of the present invention does not have to have all of these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 9A, FIG. 9B1, FIG. 9B2, and FIG. 9C are perspective views showing examples of electronic devices.

MODE FOR CARRYING OUT THE INVENTION

Embodiments of the present invention are described in detail below with reference to drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Embodiment 1

Figure 1A:
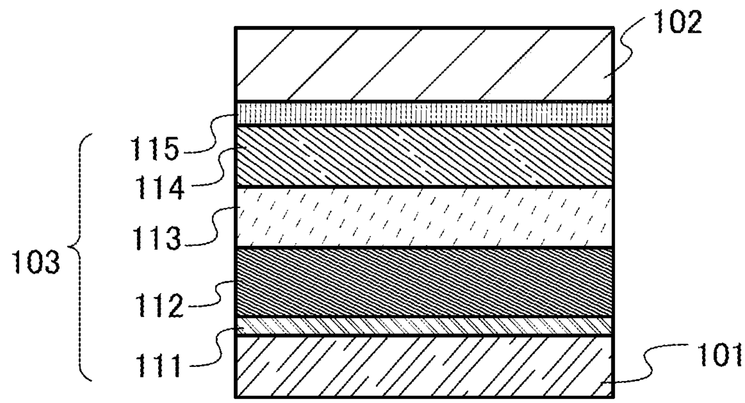
FIG. 1A, FIG. 1B, and FIG. 1C are schematic diagrams of light-emitting devices.

FIG. 1A is a diagram illustrating a light-emitting device of one embodiment of the present invention. The light-emitting device of one embodiment of the present invention includes an anode 101, a cathode 102, and an EL layer 103. The EL layer 103 includes a light-emitting layer 113 and an electron-transport layer 114.

Note that although FIG. 1A additionally illustrates a hole-injection layer 111, a hole-transport layer 112, and an electron-injection layer 115 in the EL layer 103, the structure of the light-emitting device is not limited thereto. As long as the above-described components are included, a layer having another function may be included.

The hole-injection layer 111 contains a substance having an acceptor property. As the substance having an acceptor property, a compound having an electron-withdrawing group (a halogen group or a cyano group) can be used; for example, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), 2-(7-dicyanomethylene-1,3,4,5,6,8,9,10-octafluoro-7H-pyren-2-ylidene) malononitrile, and the like can be given. A compound in which electron-withdrawing groups are bonded to a condensed aromatic ring having a plurality of heteroatoms, such as HAT-CN, is particularly preferred because it is thermally stable. A [3]radialene derivative having an electron-withdrawing group (in particular, a halogen group such as a fluoro group or a cyano group) is preferable because of having a very high electron-accepting property. Specific examples include α,α,α"-1,2,3-cyclopropanetriylidenetris[4-cyano-2,3,5,6-tetrafluorobenzeneacetonitrile], α,α,α"-1,2,3-cyclopropanetriylidenetris[2,6-dichloro-3,5-difluoro-4-(trifluoromethyl)benzeneacetonitrile], and α,α,α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: $H_2Pc$) or copper phthalocyanine (CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), or a high molecular compound such as poly(3,4-ethylenedioxythiophene)/poly(styrenesulfonic acid) (PEDOT/PSS). The substance having an acceptor property can extract electrons from an adjacent hole-transport layer (or hole-transport material) by the application of an electric field.

Alternatively, a composite material in which a substance having a hole-transport property contains any of the aforementioned substances having an acceptor property can be used for the hole-injection layer 111. Note that when a composite material in which a substance having a hole-transport property contains a substance having an acceptor property, a material used to form an electrode can be selected regardless of its work function. In other words, besides a material having a high work function, a material having a low work function can also be used for the first electrode 101.

As the substance having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the substance having a hole-transport property used for the composite material preferably has a hole mobility of $1\times10^{-6}$ $cm^2/Vs$ or higher. Organic compounds which can be used as the substance with a hole-transport property in the composite material are specifically given below.

Examples of the aromatic amine compounds that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivatives include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenylanthracen-9-yl)phenyl]-9H-carbazole (abbreviation: CzPA), and 1,4-bis[4-(N-carbazolyl)phenyl]-2,3,5,6-tetraphenylbenzene. Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA). Note that the organic compound of one embodiment of the present invention can also be used.

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD).

The substance having a hole-transport property used for the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of the amine through an arylene group may be used. Note that these second organic compounds are preferably substances having an N,N-bis(4-biphenyl)amino group because a light-emitting device with a long lifetime can be manufactured. Specific examples of the above second organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazole)}triphenylamine (abbreviation: YGTBiβNB), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spiro-bi(9H-fluoren)-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]

triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-9,9-dimethyl-N-[4-(9-phenyl-9H-carbazol-3-yl)phenyl]-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Note that it is further preferable that the substance having a hole-transport property used in the composite material have a relatively deep HOMO level greater than or equal to −5.7 eV and less than or equal to −5.4 eV. The relatively deep HOMO level of the hole-transport substance used for the composite material makes it easy to inject holes into the hole-transport layer 112 and to obtain a light-emitting device having a long lifetime.

The hole-transport layer 112 is formed containing a hole-transport material. The hole-transport material preferably has a hole mobility of $1\times10^{-6}$ $cm^2/Vs$ or higher.

Examples of the material having a hole-transport property described above include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), or 4-(9-9H-carbazolyl)-4'-(4-dibenzofuranyl)-4"-(1,1'-biphenyl-4-yl)triphenylamine; a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); or a compound having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the material having a hole-transport property that is used in the composite material for the hole-injection layer 111 can also be suitably used as the material included in the hole-transport layer 112.

The hole-transport layer 112 may be formed with a plurality of layers, in which case it preferably includes a first hole-transport layer and a second hole-transport layer. The first hole-transport layer is closer to the anode 101 side than the second hole-transport layer is. Note that the second hole-transport layer also functions as an electron-blocking layer in some cases.

Materials are preferably selected so that the HOMO level of the hole-transport material contained in the first hole-transport layer is deeper than that of the hole-transport material contained in the hole-injection layer 111 and a difference between the HOMO levels is less than or equal to 0.2 eV.

In addition, the HOMO level of the material having a hole-transport property contained in the second hole-transport layer is preferably deeper than that of the material having a hole-transport property contained in the first hole-transport layer. Furthermore, it is preferable that materials be selected so that a difference between the HOMO levels is less than or equal to 0.2 eV. Owing to such a relation between the HOMO levels, holes are injected into each layer smoothly, which prevents an increase in driving voltage and deficiency of holes in the light-emitting layer.

Preferably, these materials having a hole-transport property each include a hole-transport skeleton. A carbazole skeleton, a dibenzofuran skeleton, a dibenzothiophene skeleton, and an anthracene skeleton, with which the HOMO levels of the organic compounds do not become too shallow, are preferably used as the hole-transport skeleton. Materials contained in adjacent layers (e.g., the second organic compound and the third organic compound or the third organic compound and the fourth organic compound) preferably have the same hole-transport skeleton, in which case holes can be injected smoothly. In particular, a dibenzofuran skeleton is preferably used as the hole-transport skeleton.

Furthermore, materials contained in adjacent layers are preferably the same, in which case holes can be injected more smoothly.

The light-emitting layer 113 contains a host material and an emission center substance. In that case, the host material preferably emits light whose wavelength overlaps with the wavelength on a lowest-energy-side absorption band of the emission center material. Note that it is more preferable that this overlap be large.

The host material may be composed of a single material, but is preferably composed of a plurality of organic compounds.

In the case where the host material is composed of a plurality of organic compounds, the first organic compound and the second organic compound are preferably contained. It is preferable that one of the first organic compound and the second organic compound be an organic compound having an electron-transport property and the other be an organic compound having a hole-transport property for easy adjustment of carrier balance, control of a recombination region, and the like.

Furthermore, a combination of the first organic compound and the second organic compound preferably forms an exciplex in terms of a reduction in driving voltage, an improvement in emission efficiency, and the like. Note that in the case where the first organic compound and the second organic compound form an exciplex, the exciplex preferably emits light whose wavelength overlaps with the wavelength on a lowest-energy-side absorption band of the light-emitting material. Note that it is more preferable that this overlap be large.

The above emission center substance may be a fluorescent substance or a phosphorescent substance. Furthermore, the emission center substance may be a single layer or be formed of a plurality of layers such as layers containing different materials and layers with different compositions. Note that one embodiment of the present invention is more suitably used in the case where the light-emitting layer 113 is a layer that emits phosphorescence.

Examples of a material that can be used as a fluorescent substance in the light-emitting layer 113 are as follows. Fluorescent substances other than those given below can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[gp]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[j]quinolizin-9-yl)ethenyl]-4H-pyran-4-ylidene)propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[j]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[j]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[j]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of a material that can be used as a phosphorescent substance in the light-emitting layer 113 are as follows.

Examples include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: $[Ir(mpptz\text{-}dmp)_3]$), tris(5-methyl-3,4-diphenyl-4H-1,2,4-triazolato)iridium(III) (abbreviation: $[Ir(Mptz)_3]$), or tris[4-(3-biphenyl)-5-isopropyl-3-phenyl-4H-1,2,4-triazolato]iridium(III) (abbreviation: $[Ir(iPrptz\text{-}3b)_3]$); an organometallic iridium complex having a 1H-triazole skeleton, such as tris[3-methyl-1-(2-methylphenyl)-5-phenyl-1H-1,2,4-triazolato]iridium(III) (abbreviation: $[Ir(Mptz1\text{-}mp)_3]$) or tris(1-methyl-5-phenyl-3-propyl-1H-1,2,4-triazolato)iridium(III) (abbreviation: $[Ir(Prptz1\text{-}Me)_3]$); an organometallic iridium complex having an imidazole skeleton, such as fac-tris[(1-2,6-diisopropylphenyl)-2-phenyl-1H-imidazole]iridium(III) (abbreviation: $[Ir(iPrpmi)_3]$) or tris[3-(2,6-dimethylphenyl)-7-methylimidazo[1,2-f]phenanthridinato]iridium(III) (abbreviation: $[Ir(dmpimpt\text{-}Me)_3]$); and an organometallic iridium complex in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $[Ir(CF_3ppy)_2(pic)]$), or bis[2-(4',6'-difluorophenyl)pyridinato-N,$C^{2'}$]iridium(III) acetylacetonate (abbreviation: FIracac). These compounds emit blue phosphorescence and have an emission peak at 440 nm to 520 nm.

Other examples include an organometallic iridium complex having a pyrimidine skeleton, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), or (acetylacetonato)bis(4,6-diphenylpyrimidinato)iridium(III) (abbreviation: $[Ir(dppm)_2(acac)]$); an organometallic iridium complex having a pyrazine skeleton, such as (acetylacetonato)bis(3,5-dimethyl-2-phenylpyrazinato)iridium(III) (abbreviation: $[Ir(mppr-Me)_2(acac)]$) or (acetylacetonato)bis(5-isopropyl-3-methyl-2-phenylpyrazinato)iridium(III) (abbreviation: $[Ir(mppr-iPr)_2(acac)]$); an organometallic iridium complex having a pyridine skeleton, such as tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), or bis(2-phenylquinolinato-N,$C^{2'}$)iridium(III) acetylacetonate (abbreviation: $[Ir(pq)_2(acac)]$); and a rare earth metal complex such as tris(acetylacetonato) (monophenanthroline)terbium(III) (abbreviation: $[Tb(acac)_3(Phen)]$). These are mainly compounds that emit green phosphorescence and have an emission peak at 500 nm to 600 nm. Note that organometallic iridium complexes having a pyrimidine skeleton have distinctively high reliability and emission efficiency and thus are particularly preferable.

Other examples include an organometallic iridium complex having a pyrimidine skeleton, such as (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), or bis[4,6-di(naphthalen-1-yl)pyrimidinato](dipivaloylmethanato)iridium(III) (abbreviation: $[Ir(d1npm)_2(dpm)]$); an organometallic iridium complex having a pyrazine skeleton, such as (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), or (acetylacetonato)bis[2,3-bis(4-fluorophenyl)quinoxalinato]iridium(III) (abbreviation: $[Ir(Fdpq)_2(acac)]$); an organometallic iridium complex having a pyridine skeleton, such as tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), and [2-d3-methyl-(2-pyridinyl-κN)benzofuro[2,3-b]pyridine-κC]bis[2-(5-d3-methyl-2-pyridyl-κN2)phenyl-κ]iridium(III); a platinum complex such as 2,3,7,8,12,13,17,18-octaethyl-21H,23H-porphyrin-platinum(II) (abbreviation: PtOEP); and a rare earth metal complex, such as tris(1,3-diphenyl-1,3-propanedionato)(monophenanthroline)europium(III) (abbreviation: $[Eu(DBM)_3(Phen)]$) or tris[1-(2-thenoyl)-3,3,3-trifluoroacetonato](monophenanthroline)europium(III) (abbreviation: $[Eu(TTA)_3(Phen)]$). These are compounds that emit red phosphorescence and have an emission peak at 600 nm to 700 nm. Furthermore, the organometallic iridium complexes having a pyrazine skeleton can provide red light emission with favorable chromaticity.

Besides the above-described phosphorescent compounds, other known phosphorescent materials may be selected and used.

As the host material of the light-emitting layer 113, a material having a hole-transport property, a material having an electron-transport property, or a bipolar material can be used.

Examples of the material having a hole-transport property include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), or 3,6-bis(3,5-diphenylphenyl)-9-phenylcarbazole (abbreviation: CzTP); a compound having a bicarbazole skeleton (3,3'-bicarbazole skeleton), such as 3,3'-bis(9-phenyl-9H-carbazole) (abbreviation: PCCP), 9-[1,1'-biphenyl]-4-yl-9'-phenyl-3,3'-bi-9H-carbazole (abbreviation: PCCzBP), 9-(1,1'-biphenyl-3-yl)-9'-(1,1'-biphenyl-4-yl)-9H,9'H-3,3'-bicarbazole (abbreviation: mBPCCBP), or 9-(2-naphthyl)-9'-phenyl-9H,9'H-3,3'-bicarbazole (abbreviation: βNCCP); a compound having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage.

In addition, in the description of the hole-injection layer 111 and the hole-transport layer 112, the organic compounds given as examples of the material having a hole-transport property can also be used.

Examples of the material having an electron-transport property include a metal complex, such as bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a triazine skeleton, such as 2-[3'-(triphenylen-2-yl)-1,1'-biphenyl-3-yl]-4,6-diphenyl-1,3,5-triazine (abbreviation: mTpBPTzn), 11-(4-[1,1'-biphenyl]-4-yl-6-phenyl-1,3,5-triazin-2-yl)-11,12-dihydro-12-phenyl-indolo[2,3-a]carbazole (abbreviation: BP-Icz(II)Tzn), 5-[3-(4,6-diphenyl-1,3,5-triazin-2-yl)phenyll]-7,7-dimethyl-5H,7H-indeno[2,1-b]carbazole (abbreviation: mINc(II)PTzn), or 2-[3'-(9,9-dimethyl-9H-fluoren-2-yl)-1-1'-biphenyl-3-yl]-4,6-diphenyl-1,3,5-triazine (abbreviation: mFBPTzn); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, the heterocyclic compound having a triazine skeleton, the heterocyclic compound having a diazine skeleton, and the heterocyclic compound having a pyridine skeleton are preferable because of having high reliability. In particular, the heterocyclic compound having a triazine skeleton and the heterocyclic compound having a diazine (pyrimidine or pyrazine) skeleton have a high electron-transport property and contribute to a reduction in driving voltage.

Note that in the case where two kinds of substances, a material having a hole-transport property and a material having an electron-transport property, are used as a host material in the light-emitting layer 113 in the light-emitting device of one embodiment of the present invention, the weight ratio of the content of the material having a hole-transport property to the content of the material having an electron-transport property may be 1:19 to 9:1. In the case where the two kinds of substances are used as the host material in the light-emitting layer 113, and the hole-transport material has a 3,3-bicarbazole skeleton, the weight ratio of the hole-transport material is higher than that of the electron-transport material in terms of the carrier balance, e.g., the mixture ratio (wt %) of the hole-transport material to the electron-transport material is preferably 11:1 to 6:4 in a weight ratio. In addition, the mixture ratio (wt %) of the hole-transport material to the electron-transport material may be approximately 5:5 in a weight ratio.

Figure 16:
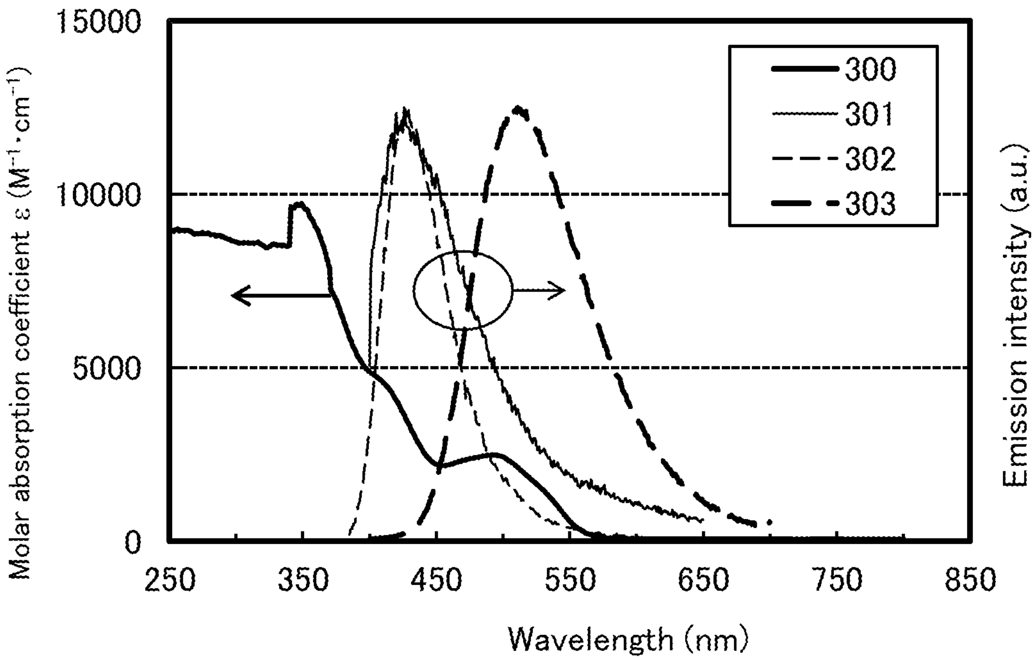
FIG. 16 shows the relation between light absorption and light emission in a light-emitting device.

In the case where these mixed materials form an exciplex, the combination of the first organic compound and the second organic compound is preferably selected so that the peak of the emission spectrum of the exciplex overlap with the wavelength on a lowest-energy-side absorption band of the light-emitting material as shown in FIG. 16, in which case energy can be transferred smoothly and light emission can be obtained efficiently. Note that 300 represents the absorption spectrum of the light emitting material, 301 represents the emission spectrum of the exciplex, 302 represents the emission spectrum of the second organic compound, and 303 represents the emission spectrum of the first organic compound. The use of the above-described structure is preferable because the driving voltage can also be reduced.

A combination of a material having an electron-transport property and a material having a hole-transport property whose HOMO level is higher than or equal to the HOMO level of the material having an electron-transport property is preferable for forming an exciplex efficiently. In addition, the LUMO level of the material having a hole-transport property is preferably higher than or equal to the LUMO level of the material having an electron-transport property. Note that the LUMO levels and the HOMO levels can be derived from the electrochemical characteristics (reduction potentials and oxidation potentials) of the compounds that are measured by cyclic voltammetry (CV) measurement.

Note that the formation of an exciplex can be confirmed by a phenomenon in which the emission spectrum of the mixed film in which the first organic compound and the second organic compound are mixed is shifted to the longer wavelength side than the emission spectrum of each of the compounds (or has another peak on the longer wavelength side), observed by comparison of the emission spectra of the first organic compound, the second organic compound, and the mixed film of these compounds, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the compounds, observed by comparison of transient PL of the first organic compound, the second organic compound, and the mixed film of these compounds. The transient PL can be rephrased as transient electroluminescence (EL). That is, the formation of an exciplex can also be confirmed by a difference in transient response observed by comparison of the transient EL of the first organic compound, the transient EL of the second organic compound, and the transient EL of the mixed film of these compounds.

The electron-transport layer 114 is provided in contact with the light-emitting layer 113. The electron-transport layer 114 contains a material having an electron-transport property. The material having an electron-transport property is preferably a material represented by General Formula (G1) below.

[Chemical Formula 6]

(G1)

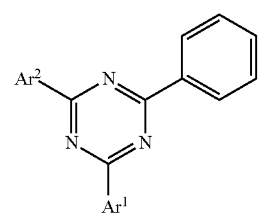

Note that in General Formula (G1) above, $Ar^1$ represents a benzoquinolinyl group or a benzoisoquinolyl group, and $Ar^2$ represents a triphenylenylnaphthylene group or a naphthylenyltriphenylene-diyl group.

Note that in General Formula (G1) above, $Ar^1$ is preferably any of groups represented by Structural Formulae (1-1) to (1-11) below.

[Chemical Formula 7]

(1-1)

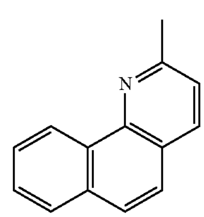

-continued
(1-2)
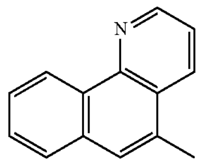
(1-3)
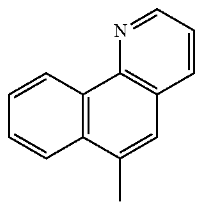
(1-4)
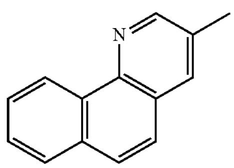
(1-5)
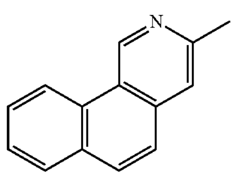
(1-6)
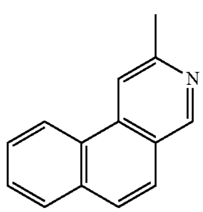
(1-7)
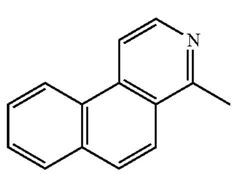
(1-8)
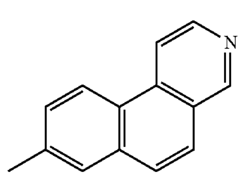
(1-9)
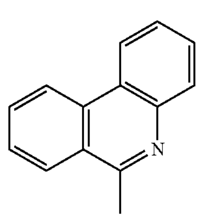
-continued
(1-10)
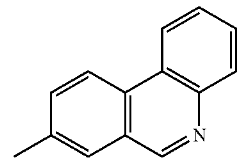
(1-11)
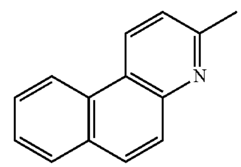
In General Formula (G1) above, $Ar^2$ is preferably any of groups represented by Structural Formulae (2-1) to (2-12) below.
[Chemical Formula 8]
(2-1)
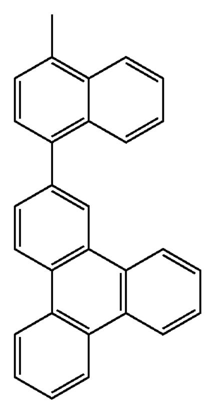
(2-2)
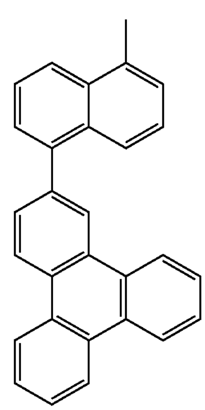

-continued
(2-3)
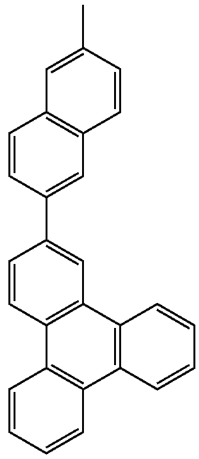
(2-4)
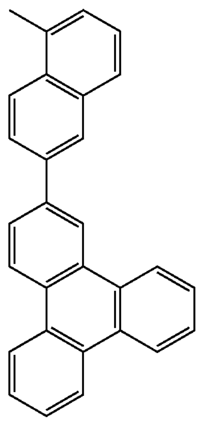
(2-5)
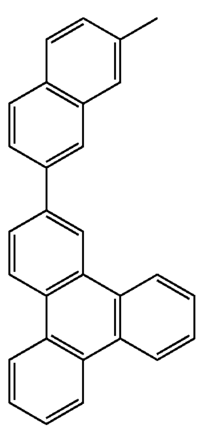
-continued
(2-6)
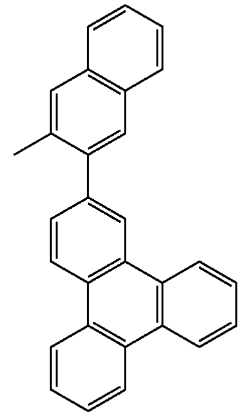
(2-7)
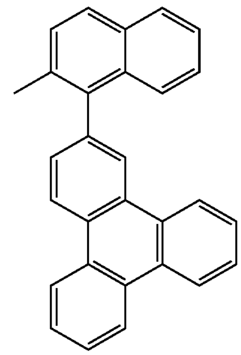
(2-8)
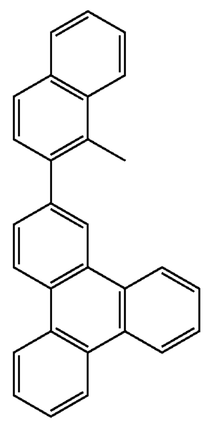
(2-9)
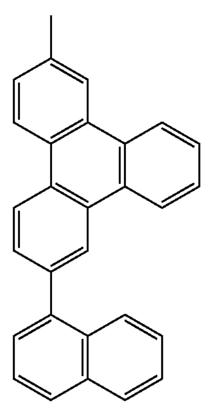

-continued
(2-10)
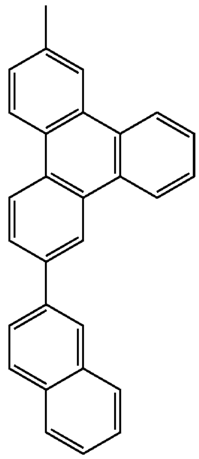
(2-11)
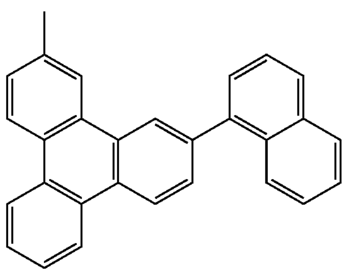
(2-12)
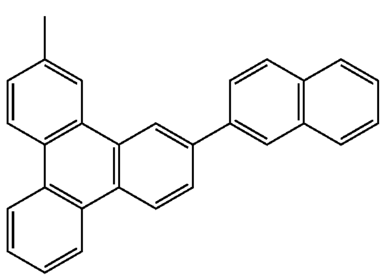
As examples of the specific structure of the organic compound represented by General Formula (G1) above, the following can be given.
[Chemical Formula 9]
(100)
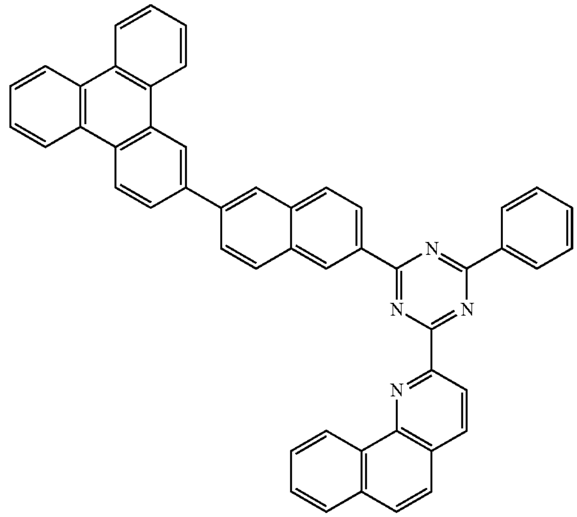
(101)
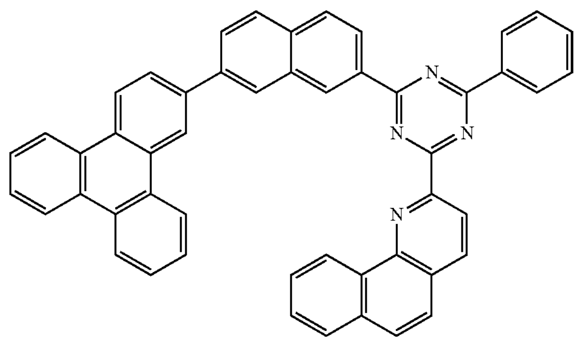
(102)
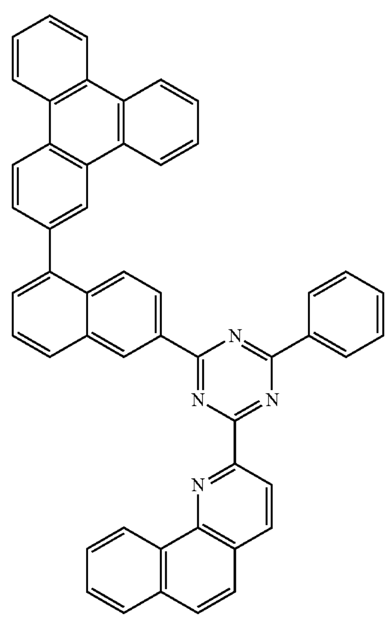

-continued
103
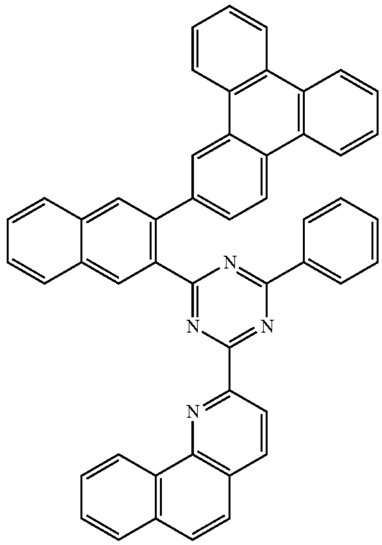
104
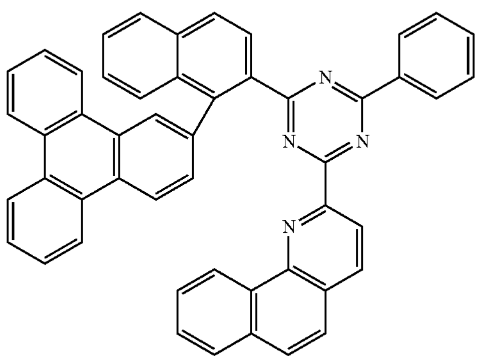
[Chemical Formula 10]
(105)
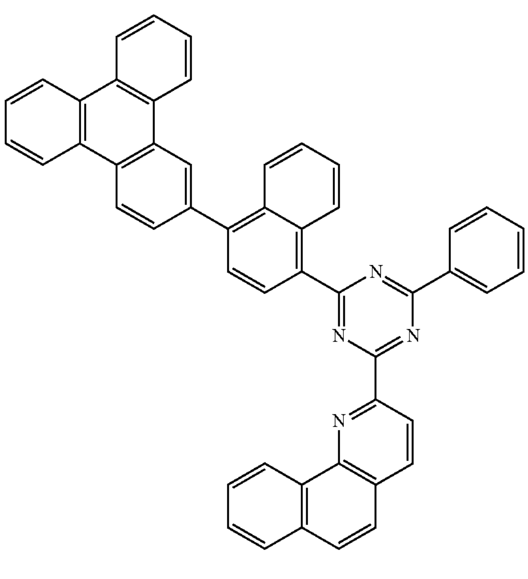
-continued
(106)
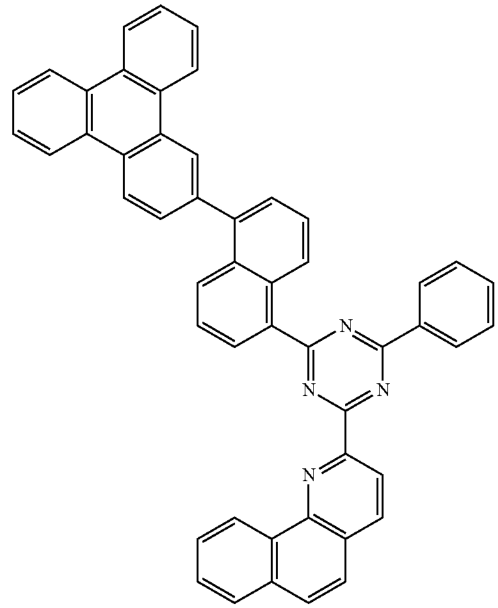
(107)
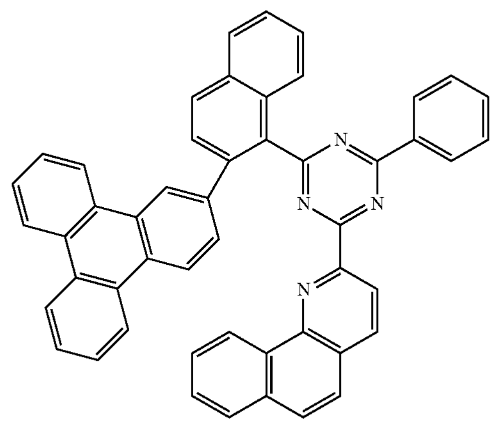
(108)
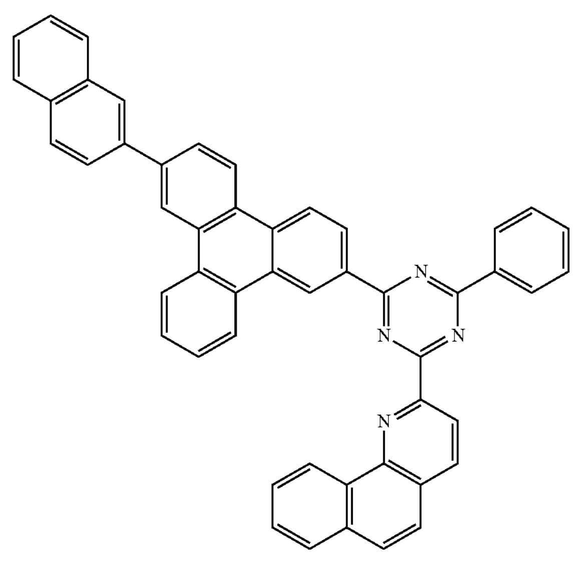

-continued
(109)
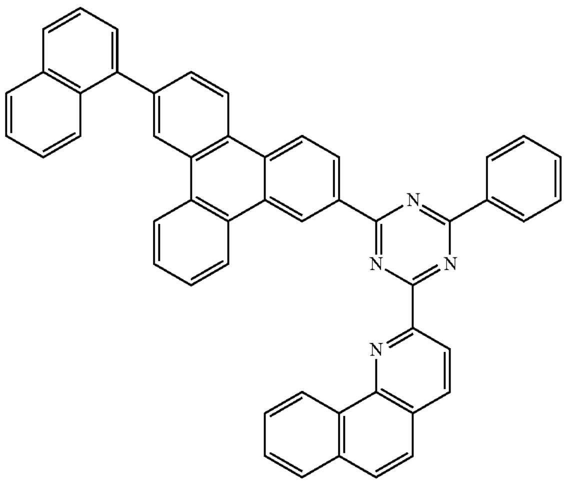
[Chemical Formula 11]
(110)
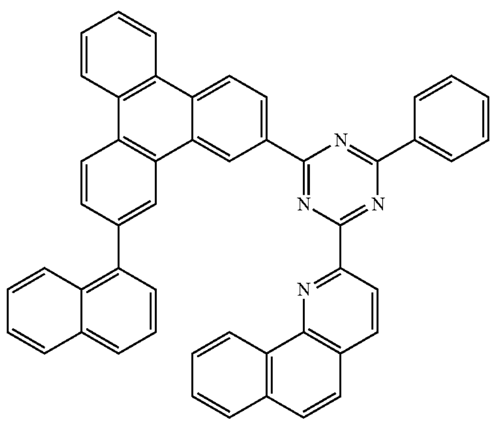
(111)
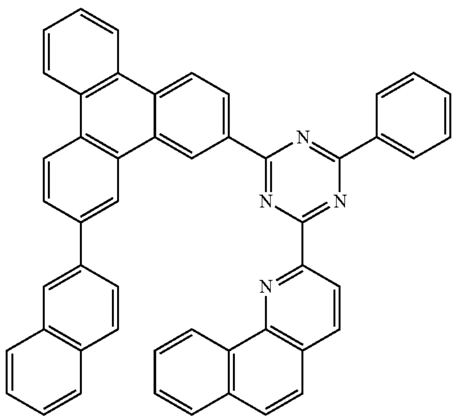
-continued
(112)
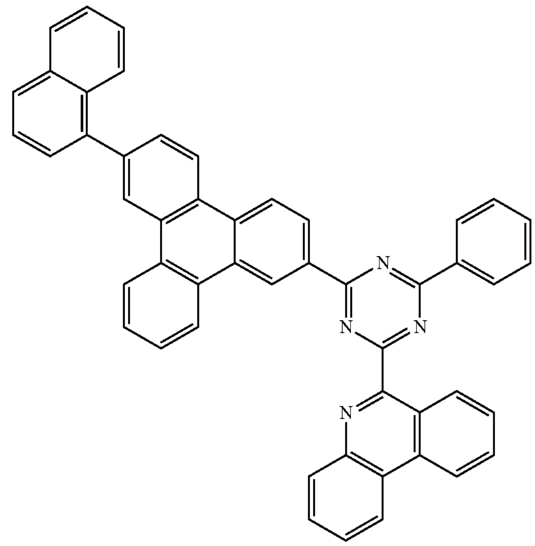
(113)
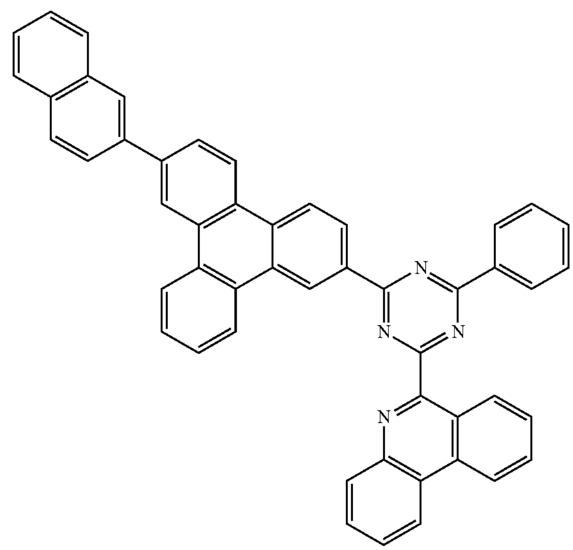
(114)
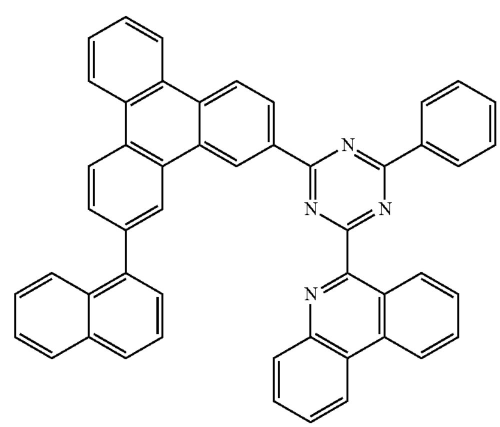

-continued
(115)
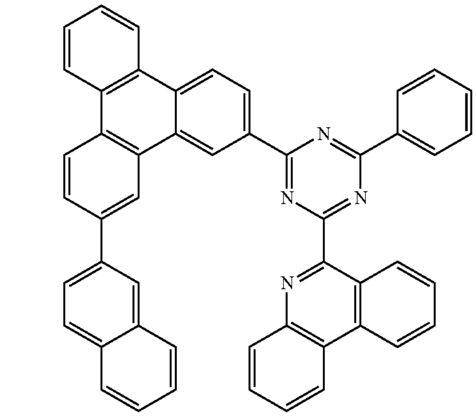
[Chemical Formula 12]
(116)
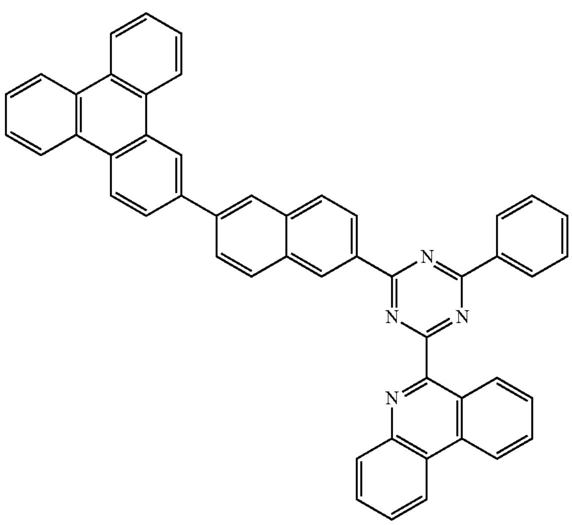
(117)
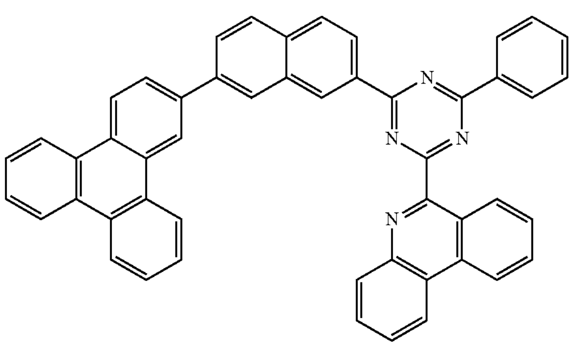
-continued
(118)
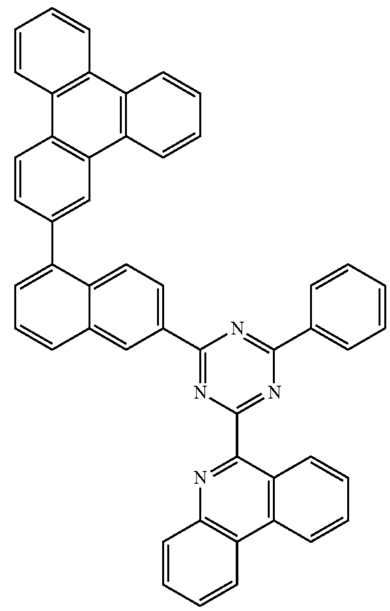
(119)
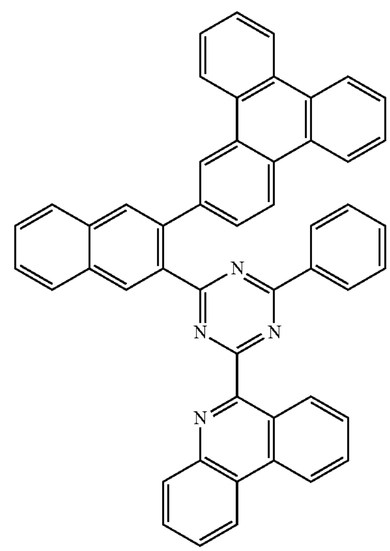
(120)
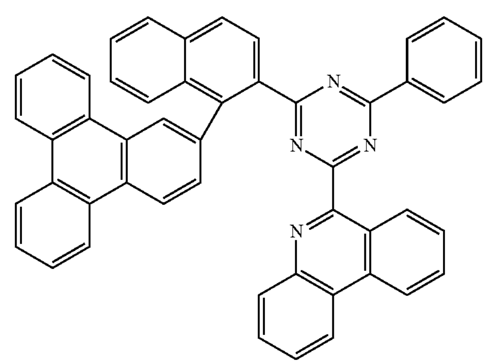

[Chemical Formula 13]
(121)
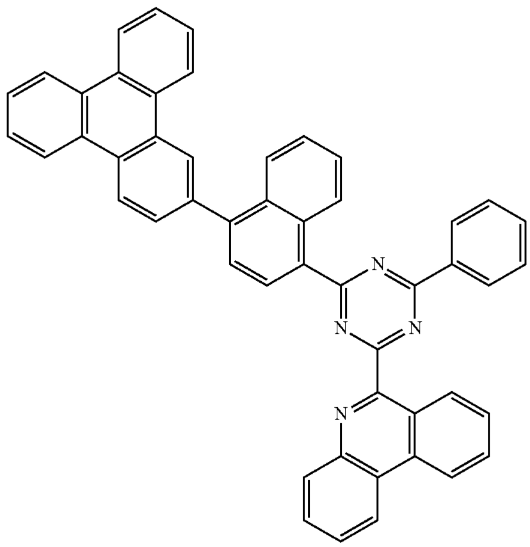
(122)
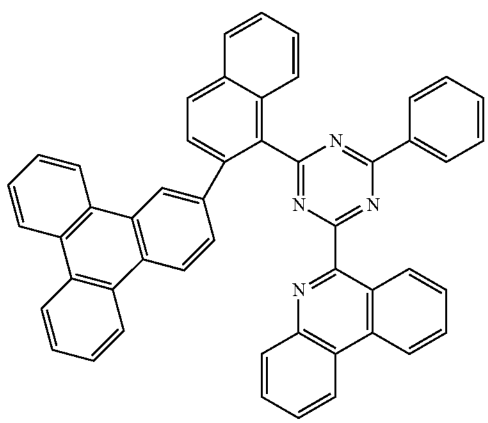
(123)
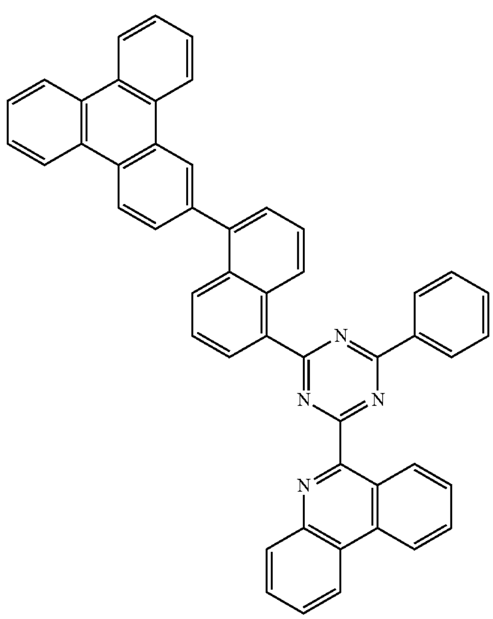
[Chemical Formula 14]
(124)
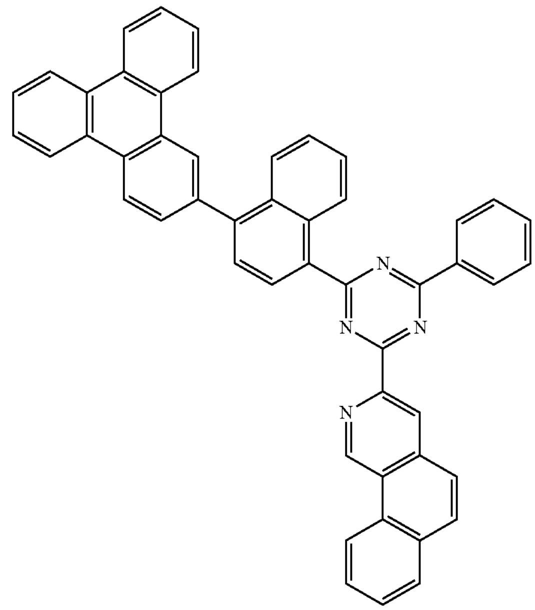
(125)
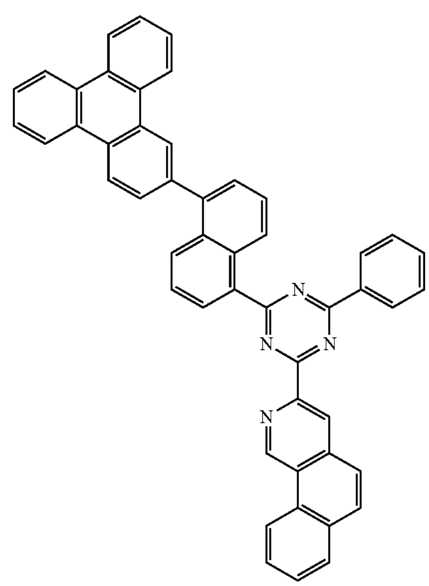

-continued
(126)
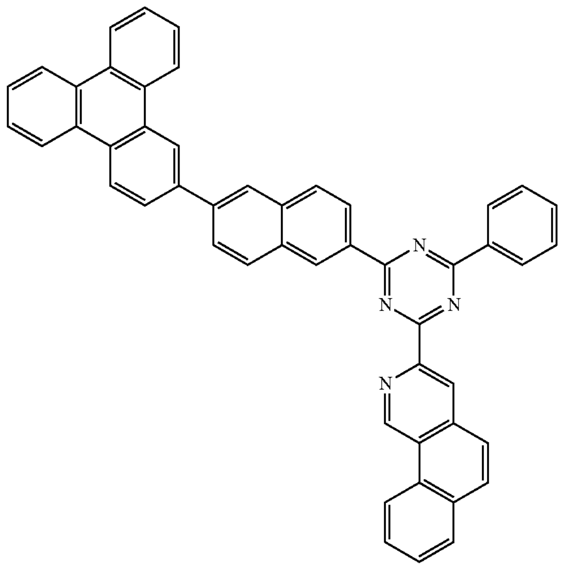
(127)
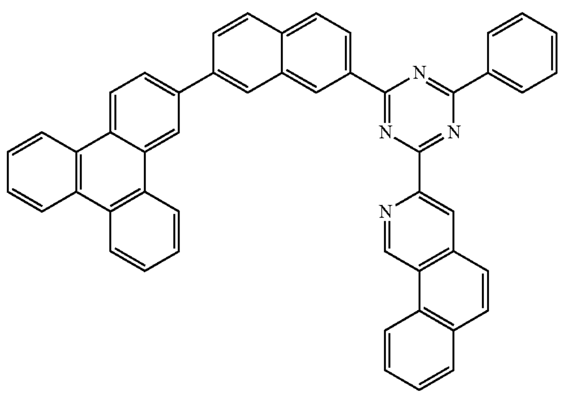
[Chemical Formula 15]
(128)
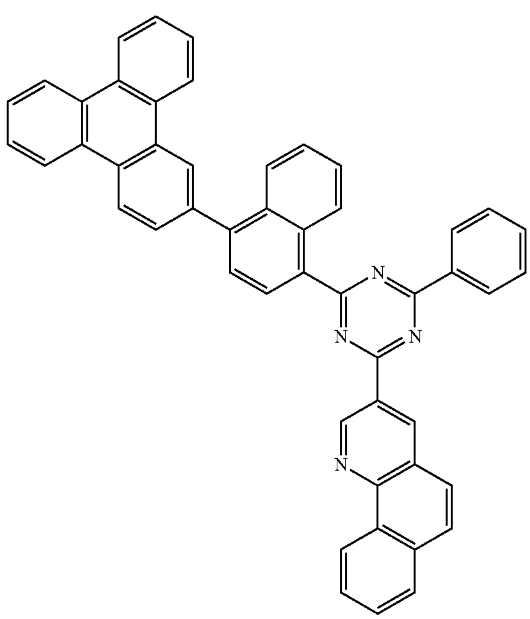
-continued
(129)
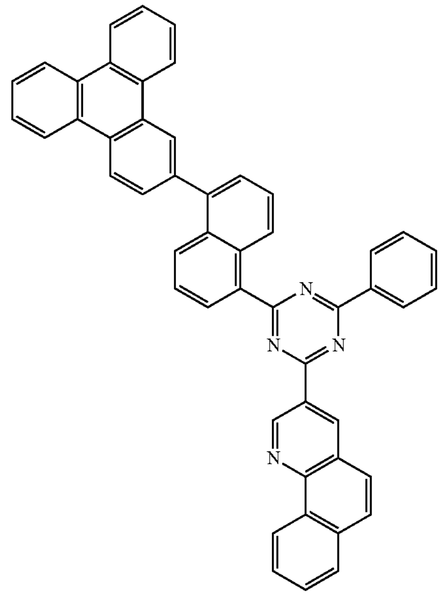
(130)
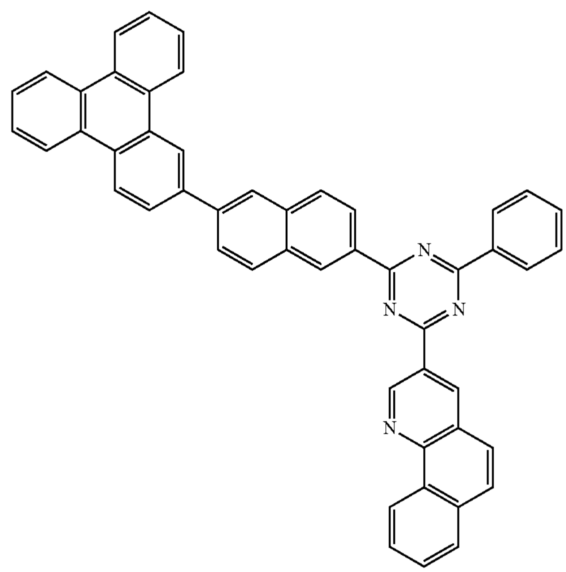
(131)
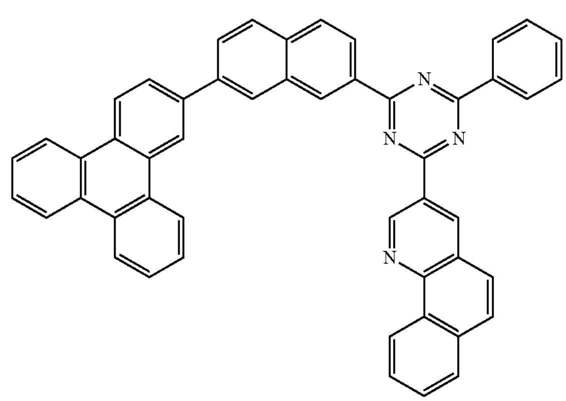

-continued
[Chemical Formula 16]
(132)
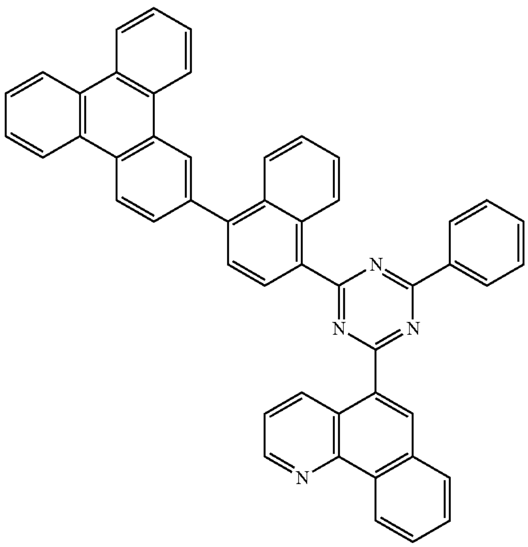
(133)
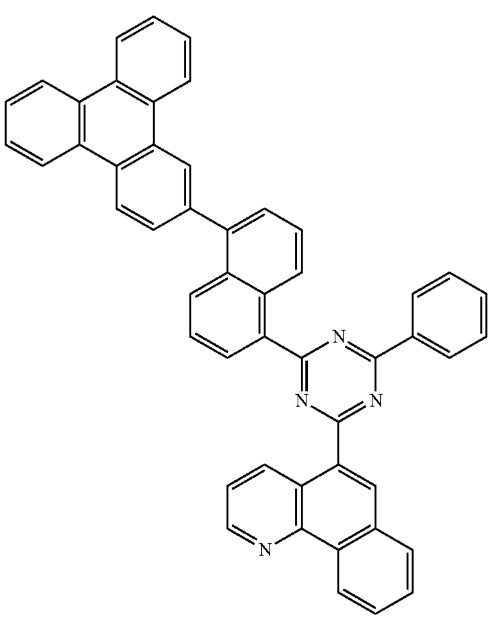
-continued
(134)
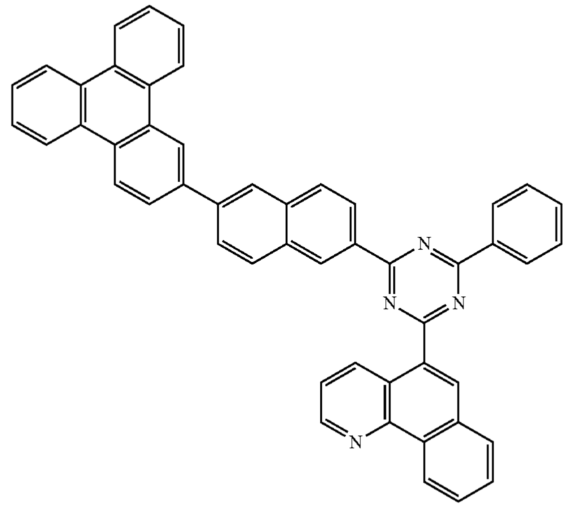
(135)
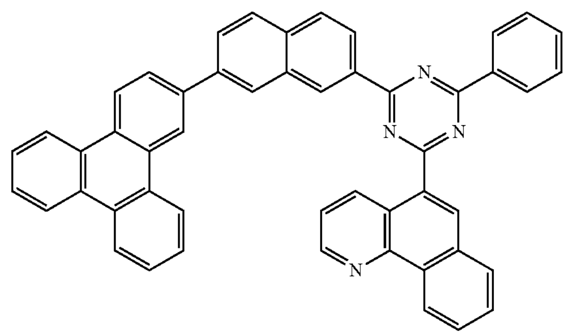
[Chemical Formula 17]
(136)
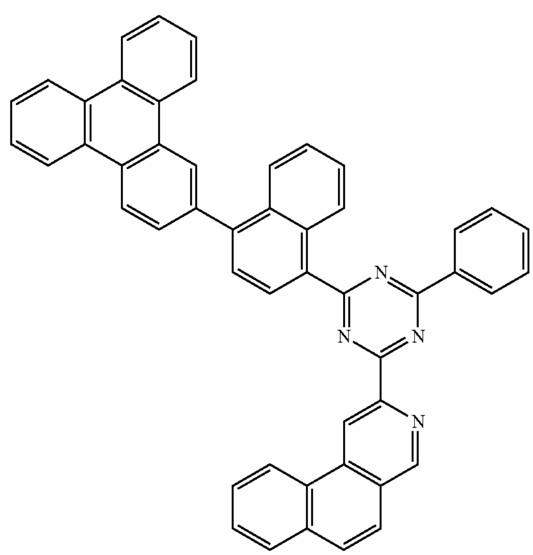

-continued
(137)
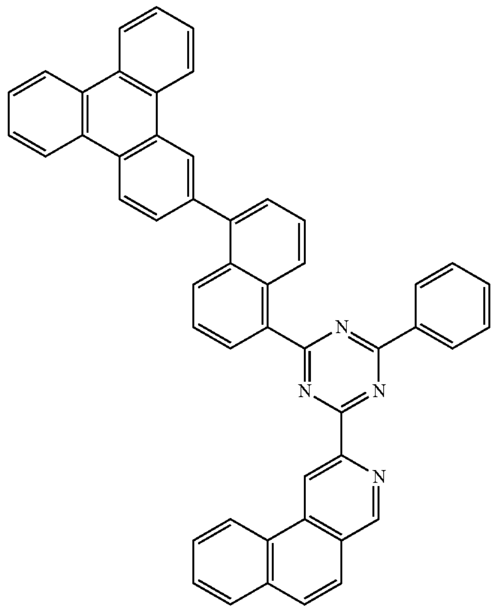
(138)
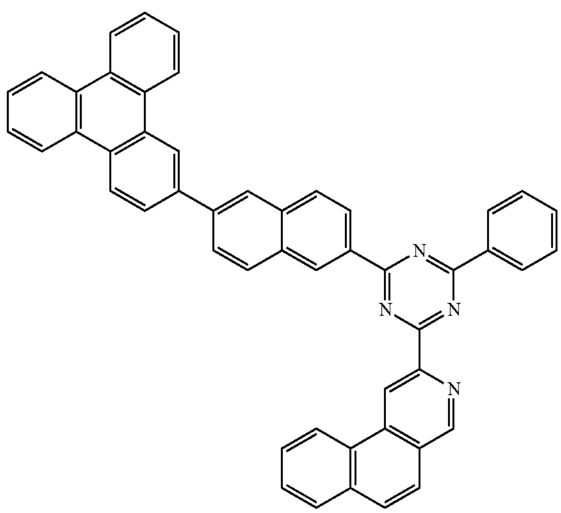
(139)
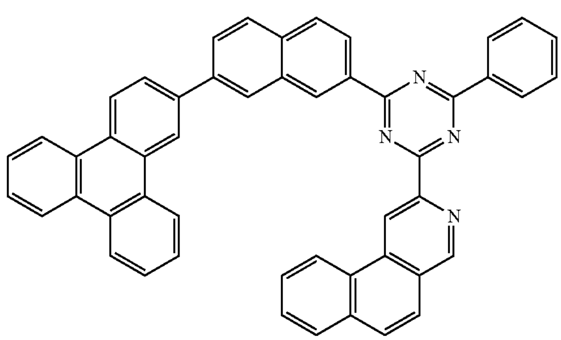
-continued
[Chemical Formula 18]
(140)
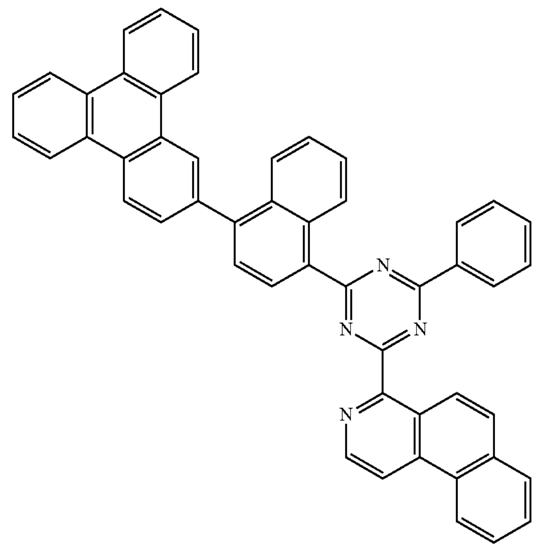
(141)
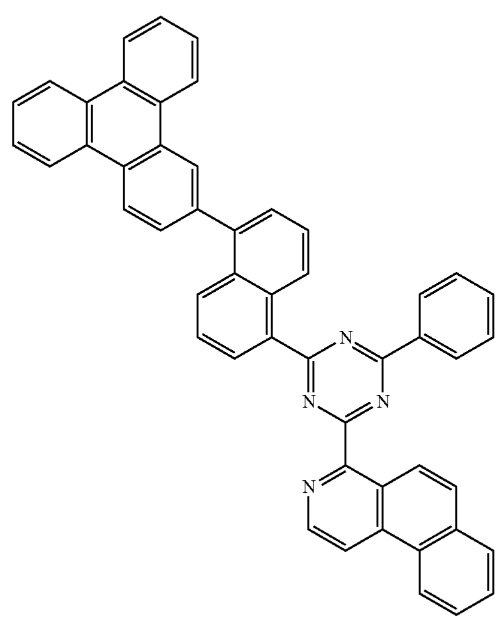

-continued
(142)
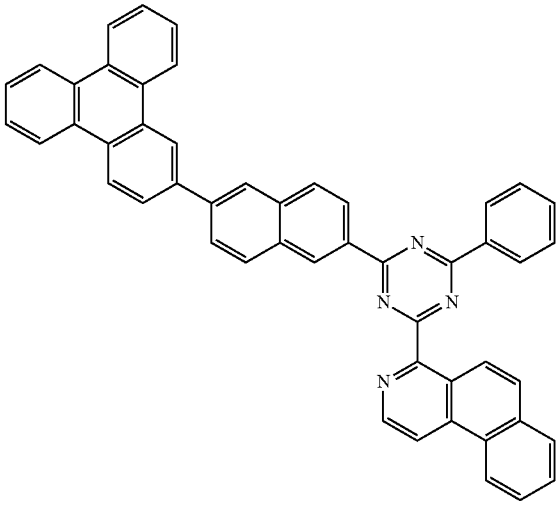
(143)
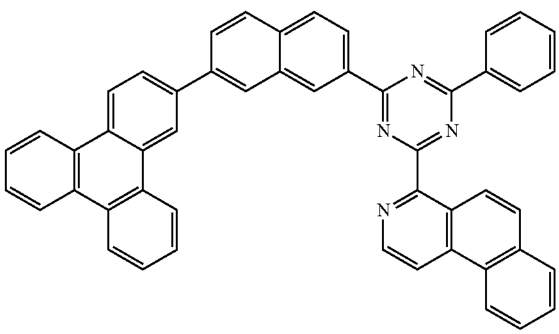
(144)
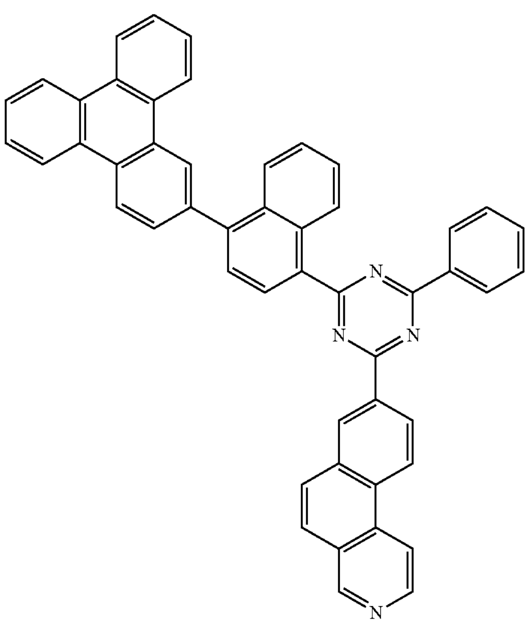
-continued
(145)
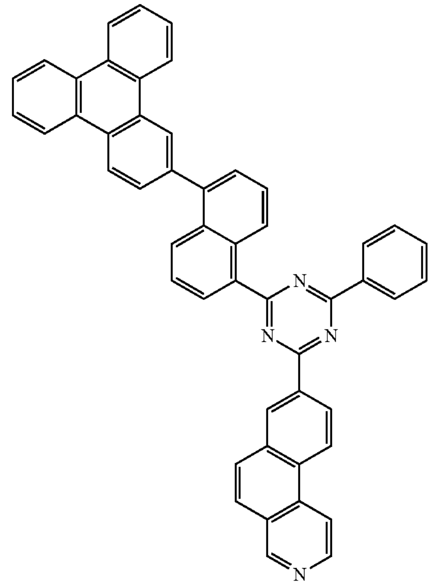
[Chemical Formula 19]
(146)
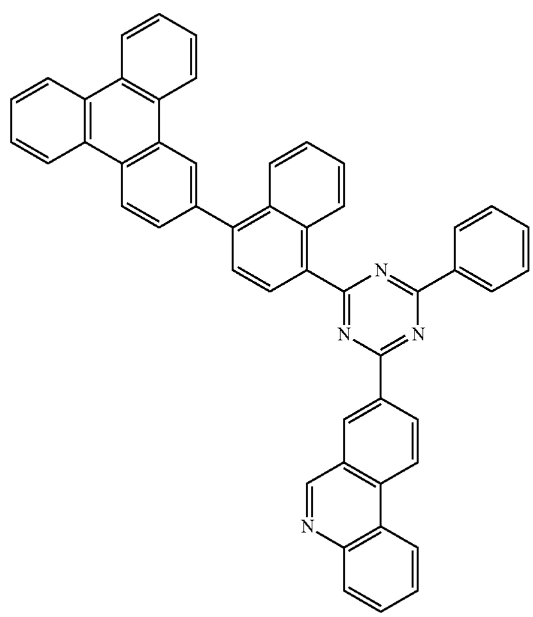

-continued
(147)
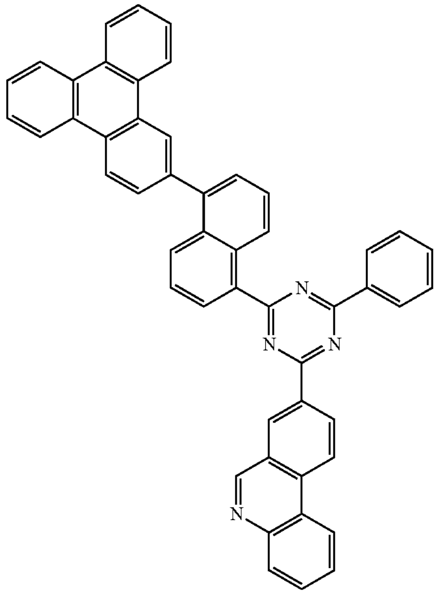
(148)
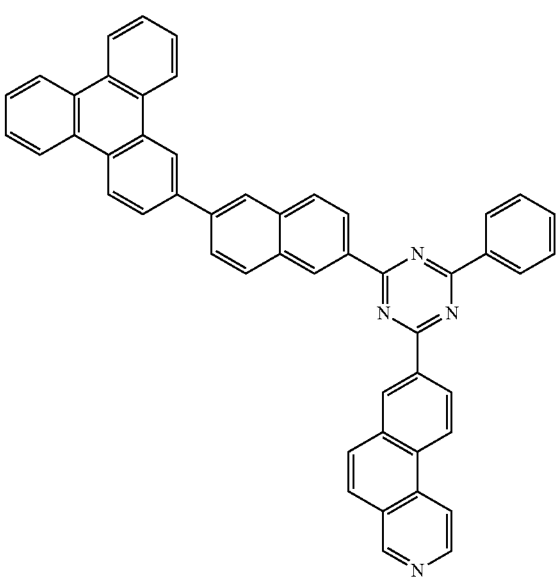
-continued
(149)
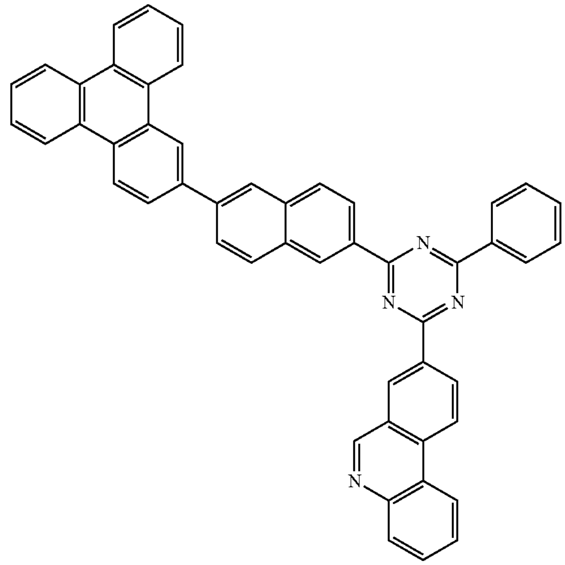
(150)
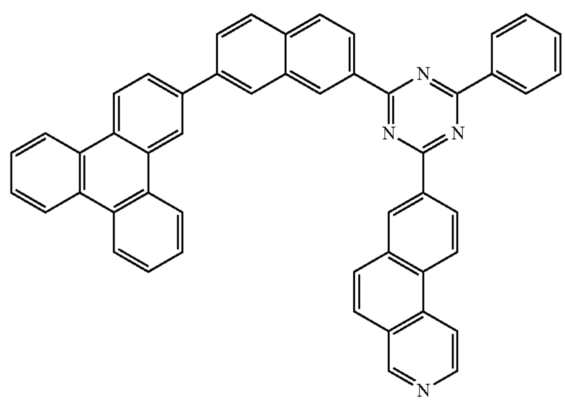
(151)
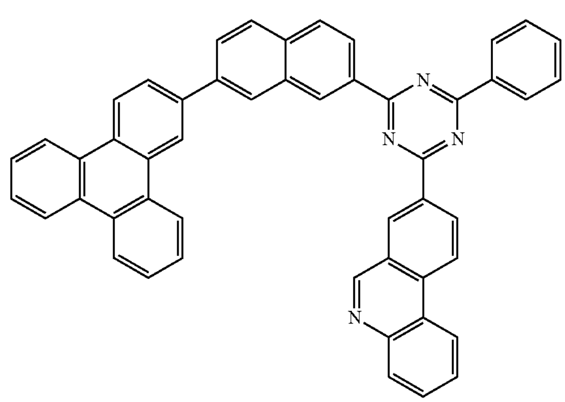

-continued
[Chemical Formula 20]
(152)
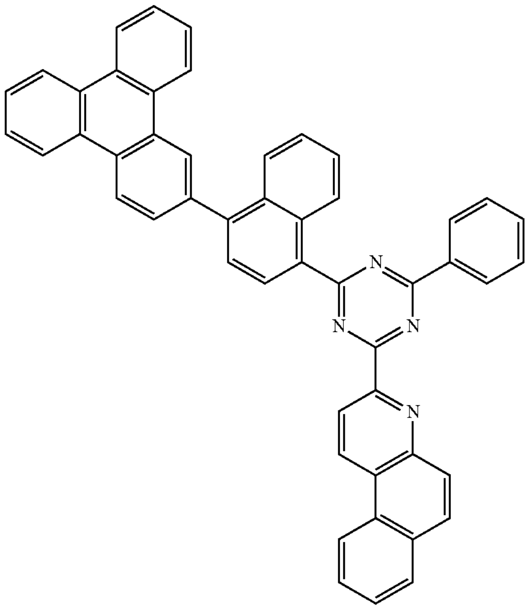
(153)
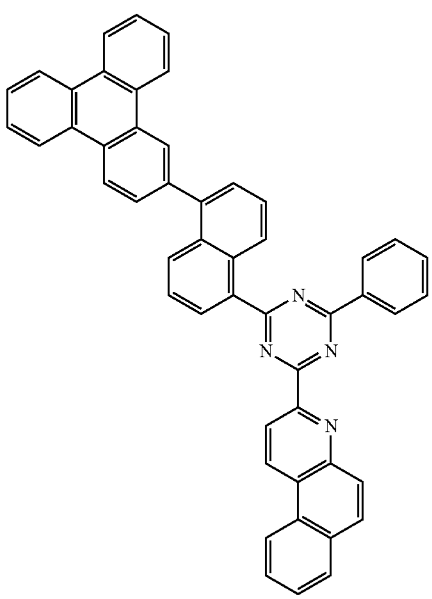
-continued
(154)
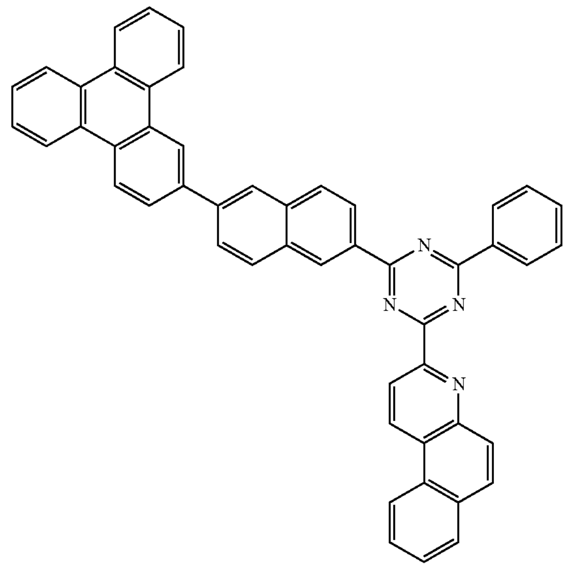
(155)
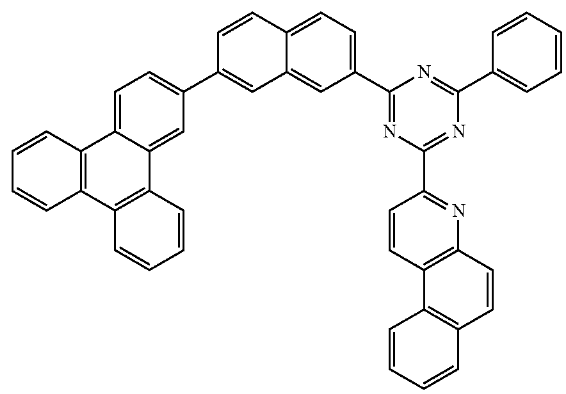
[Chemical Formula 21]
(156)
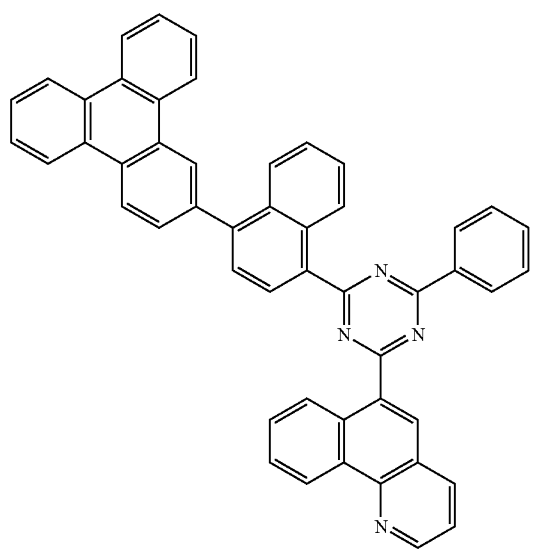

-continued (157)

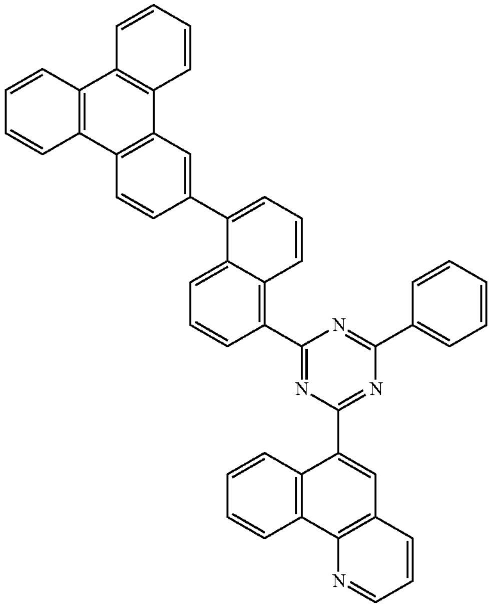

(158)

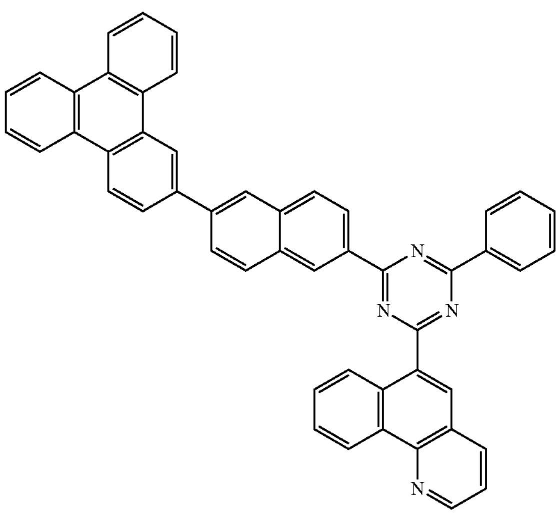

(159)

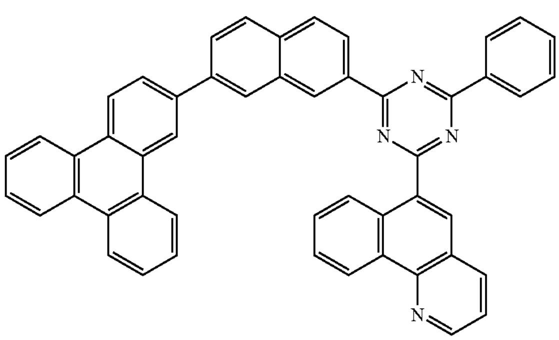

Among the organic compounds represented by General Formula (G1) above, (100) to (127), (136) to (143), and (152) to (155), which have a bipyridine skeleton, are preferable because of their high electron-transport properties, especially the organic compound represented by Structural Formula (100) below is particularly preferable.

[Chemical Formula 22]

(100)

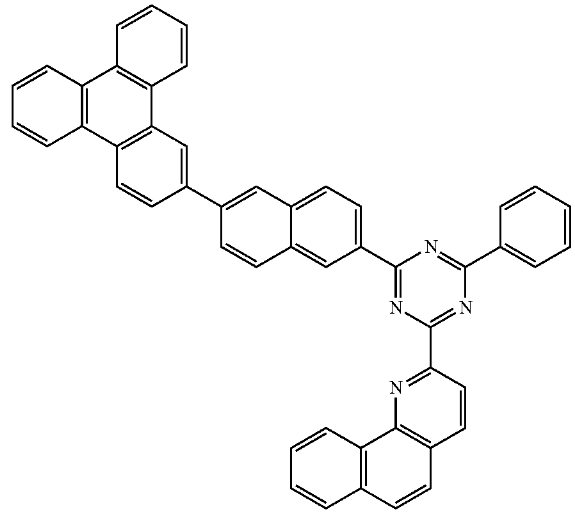

Note that the organic compounds represented by General Formula (G1) above can be used in both an electron-transport layer adjacent to a light-emitting layer containing a fluorescent substance as an emission center substance and an electron-transport layer adjacent to a light-emitting layer containing a phosphorescent substance as an emission center substance. Therefore, in a light-emitting apparatus manufactured using both a phosphorescent light-emitting device and a fluorescent light-emitting device, a common layer (a common electron-transport layer) can be used in all the light-emitting devices. This can reduce the number of times of separate coloring, and accordingly a light-emitting apparatus which is advantageous in terms of yield and cost can be manufactured. Note that a light-emitting layer in which a fluorescent substance is used as an emission center substance preferably uses an organic compound having an anthracene skeleton as a host material. Though the organic compound having an anthracene skeleton is a skeleton with a low T1 level (triplet excited level), with the use of the organic compound represented by General Formula (G1) above, a common electron-transport layer can be formed for a light-emitting device including a light-emitting layer using an organic compound with a low T1 level and a light-emitting device having an light-emitting layer using an organic compound with a high T1 level.

The electron-transport layer 114 may further contain any of an alkali metal itself, an alkaline earth metal itself, a compound thereof, and a complex thereof. That is, the electron-transport layer 114 may be formed using the organic compound represented by General Formula (G1) above or a mixed material of the substance represented by General Formula (G1) above and any of an alkali metal itself, an alkaline earth metal itself, a compound thereof, and a complex thereof.

In addition, it is preferable that the alkali metal itself, the alkaline earth metal itself, the compound thereof, and the complex thereof mentioned above have an 8-hydroxyquinolinato structure. Specific examples include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product or a 5-methyl-substituted product) thereof or the like can also be used.

The electron mobility of the material included in the electron-transport layer 114 in the case where the square root of the electric field strength [V/cm] is 600 is preferably higher than or equal to $1\times10^{-7}$ $cm^2/Vs$ and lower than or equal to $5\times10^{-5}$ $cm^2/Vs$.

Furthermore, the electron mobility of the material included in the electron-transport layer 114 in the case where the square root of the electric field strength [V/cm] is 600 is preferably lower than the electron mobility of a host material or a material having an electron-transport property included in the light-emitting layer 113 in the case where the square root of the electric field strength [V/cm] is 600. Lowering the electron-transport property of the electron-transport layer enables control of the amount of electrons injected into the light-emitting layer and can prevent the light-emitting layer from having excess electrons.

Figure 2A:
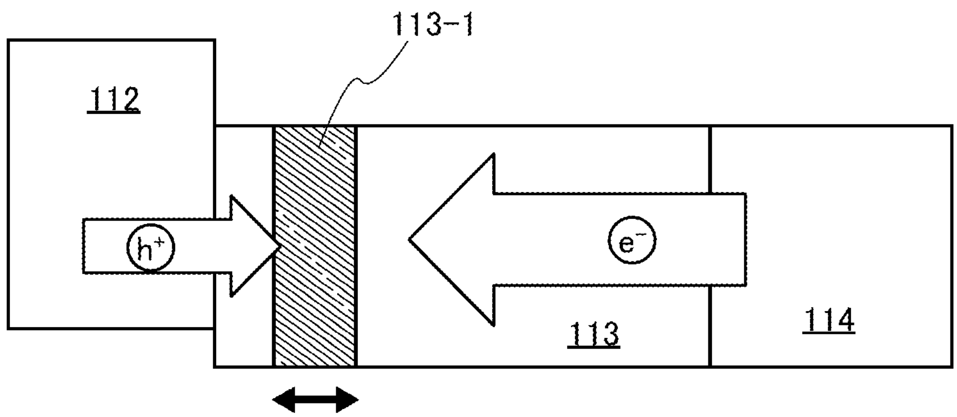
FIG. 2A and FIG. 2B are diagrams explaining an increase in a lifetime.
Figure 2B:
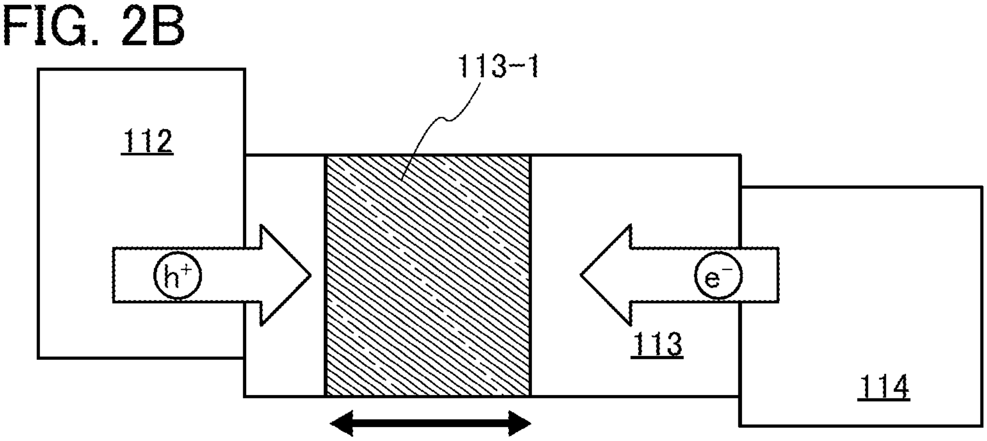

When the light-emitting layer has excess electrons, as shown in FIG. 2A, a light-emitting region 113-1 is limited to a part and a great strain is imposed on the part, which promotes degradation. In addition, electrons failing to recombine and passing through the light-emitting layer also diminish a lifetime and emission efficiency. In one embodiment of the present invention, a reduction in the electron-transport property of the electron-transport layer 114 expands the light-emitting region 113-1 as shown in FIG. 2B and spreads the strain on the material included in the light-emitting layer 113; thus, a light-emitting device having a long lifetime and high emission efficiency can be provided. Note that as shown in FIG. 2B, in the light-emitting device of one embodiment of the present invention, by adjusting the carrier balance of the hole-injection layer or the electron-injection layer instead of the light-emitting layer, the position of the light-emitting region 113-1, the recombination region, can be adjusted. Note that in this specification and the like, such a structure may be referred to as Recombination-Site Tailoring Injection (ReSTI).

The light-emitting device having such a structure may have a local maximum value in the decay curve of luminance obtained in a driving test under a condition with a fixed current density. In other words, the decay curve of the light-emitting device of one embodiment of the present invention may have a portion where the luminance increases with time. The light-emitting device showing such a degradation behavior enables a rapid decay at the initial driving stage, which is called an initial decay, to be canceled out by the luminance increase; thus, the light-emitting device can have an extremely long driving lifetime with a small initial decay.

Note that a differential value of such a decay curve having a local maximum value is 0 in a part. In other words, the light-emitting device of one embodiment of the present invention whose decay curve has a differential value of 0 in a part can have an extremely long lifetime with a small initial decay.

Figure 3A:
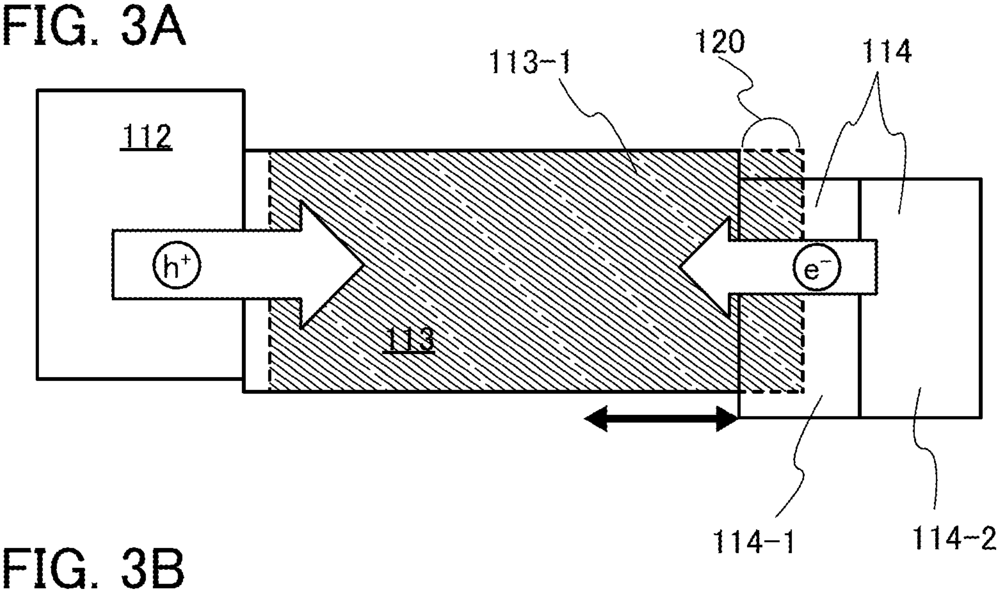
FIG. 3A and FIG. 3B are diagrams explaining a luminance increase.

The above-described behavior of the decay curve is probably a phenomenon caused by recombination that occurs in a non-light-emitting recombination region 120 because of a low electron mobility in the electron-transport layer 114 and does not contribute to light emission, as shown in FIG. 3A. In the light-emitting device of the present invention having the above-described structure, because of a small hole injection barrier at the initial driving stage and the like, the light-emitting region 113-1 (i.e., recombination region) is formed closer to the electron-transport layer 114 side. Since the HOMO level of the second electron-transport material contained in the electron-transport layer 114 is higher than or equal to −6.0 eV, which is comparatively high, some holes reach the electron-transport layer 114 to cause recombination also in the electron-transport layer 114; thus, the non-light-emitting recombination region 120 is formed.

Figure 3B:
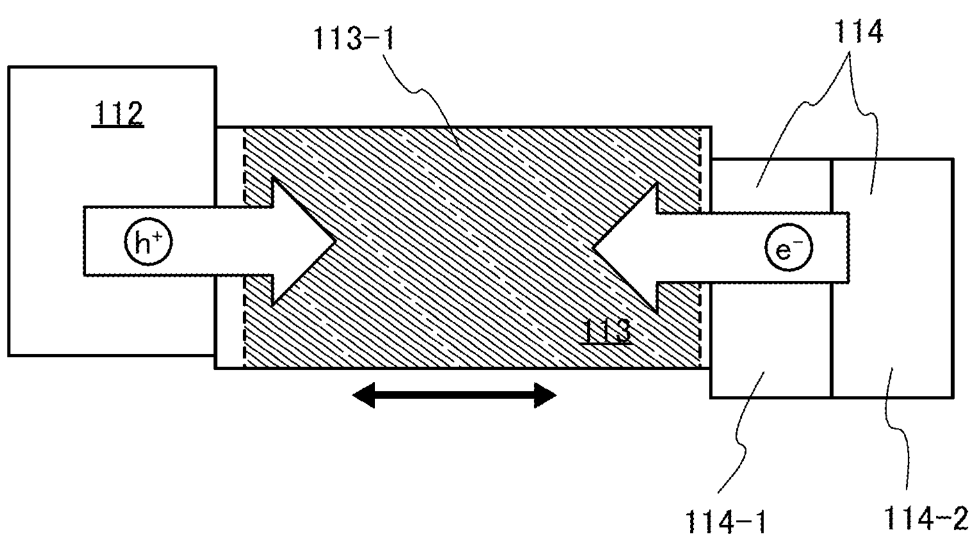

Here, in the light-emitting device of one embodiment of the present invention, the carrier balance changes over the driving time, and the light-emitting region 113-1 (recombination region) moves toward the hole-transport layer 112 side as shown in FIG. 3B. A decrease of the non-light-emitting recombination region 120 allows energy of recombining carriers to effectively contribute to light emission, so that the luminance increases. This luminance increase cancels out the rapid luminance decrease at the initial driving stage of the light-emitting device, which is called the initial decay; thus, the light-emitting device can have a long driving lifetime with a small initial decay.

Note that when the initial decay can be reduced, the problem of burn-in, which has still been mentioned as a great drawback of organic EL devices, and the time and effort for aging for reducing the problem before shipment can be significantly reduced.

The light-emitting device of one embodiment of the present invention having the above-described structure can have a long lifetime.

Embodiment 2

In this embodiment, an example of a synthesis method of the organic compound represented by General Formula (G1) shown in Embodiment 1 will be described in detail. Note that $Ar^1$ and $Ar^2$ in the reaction scheme below are similar to those in General Formula (G1) above and therefore description thereof is omitted.

<Method for Synthesizing General Formula (G1)>

The organic compound represented by General Formula (G1) can be synthesized as shown in Reaction Schemes (a-1) and (a-2) below.

[Chemical Formula 23]

(a-1)

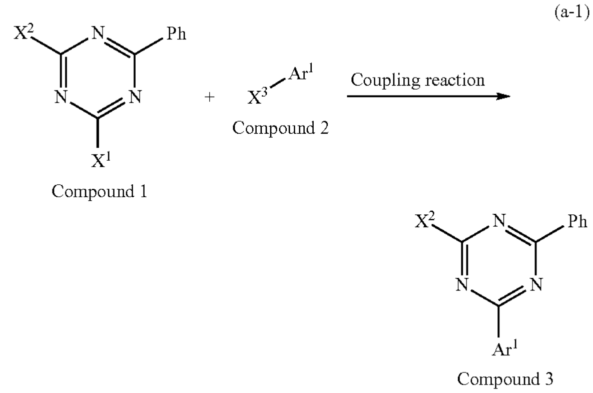

(a-2)

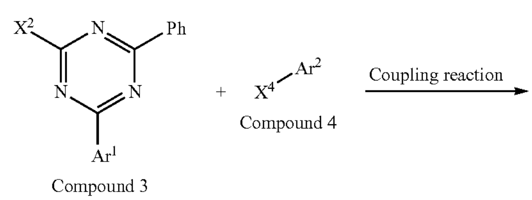

-continued

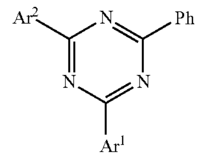

(G1)

First, as shown in Reaction Scheme (a-1), a 2-phenyl-1,3,5-triazine compound (a compound 1) and a benzoquinoline compound or a benzoisoquinoline compound (a compound 2) are coupled, whereby a 2-phenyl-1,3,5-triazine compound having a benzoquinolinyl group or a benzoisoquinolinyl group (a compound 3) can be obtained. Next, as shown in Reaction Scheme (a-2), the compound 3 and a triphenylene compound having a naphthyl group or a naphthalene compound having a triphenylenyl group (a compound 4) are coupled, whereby a compound represented by General Formula (G1), which is the target compound, can be obtained.

In Reaction Schemes (a-1) and (a-2), $X^1$ to $X^4$ each independently represent chlorine, bromine, iodine, a triflate group, an organoboron group, or a boronic acid. For the reaction represented by Reaction Schemes (a-1) and (a-2), a Suzuki-Miyaura cross-coupling reaction using a palladium catalyst can be carried out.

In the Suzuki-Miyaura cross-coupling reaction, a palladium compound such as bis(dibenzylideneacetone)palladium(0), palladium(II) acetate, [1,1-bis(diphenylphosphino)ferrocene]palladium(II) dichloride, or tetrakis(triphenylphosphine)palladium(0) and a ligand such as tri(tert-butyl)phosphine, tri(n-hexyl)phosphine, tricyclohexylphosphine, di(1-adamantyl)-n-butylphosphine, 2-dicyclohexylphosphino-2',6'-dimethoxybiphenyl, or tri(ortho-tolyl)phosphine can be used.

In the reaction, an organic base such as sodium tert-butoxide, an inorganic base such as potassium carbonate, cesium carbonate, or sodium carbonate can be used. In the reaction, a solvent such as toluene, xylene, benzene, tetrahydrofuran, dioxane, ethanol, methanol, water, dimethylformamide (DMF), or dimethyl sulfoxide (DMSO) can be used. Reagents that can be used in the reaction are not limited to the above-described reagents.

The reactions carried out in Reaction Schemes (a-1) and (a-2) are not limited to the Suzuki-Miyaura coupling reaction, and a Migita-Kosugi-Stille coupling reaction using an organotin compound, a Kumada-Tamao-Corriu coupling reaction using a Grignard reagent, a Negishi coupling reaction using an organozinc compound, or the like can also be carried out. In the case of using the Migita-Kosugi-Stille coupling reaction, one of $X^1$ to $X^4$ represents an organotin group and another one of $X^1$ to $X^4$ that is cross-coupled with the one represents a halogen or a triflate group. That is, the reaction is carried out with one of the compound 1 and the compound 2 being an organotin compound and the other compound being a compound having a halide or a triflate group, and with one of the compound 3 and the compound 4 being an organotin compound and the other compound being a compound having a halide or a triflate group. In the case of using the Kumada-Tamao-Corriu coupling reaction, one of $X^1$ to $X^4$ represents a magnesium halide group and another one of $X^1$ to $X^4$ that is cross-coupled with the one represents a halogen or a triflate group. That is, the reaction is carried out with one of the compound 1 and the compound 2 being a Grignard reagent and the other being a compound having a halide or a triflate group, and with one of the compound 3 and the compound 4 being a Grignard reagent and the other being a compound having a halide or a triflate group. In the case of using the Negishi coupling reaction, one of $X^1$ to $X^4$ represents an organozinc group and another one of $X^1$ to $X^4$ that is cross-coupled with the one represents a halogen or a triflate group. That is, the reaction is carried out with one of the compound 1 and the compound 2 being an organozinc compound and the other being a compound having a halide or a triflate group, and with one of the compound 3 and the compound 4 being an organozinc compound and the other being a compound having a halide or a triflate group.

The organic compound represented by General Formula (G1) can be synthesized as shown in Reaction Schemes (b-1) to (b-2) below.

[Chemical Formula 24]

(b-1)

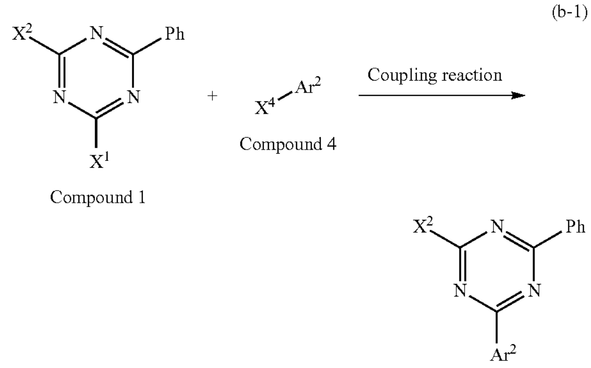

(b-2)

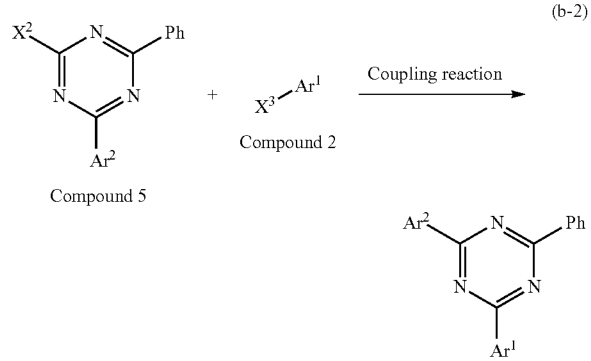

(G1)

First, as shown in Reaction Scheme (b-1), the 2phenyl-1,3,5-triazine compound (a compound 1) and the triphenylene compound having a naphthyl group or a naphthalene compound having a triphenylenyl group (the compound 4) are coupled, whereby a triphenylene-diyl group having a naphthyl group or a 2-phenyl-1,3,5-triazine compound having a naphthalene-diyl group having a triphenylenyl group (a compound 5) can be obtained. Next, as shown in Reaction Scheme (b-2), the compound 5 and the benzoquinoline compound or the benzoisoquinoline compound (the compound 2) are coupled, whereby the compound represented by General Formula (G1), which is the target compound, can be obtained.

In Reaction Schemes (b-1) and (b-2), $X^1$ to $X^4$ each independently represent chlorine, bromine, iodine, a triflate group, an organoboron group, or a boronic acid. The reaction represented by Reaction Schemes (b-1) and (b-2) can be carried out using the Suzuki-Miyaura cross-coupling reaction using a palladium catalyst.

In the Suzuki-Miyaura cross-coupling reaction, a palladium compound such as bis(dibenzylideneacetone)palladium(0), palladium(II) acetate, [1,1-bis(diphenylphosphino)ferrocene]palladium(II) dichloride, or tetrakis(triphenylphosphine)palladium(0) and a ligand such as tri(tert-butyl)phosphine, tri(n-hexyl)phosphine, tricyclohexylphosphine, di(1-adamantyl)-n-butylphosphine, 2-dicyclohexylphosphino-2',6'-dimethoxybiphenyl, or tri(ortho-tolyl)phosphine can be used.

In the reaction, an organic base such as sodium tert-butoxide, an inorganic base such as potassium carbonate, cesium carbonate, or sodium carbonate, or the like can be used. In the reaction, a solvent such as toluene, xylene, benzene, tetrahydrofuran, dioxane, ethanol, methanol, water, DMF, DMSO, or the like can be used. Reagents that can be used in the reaction are not limited to the above-described reagents.

The reactions carried out in Reaction Schemes (b-1) and (b-2) are not limited to the Suzuki-Miyaura coupling reaction, and a Migita-Kosugi-Stille coupling reaction using an organotin compound, a Kumada-Tamao-Corriu coupling reaction using a Grignard reagent, a Negishi coupling reaction using an organozinc compound, or the like can also be carried out. In the case of using the Migita-Kosugi-Stille coupling reaction, one of $X^1$ to $X^4$ represents an organotin group and another one of $X^1$ to $X^4$ that is cross-coupled with the one represents a halogen group or a triflate group. That is, the reaction is carried out with one of the compound 1 and the compound 4 being an organotin compound and the other compound being a compound having a halide or a triflate group, and with one of the compound 2 and the compound 3 being an organotin compound and the other compound being a compound having a halide or a triflate group. In the case of using the Kumada-Tamao-Corriu coupling reaction, one of $X^1$ to $X^4$ represents a magnesium halide group and another one of $X^1$ to $X^4$ that is cross-coupled with the one represents a compound group having a halogen or a triflate group. That is, the reaction is carried out with one of the compound 1 and the compound 4 being a Grignard reagent and the other being a compound having a halide or a triflate group, and with one of the compound 2 and the compound 3 being a Grignard reagent and the other being a compound having a halide or a triflate group. In the case of using the Negishi coupling reaction, one of $X^1$ to $X^4$ represents an organozinc group and another one of $X^1$ to $X^4$ that is cross-coupled with the one represents a halogen or a triflate group. That is, the reaction is carried out with one of the compound 1 and the compound 4 being an organozinc compound and the other being a compound having a halide or a triflate group, and with one of the compound 3 and the compound 4 being an organozinc compound and the other being a compound having a halide or a triflate group.

Embodiment 3

Next, examples of specific structures and materials of the aforementioned light-emitting device will be described. As described above, the light-emitting device of one embodiment of the present invention includes the EL layer 103 that is positioned between the pair of electrodes (the anode 101 and the cathode 102) and has a plurality of layers. In the EL layer 103, the hole-injection layer 111, the hole-transport layer 112, the light-emitting layer 113, and the electron-transport layer are provided from the anode 101 side.

There is no particular limitation on the other layers included in the EL layer 103, and various layers such as a hole-injection layer, a hole-transport layer, an electron-transport layer, an electron-injection layer, a carrier-blocking layer, an exciton-blocking layer, and a charge-generation layer can be employed.

The anode 101 is preferably formed using any of metals, alloys, conductive compounds with a high work function (specifically, higher than or equal to 4.0 eV), mixtures thereof, and the like. Specific examples include indium oxide-tin oxide (ITO: Indium Tin Oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 to 5 wt % and 0.1 to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that although the typical materials that have a high work function and are used for forming the anode are listed above, a composite material of an organic compound having a hole-transport property and a substance exhibiting an electron-accepting property with respect to the organic compound is used for the hole-injection layer 111 of one embodiment of the present invention; thus, an electrode material can be selected regardless of its work function.

Since the hole-injection layer 111, the hole-transport layer 112, the light-emitting layer 113, and the electron-transport layer 114 are described in detail in Embodiment 1, the description thereof is not repeated. Refer to the description in Embodiment 1.

A layer containing an alkali metal, an alkaline earth metal, or a compound thereof such as lithium fluoride (LiF), cesium fluoride (CsF), or calcium fluoride ($CaF_2$) may be provided as the electron-injection layer 115 between the electron-transport layer 114 and the cathode 102. For example, an electride or a layer that is formed using a substance having an electron-transport property and that contains an alkali metal, an alkaline earth metal, or a compound thereof can be used as the electron-injection layer 115. Examples of the electride include a substance in which electrons are added at high concentration to calcium oxide-aluminum oxide.

Figure 1B:
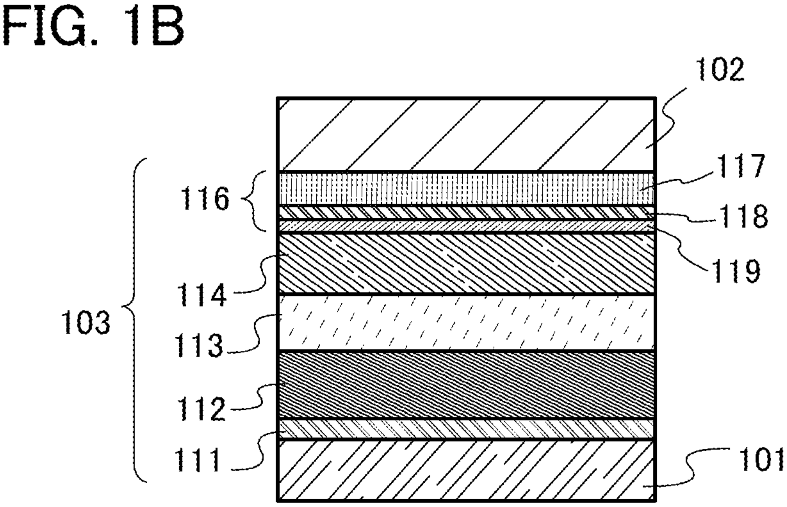

Instead of the electron-injection layer 115, the charge-generation layer 116 may be provided between the electron-transport layer 114 and the cathode 102 (FIG. 1B). The charge-generation layer 116 refers to a layer capable of injecting holes into a layer in contact with the cathode side of the charge-generation layer 116 and electrons into a layer in contact with the anode side thereof when a voltage is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material contained in the composite material and a film containing a hole-transport material. When a voltage is applied to the p-type layer 117, electrons are injected into the electron-transport layer 114 and holes are injected into the cathode 102 serving as a cathode; thus, the light-emitting device operates.

Note that the charge-generation layer 116 preferably includes one or both of an electron-relay layer 118 and an electron-injection buffer layer 119 in addition to the p-type layer 117.

The electron-relay layer 118 contains at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the electron-accepting substance in the p-type layer 117 and the LUMO level of a substance contained in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, more preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

For the electron-injection buffer layer 119, it is possible to use a substance having an excellent electron-injection property, such as an alkali metal, an alkaline earth metal, a rare earth metal, or a compound thereof(an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)).

In the case where the electron-injection buffer layer 119 contains the substance having an electron-transport property and an electron-donating substance, an organic compound such as tetrathianaphthacene (abbreviation: TTN), nickelocene, or decamethylnickelocene can be used as the electron-donating substance, as well as an alkali metal, an alkaline earth metal, a rare earth metal, a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for forming the electron-transport layer 114 can be used.

As the substance for forming the cathode 102, a metal, an alloy, an electrically conductive compound, or a mixture thereof each having a low work function (specifically, lower than or equal to 3.8 eV) or the like can be used. Specific examples of such a cathode material are elements belonging to Groups 1 or Group 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode 102 and the electron-transport layer, a variety of conductive materials such as Al, Ag, ITO, or indium oxide-tin oxide containing silicon or silicon oxide can be used for the cathode 102 regardless of the work function.

Films of these conductive materials can be formed by a dry process such as a vacuum evaporation method or a sputtering method, an inkjet method, a spin coating method, or the like. Alternatively, a wet process using a sol-gel method or a wet process using a paste of a metal material may be employed.

Furthermore, any of a variety of methods can be used for forming the EL layer 103, regardless of a dry method or a wet method. For example, a vacuum evaporation method, a gravure printing method, an offset printing method, a screen printing method, an inkjet method, a spin coating method, or the like may be used.

Different methods may be used to form the electrodes or the layers described above.

Note that the structure of the layers provided between the anode 101 and the cathode 102 is not limited to the above-described structure. Preferably, a light-emitting region where holes and electrons recombine is positioned away from the anode 101 and the cathode 102 so as to prevent quenching due to the proximity of the light-emitting region and a metal used for electrodes and carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material contained in the light-emitting layer.

Next, an embodiment of a light-emitting device with a structure in which a plurality of light-emitting units are stacked (also referred to as a stacked-type device or a tandem device) will be described with reference to FIG. 1C. This light-emitting device includes a plurality of light-emitting units between an anode and a cathode. One light-emitting unit has substantially the same structure as the EL layer 103 illustrated in FIG. 1A. In other words, the light-emitting device illustrated in FIG. 1C includes a plurality of light-emitting units, and the light-emitting device illustrated in FIG. 1A or FIG. 1B includes a single light-emitting unit.

Figure 1C:
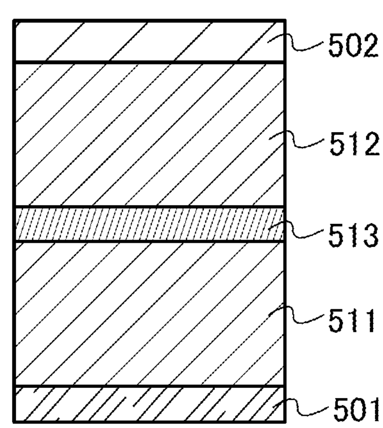

In FIG. 1C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the anode 101 and the cathode 102 illustrated in FIG. 1A, and the materials given in the description for FIG. 1A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied between the anode 501 and the cathode 502. That is, in FIG. 1C, the charge-generation layer 513 injects electrons into the first light-emitting unit 511 and holes into the second light-emitting unit 512 when a voltage is applied so that the potential of the anode becomes higher than the potential of the cathode.

The charge-generation layer 513 preferably has a structure similar to that of the charge-generation layer 116 described with reference to FIG. 1B. A composite material of an organic compound and a metal oxide has an excellent carrier-injection property and an excellent carrier-transport property; thus, low-voltage driving and low-current driving can be achieved. Note that in the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as the electron-injection layer in the light-emitting unit on the anode side and thus, an electron-injection layer is not necessarily formed in the light-emitting unit on the anode side.

The light-emitting device having two light-emitting units is described with reference to FIG. 1C; however, one embodiment of the present invention can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life element which can emit light with high luminance at a low current density. A light-emitting apparatus which can be driven at a low voltage and has low power consumption can be provided.

When the emission colors of the light-emitting units are different, light emission of a desired color can be obtained from the light-emitting device as a whole. For example, in a light-emitting device including two light-emitting units, the emission colors of the first light-emitting unit may be red and green and the emission color of the second light-emitting unit may be blue, so that the light-emitting device can emit white light as a whole. The light-emitting device in which three or more light-emitting units are stacked can be, for example, a tandem device in which a first light-emitting unit includes a first blue light-emitting layer, a second light-emitting unit includes a yellow or yellow-green light-emitting layer and a red light-emitting layer, and a third light-emitting unit includes a second blue light-emitting layer. The tandem device can provide white light emission like the above light-emitting device.

The above-described layers and electrodes such as the EL layer 103, the first light-emitting unit 511, the second light-emitting unit 512, and the charge-generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be contained in the layers and electrodes.

Embodiment 4

In this embodiment, a light-emitting apparatus including the light-emitting device described in Embodiment 1 and Embodiment 3 will be described.

Figure 4A:
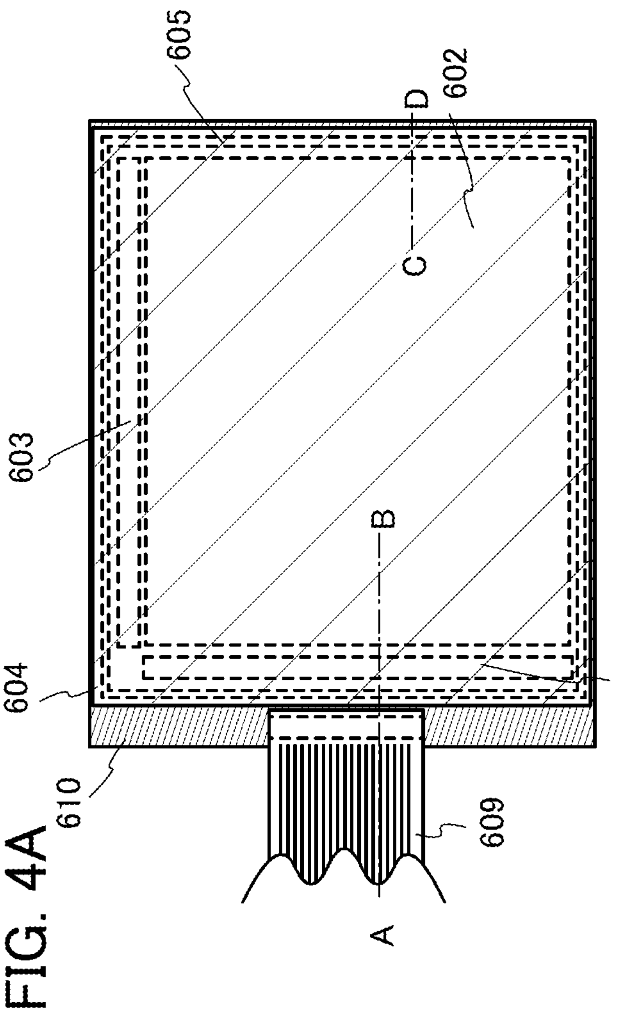
FIG. 4A and FIG. 4B are conceptual diagrams of an active matrix light-emitting apparatus.
Figure 4B:
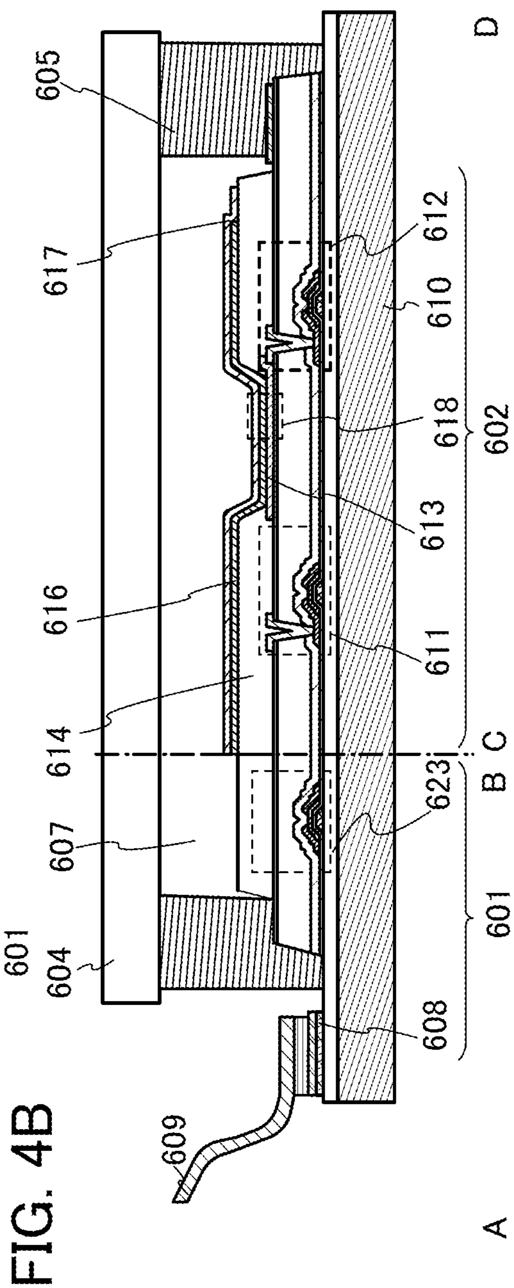

In this embodiment, the light-emitting apparatus manufactured using the light-emitting device described in Embodiment 1 and Embodiment 3 will be described with reference to FIG. 4. Note that FIG. 4A is a top view illustrating the light-emitting apparatus and FIG. 4B is a cross-sectional view taken along A-B and C-D in FIG. 4A. This light-emitting apparatus includes a driver circuit portion (source line driver circuit) 601, a pixel portion 602, and a driver circuit portion (gate line driver circuit) 603, which are to control the light emission of a light-emitting device and illustrated with dotted lines. Furthermore, 604 denotes a sealing substrate, 605 denotes a sealant, and a portion surrounded by the sealant 605 is a space 607.

Note that a lead wiring 608 is a wiring for transmitting signals to be input to the source line driver circuit 601 and the gate line driver circuit 603 and receiving signals such as a video signal, a clock signal, a start signal, and a reset signal from FPC (flexible printed circuit) 609 serving as an external input terminal. Although only the FPC is illustrated here, a printed wiring board (PWB) may be attached to the FPC. The light-emitting apparatus in this specification includes not only the light-emitting apparatus itself but also the light-emitting apparatus provided with the FPC or the PWB.

Next, a cross-sectional structure will be described with reference to FIG. 4B. The driver circuit portions and the pixel portion are formed over an element substrate 610; here, the source line driver circuit 601, which is a driver circuit portion, and one pixel in the pixel portion 602 are illustrated.

The element substrate 610 may be fabricated using a substrate containing glass, quartz, an organic resin, a metal, an alloy, or a semiconductor, or the like, a plastic substrate formed of FRP (Fiber Reinforced Plastics), PVF (polyvinyl fluoride), polyester, or acrylic resin, or the like.

There is no particular limitation on the structure of transistors used in pixels and driver circuits. For example, inverted staggered transistors may be used, or staggered transistors may be used. Furthermore, top-gate transistors or bottom-gate transistors may be used. There is no particular limitation on a semiconductor material used for the transistors, and for example, silicon, germanium, silicon carbide, gallium nitride, or the like can be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case degradation of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

An oxide semiconductor that can be used in one embodiment of the present invention will be described below.

An oxide semiconductor is classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of lattice arrangement. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a layered structure) in which a layer containing indium and oxygen (hereinafter an In layer) and a layer containing the element M, zinc, and oxygen (hereinafter an (M, Zn) layer) are stacked. Note that indium and the element M can be replaced with each other, and in the case where the element M of the (M, Zn) layer is replaced with indium, the layer can be referred to as an (In, M, Zn) layer. In the case where indium of the In layer is replaced with the element M, the layer can be referred to as an (In, M) layer.

The CAAC-OS is an oxide semiconductor with high crystallinity. Meanwhile, in the CAAC-OS, a reduction in electron mobility due to a crystal grain boundary is less likely to occur because it is difficult to observe a clear crystal grain boundary. Entry of impurities, formation of defects, or the like might decrease the crystallinity of an oxide semiconductor, which means that the CAAC-OS is an oxide semiconductor having small amounts of impurities and defects (e.g., oxygen vacancies (also referred to as Vo)). Thus, an oxide semiconductor including the CAAC-OS is physically stable. Accordingly, the oxide semiconductor including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an indium-gallium-zinc oxide (hereinafter IGZO) that is an oxide semiconductor containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

A CAC (Cloud-Aligned Composite)-OS may be used as an oxide semiconductor other than the above.

A CAC-OS has a conducting function in part of the material and has an insulating function in another part of the material; as a whole, the CAC-OS has a function of a semiconductor. Note that in the case where the CAC-OS is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS. In the CAC-OS, separation of the functions can maximize each function.

Furthermore, the CAC-OS includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS is composed of components having different bandgaps. For example, the CAC-OS is composed of a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS is used in a channel formation region of a transistor, high current driving capability in an on state of the transistor, that is, a high on-state current and high field-effect mobility can be obtained.

In other words, the CAC-OS can also be referred to as a matrix composite or a metal matrix composite.

The use of the above-described oxide semiconductor materials for the semiconductor layer makes it possible to achieve a highly reliable transistor in which a change in the electrical characteristics is suppressed.

Charge accumulated in a capacitor through a transistor including the above-described semiconductor layer can be held for a long time because of the low off-state current of the transistor. The use of such a transistor in pixels allows a driver circuit to stop while a gray scale of an image displayed on each display region is maintained. As a result, an electronic device with significantly reduced power consumption can be achieved.

For stable characteristics or the like of the transistor, a base film is preferably provided. The base film can be formed to be a single layer or a stacked layer using an inorganic insulating film such as a silicon oxide film, a silicon nitride film, a silicon oxynitride film, or a silicon nitride oxide film. The base film can be formed by a sputtering method, a CVD (Chemical Vapor Deposition) method (e.g., a plasma CVD method, a thermal CVD method, or a MOCVD (Metal Organic CVD) method), an ALD (Atomic Layer Deposition) method, a coating method, a printing method, or the like. Note that the base film is not necessarily provided when not needed.

Note that an FET 623 is illustrated as a transistor formed in the driver circuit portion 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside the substrate.

The pixel portion 602 includes a plurality of pixels including a switching FET 611, a current controlling FET 612, and an anode 613 electrically connected to a drain of the current controlling FET 612. One embodiment of the present invention is not limited to the structure. The pixel portion may include three or more FETs and a capacitor in combination.

Note that to cover an end portion of the anode 613, an insulator 614 is formed. Here, the insulator 614 can be formed using a positive photosensitive acrylic resin film.

In order to improve the coverage with an EL layer or the like which is formed later, the insulator 614 is formed to have a curved surface with curvature at its upper or lower end portion. For example, in the case where positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a cathode 617 are formed over the anode 613. Here, as a material used for the anode 613, a material having a high work function is desirably used. For example, a single-layer film of an ITO film, an indium tin oxide film containing silicon, an indium oxide film containing zinc oxide at 2 to 20 wt %, a titanium nitride film, a chromium film, a tungsten film, a Zn film, a Pt film, or the like, a stacked layer of a titanium nitride film and a film containing aluminum as its main component, a three-layer structure of a titanium nitride film, a film containing aluminum as its main component, and a titanium nitride film, or the like can be used. Note that the stacked-layer structure enables low wiring resistance, favorable ohmic contact, and a function as a cathode.

The EL layer 616 is formed by any of a variety of methods such as an evaporation method using an evaporation mask, an inkjet method, and a spin coating method. The EL layer 616 has the structure described in Embodiment 1 and Embodiment 3. As another material included in the EL layer 616 may be a low molecular compound or a high molecular compound (including an oligomer or a dendrimer).

As a material used for the cathode 617, which is formed over the EL layer 616, a material having a low work function (e.g., Al, Mg, Li, and Ca, or an alloy or a compound thereof, such as MgAg, MgIn, or AlLi) is preferably used. Note that in the case where light generated in the EL layer 616 is transmitted through the cathode 617, a stack layer of a thin metal film and a transparent conductive film (e.g., ITO, indium oxide containing zinc oxide at 2 to 20 wt %, indium tin oxide containing silicon, or zinc oxide (ZnO)) is preferably used for the cathode 617.

Note that the light-emitting device is formed with the anode 613, the EL layer 616, and the cathode 617. The light-emitting device is the light-emitting device described in Embodiment 1 and Embodiment 3. Note that a plurality of light-emitting devices are formed in the pixel portion, and the light-emitting apparatus of this embodiment may include both the light-emitting device described in Embodiment 1 and Embodiment 3 and a light-emitting device having a different structure.

The sealing substrate 604 is attached to the element substrate 610 with the sealant 605, so that a light-emitting device 618 is provided in the space 607 surrounded by the element substrate 610, the sealing substrate 604, and the sealant 605. Note that the space 607 is filled with a filler; it is filled with an inert gas (e.g., nitrogen or argon) in some cases, and filled with the sealant in some cases.

Note that an epoxy-based resin or glass frit is preferably used for the sealant 605. Furthermore, these materials are preferably materials that transmit moisture or oxygen as little as possible. As the material used for the sealing substrate 604, in addition to a glass substrate and a quartz substrate, a plastic substrate formed of FRP (Fiber Reinforced Plastics), PVF (polyvinyl fluoride), polyester, an acrylic resin, or the like can be used.

Although not illustrated in FIG. 4, a protective film may be provided over the cathode. As the protective film, an organic resin film or an inorganic insulating film may be formed. The protective film may be formed so as to cover an exposed portion of the sealant 605. The protective film may be provided so as to cover surfaces and side surfaces of the pair of substrates and exposed side surfaces of a sealing layer, an insulating layer, and the like.

The protective film can be formed using a material that is less likely to transmit an impurity such as water. Thus, diffusion of an impurity such as water from the outside into the inside can be effectively suppressed.

As a material of the protective film, an oxide, a nitride, a fluoride, a sulfide, a ternary compound, a metal, a polymer, or the like can be used; for example, it is possible to use a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, or indium oxide; or a material containing aluminum nitride, hafnium nitride, silicon nitride, tantalum nitride, titanium nitride, niobium nitride, molybdenum nitride, zirconium nitride, or gallium nitride; a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be formed by an ALD method is preferably used for the protective film. By an ALD method, a dense protective film with reduced defects such as cracks and pinholes or with a uniform thickness can be formed. Furthermore, damage caused to a process member in forming the protective film can be reduced.

For example, by an ALD method, a uniform protective film with few defects can be formed even on a surface with a complex uneven shape or upper, side, and lower surfaces of a touch panel.

As described above, the light-emitting apparatus manufactured using the light-emitting device described in Embodiment 1 and Embodiment 3 can be obtained.

Since the light-emitting apparatus in this embodiment is manufactured using the light-emitting device described in Embodiment 1 and Embodiment 3, the light-emitting apparatus can have favorable characteristics. Specifically, since the light-emitting device described in Embodiment 1 and Embodiment 3 is a light-emitting device with a long lifetime, the light-emitting apparatus can have high reliability. Since the light-emitting apparatus using the light-emitting device described in Embodiment 1 and Embodiment 3 has high emission efficiency, the light-emitting apparatus can achieve low power consumption.

Figure 5A:
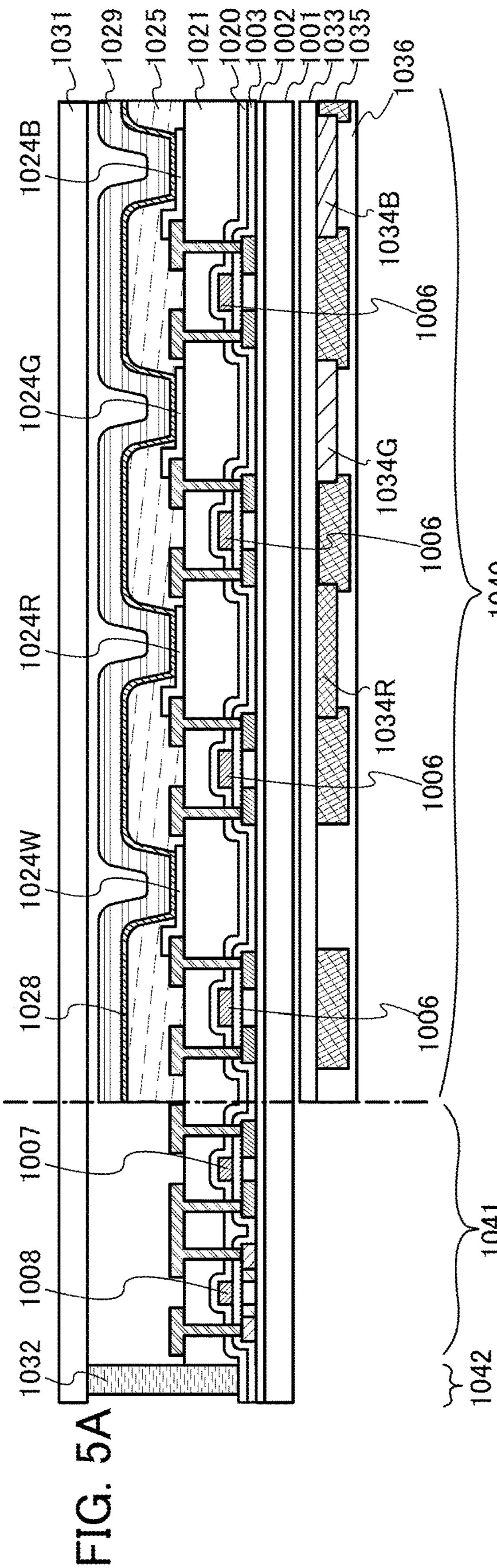
FIG. 5A and FIG. 5B are conceptual diagrams of an active matrix light-emitting apparatus.

FIG. 5 illustrates examples of a light-emitting apparatus in which full color display is achieved by formation of a light-emitting device exhibiting white light emission and provision of coloring layers (color filters) and the like. FIG. 5A illustrates a substrate 1001, abase insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024W, 1024R, 1024G, and 1024B of light-emitting devices, a partition 1025, an EL layer 1028, a cathode 1029 of the light-emitting devices, a sealing substrate 1031, a sealant 1032, and the like.

In FIG. 5A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 5A, there is a light-emitting layer from which light is extracted to the outside without passing through the coloring layers and a light-emitting layer from which light is extracted to the outside after passing through the coloring layers of the respective colors. The light that does not pass through the coloring layers is white, and the light that passes through the coloring layers is red, green, and blue, so that an image can be expressed with the pixels of four colors.

Figure 5B:
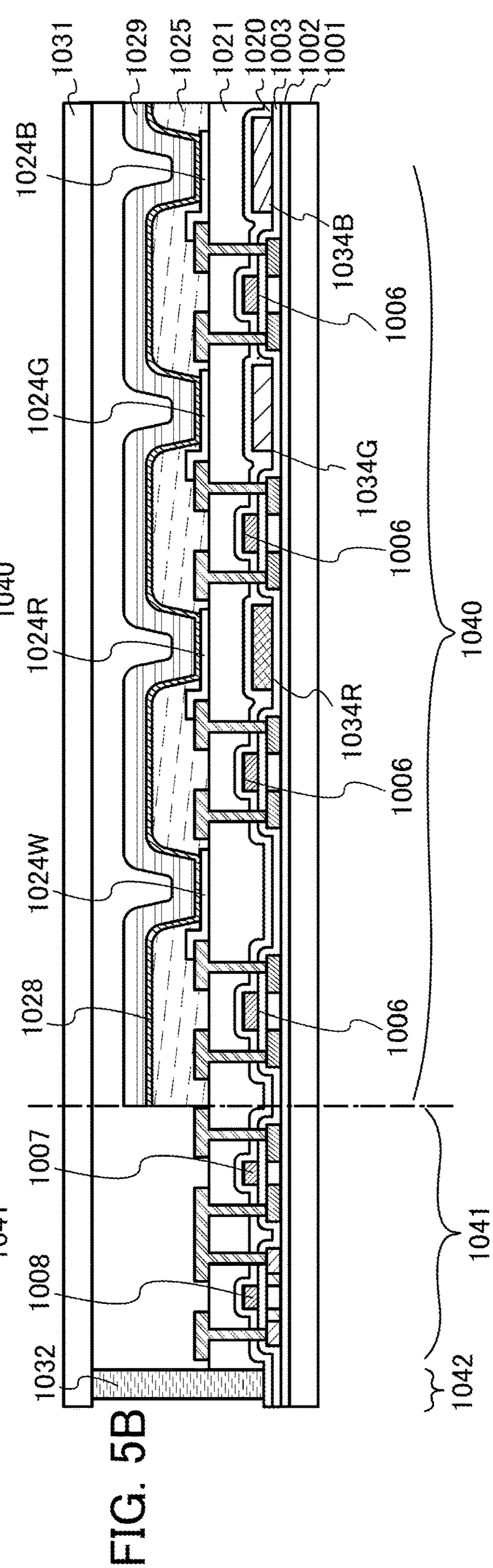

FIG. 5B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 6:
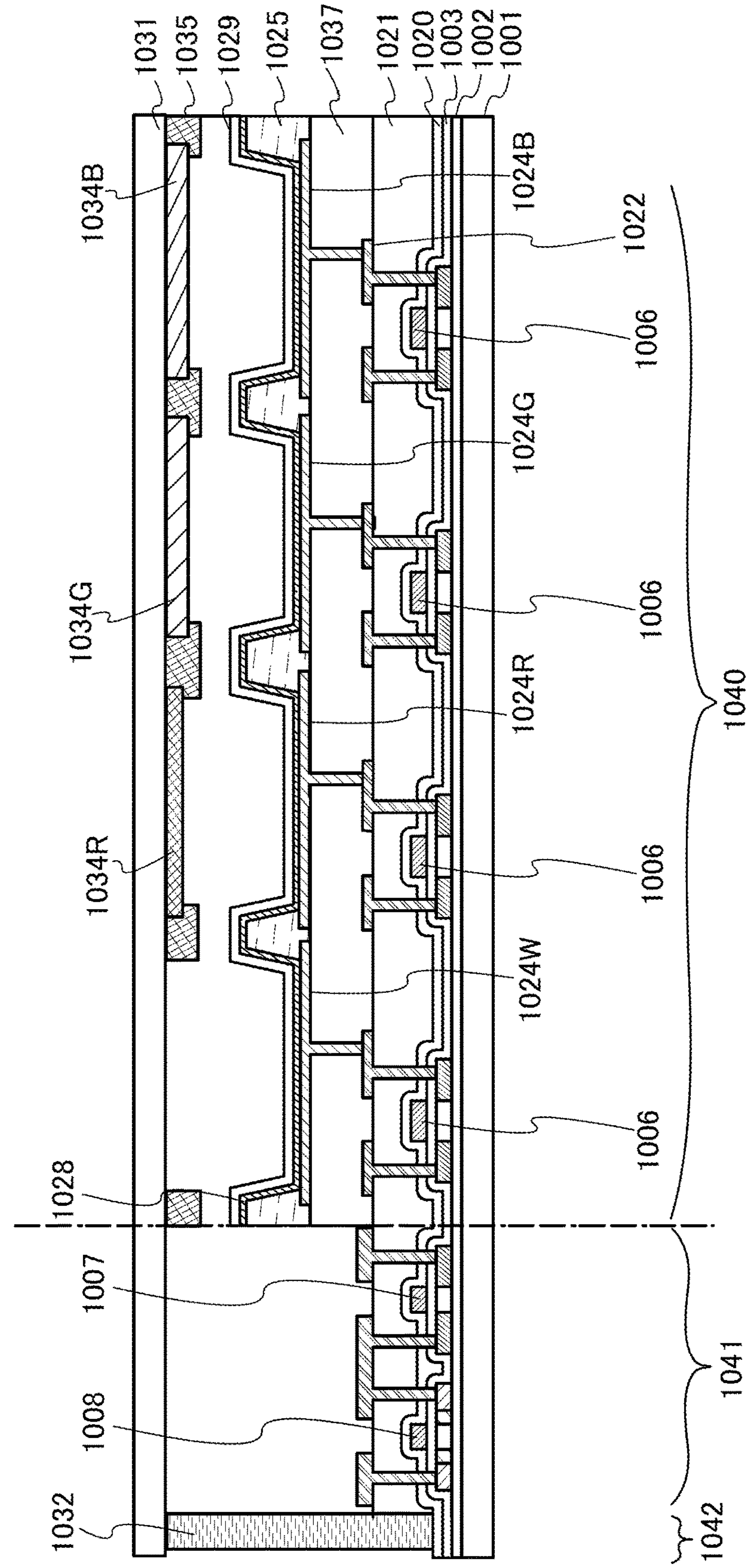
FIG. 6 is a conceptual diagram of an active matrix light-emitting apparatus.

The above-described light-emitting apparatus is a light-emitting apparatus having a structure in which light is extracted from the substrate 1001 side where FETs are formed (a bottom emission structure), but may be a light-emitting apparatus having a structure in which light is extracted from the sealing substrate 1031 side (a top emission structure). FIG. 6 is a cross-sectional view of a light-emitting apparatus having a top emission structure. In this case, a substrate that does not transmit light can be used as the substrate 1001. The process up to the formation of a connection electrode which connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film or using any of other known materials.

The anodes 1024W, 1024R, 1024G, and 1024B of the light-emitting devices are anodes here, but may be formed as cathodes. Furthermore, in the case of a light-emitting apparatus having a top emission structure as illustrated in FIG. 6, the anodes are preferably reflective electrodes. The EL layer 1028 is formed to have a structure similar to the structure of the EL layer 103 described in Embodiment 1 and Embodiment 3, with which white light emission can be obtained.

In the case of a top emission structure illustrated in FIG. 6, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display may be performed using four colors of red, yellow, green, and blue or three colors of red, green, and blue.

In the light-emitting apparatus having a top emission structure, a microcavity structure can be favorably employed. Alight-emitting device with a microcavity structure is obtained with the use of a reflective electrode as the anode and a semi-transmissive and semi-reflective electrode as the cathode. The light-emitting device with a microcavity structure includes at least an EL layer between the reflective electrode and the semi-transmissive and semi-reflective electrode, and the EL layer includes at least a light-emitting layer serving as a light-emitting region.

Note that the reflective electrode is a film having a visible light reflectance of 40% to 100%, preferably 70% to 100%, and a resistivity of $1\times10^{-2}$ Ωcm or lower. In addition, the semi-transmissive and semi-reflective electrode is a film having a visible light reflectance of 20% to 80%, preferably 40% to 70%, and a resistivity of $1\times10^{-2}$ Ωcm or lower.

Light emitted from the light-emitting layer included in the EL layer is reflected and resonated by the reflective electrode and the semi-transmissive and semi-reflective electrode.

In the light-emitting device, by changing thicknesses of the transparent conductive film, the above-described composite material, the carrier-transport material, and the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light); therefore, the optical path length between the reflective electrode and the light-emitting layer is preferably adjusted to $(2n-1)\lambda/4$ (n is a natural number of 1 or larger and X is a wavelength of color to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer; for example, in combination with the structure of the above-described tandem light-emitting device, a plurality of EL layers each including a single or a plurality of light-emitting layer(s) may be provided in one light-emitting device with a charge-generation layer interposed between the EL layers.

With the microcavity structure, emission intensity with a specific wavelength in the front direction can be increased, whereby power consumption can be reduced. Note that in the case of a light-emitting apparatus which displays images with subpixels of four colors of red, yellow, green, and blue, the light-emitting apparatus can have favorable characteristics because the luminance can be increased owing to yellow light emission and each subpixel can employ a microcavity structure suitable for wavelength of the corresponding color.

Since the light-emitting apparatus in this embodiment is manufactured using the light-emitting device described in Embodiment 1 and Embodiment 3, the light-emitting apparatus can have favorable characteristics. Specifically, since the light-emitting device described in Embodiment 1 and Embodiment 3 is a light-emitting device with a long lifetime, the light-emitting apparatus can have high reliability. Since the light-emitting apparatus using the light-emitting device described in Embodiment 1 and Embodiment 3 has high emission efficiency, the light-emitting apparatus can achieve low power consumption.

Figure 7A:
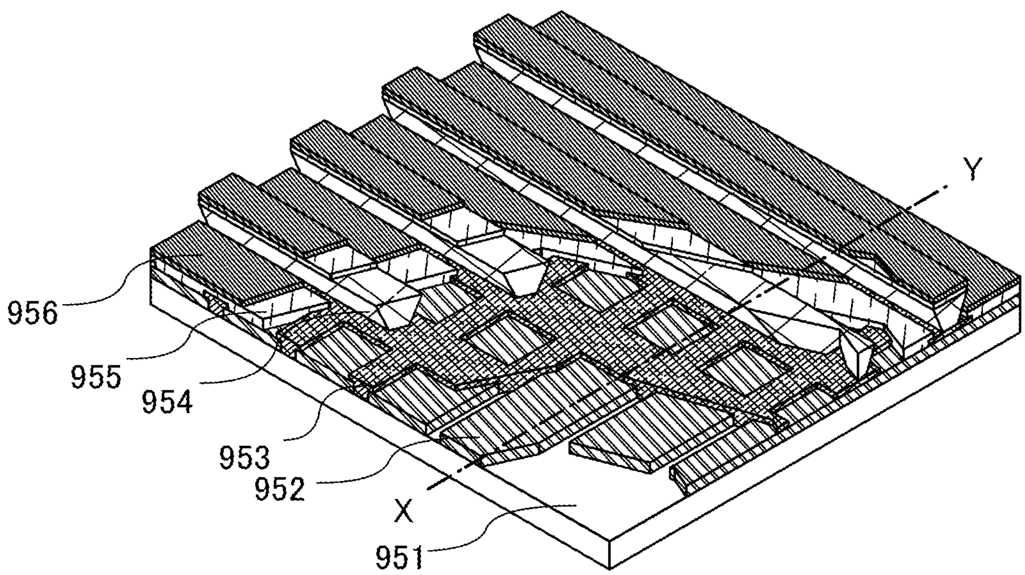
FIG. 7A and FIG. 7B are conceptual diagrams of a passive matrix light-emitting apparatus.
Figure 7B:
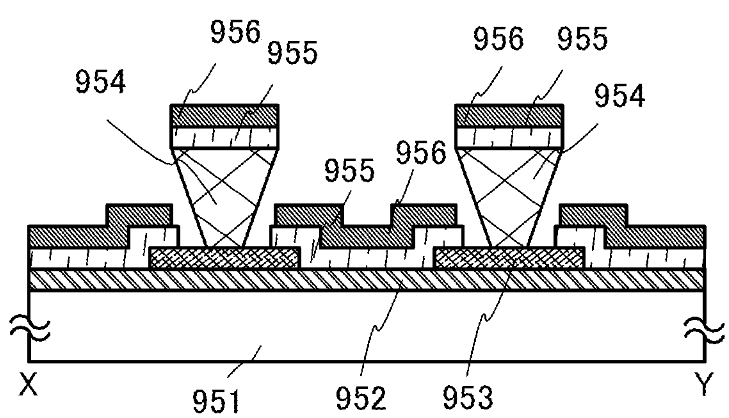

The active matrix light-emitting apparatus is described above, whereas a passive matrix light-emitting apparatus is described below. FIG. 7 illustrates a passive matrix light-emitting apparatus manufactured using the present invention. Note that FIG. 7A is a perspective view illustrating the light-emitting apparatus, and FIG. 7B is a cross-sectional view taken along X-Y in FIG. 7A. In FIG. 7, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between one sidewall and the other sidewall is gradually narrowed toward the surface of the substrate. In other words, a cross section taken along the short side direction of the partition layer 954 is trapezoidal, and the lower side (the side facing the same direction as the plane direction of the insulating layer 953 and touching the insulating layer 953) is shorter than the upper side (the side facing the same direction as the plane direction of the insulating layer 953, and not touching the insulating layer 953). Providing the partition layer 954 in this manner can prevent defects of the light-emitting device due to static charge or the like. The passive-matrix light-emitting apparatus also includes the light-emitting device described in Embodiment 1 and Embodiment 3; thus, the light-emitting apparatus can have high reliability or low power consumption.

Since many minute light-emitting devices arranged in a matrix can each be controlled in the light-emitting apparatus described above, the light-emitting apparatus can be suitably used as a display device for displaying images.

This embodiment can be freely combined with any of the other embodiments.

Embodiment 5

Figure 8A:
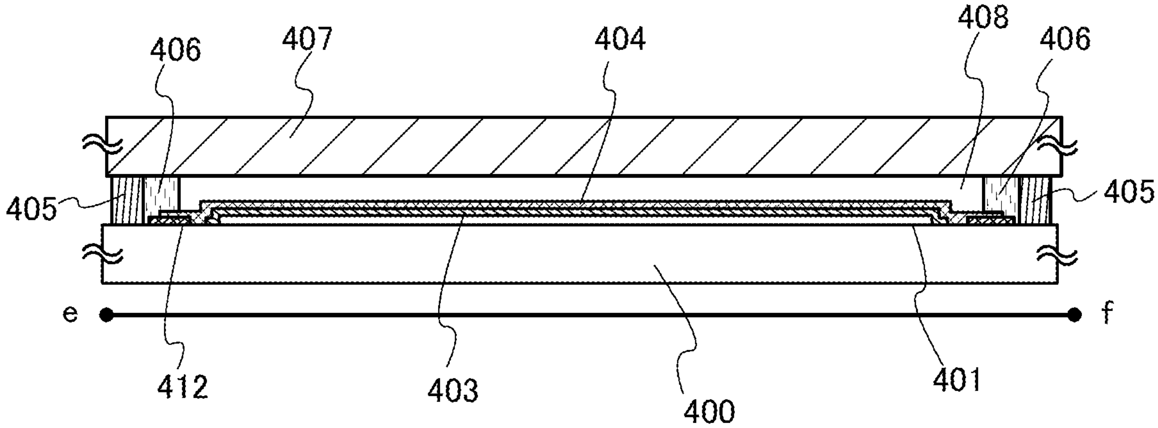
FIG. 8A and FIG. 8B are diagrams showing a lighting device.
Figure 8B:
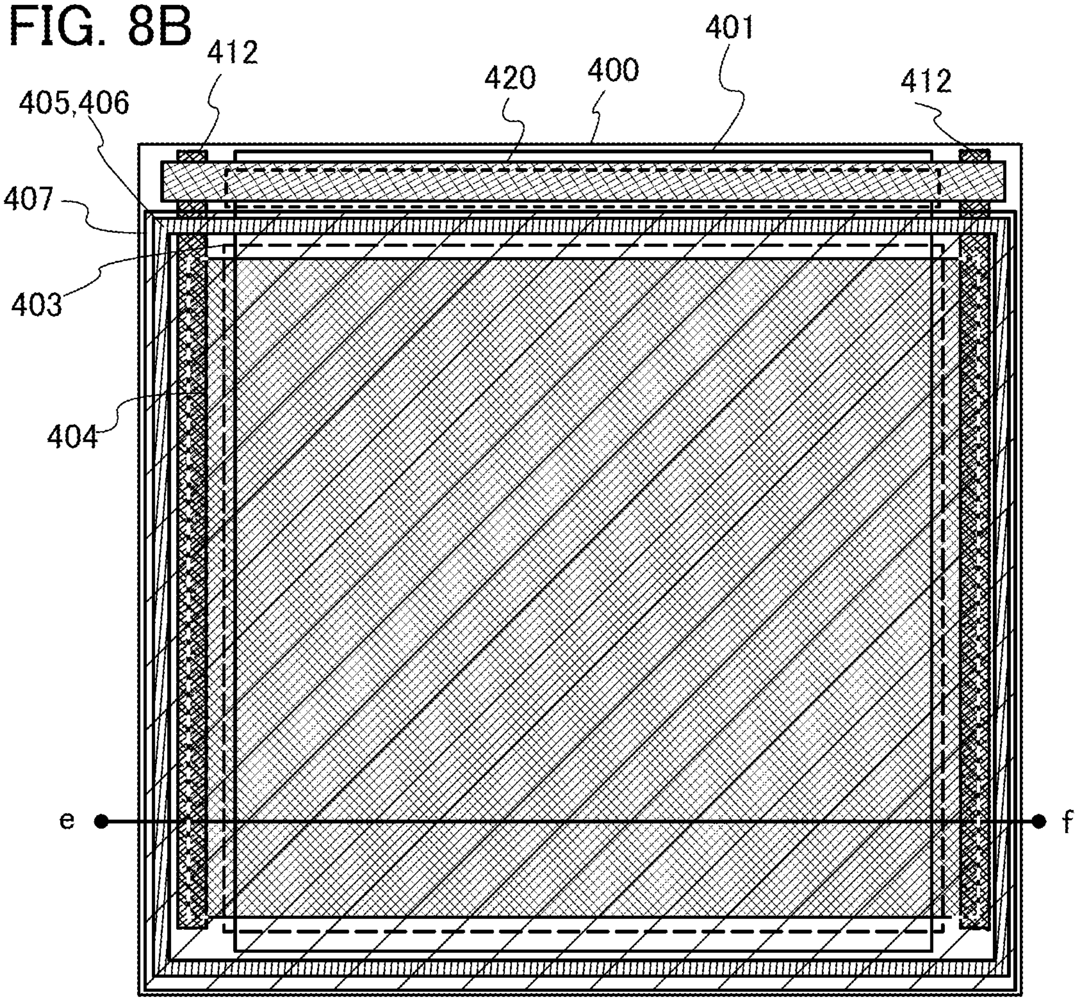

In this embodiment, an example in which the light-emitting device described in Embodiment 1 and Embodiment 3 is used for a lighting device will be described with reference to FIG. 8. FIG. 8B is a top view of the lighting device, and FIG. 8A is a cross-sectional view taken along e-f in FIG. 8B.

In the lighting device in this embodiment, an anode 401 is formed over a substrate 400 which is a support and has a light-transmitting property. The anode 401 corresponds to the anode 101 in Embodiment 3. In the case where light emission is extracted from the anode 401 side, the anode 401 is formed using a material having a light-transmitting property.

A pad 412 for applying voltage to a cathode 404 is formed over the substrate 400.

An EL layer 403 is formed over the anode 401. The structure of the EL layer 403 corresponds to, for example, the structure of the EL layer 103 in Embodiment 1 and Embodiment 3, or the structure in which the light-emitting units 511 and 512 and the charge-generation layer 513 are combined. Note that for these structures, the corresponding description can be referred to.

The cathode 404 is formed to cover the EL layer 403. The cathode 404 corresponds to the cathode 102 in Embodiment 3. The cathode 404 is formed using a material having high reflectance when light emission is extracted through the anode 401 side. The cathode 404 is supplied with a voltage when connected to the pad 412.

As described above, the lighting device described in this embodiment includes a light-emitting device including the anode 401, the EL layer 403, and the cathode 404. Since the light-emitting device is a light-emitting device with high emission efficiency, the lighting device in this embodiment can be a lighting device having low power consumption.

The substrate 400 provided with a light-emitting device having the above structure is fixed to a sealing substrate 407 with sealants 405 and 406 and sealing is performed, whereby the lighting device is completed. It is possible to use only either the sealant 405 or 406. The inner sealant 406 (not shown in FIG. 8B) can be mixed with a desiccant, which enables moisture to be adsorbed, resulting in improved reliability.

When parts of the pad 412 and the anode 401 are extended to the outside of the sealants 405 and 406, the extended parts can function as external input terminals. An IC chip 420 mounted with a converter or the like may be provided over the external input terminals, for example.

The lighting device described in this embodiment includes, as an EL element, the light-emitting device described in Embodiment 1 and Embodiment 3; thus, the light-emitting apparatus can have high reliability. In addition, the light-emitting apparatus can have low power consumption.

Embodiment 6

In this embodiment, examples of electronic devices each partly including the light-emitting device described in Embodiment 1 and Embodiment 3 will be described. The light-emitting device described in Embodiment 1 and Embodiment 3 has a long lifetime and high reliability. As a result, the electronic devices described in this embodiment can each include a light-emitting portion having high reliability.

Examples of the electronic devices to which the above light-emitting device is applied include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

Figure 9A:
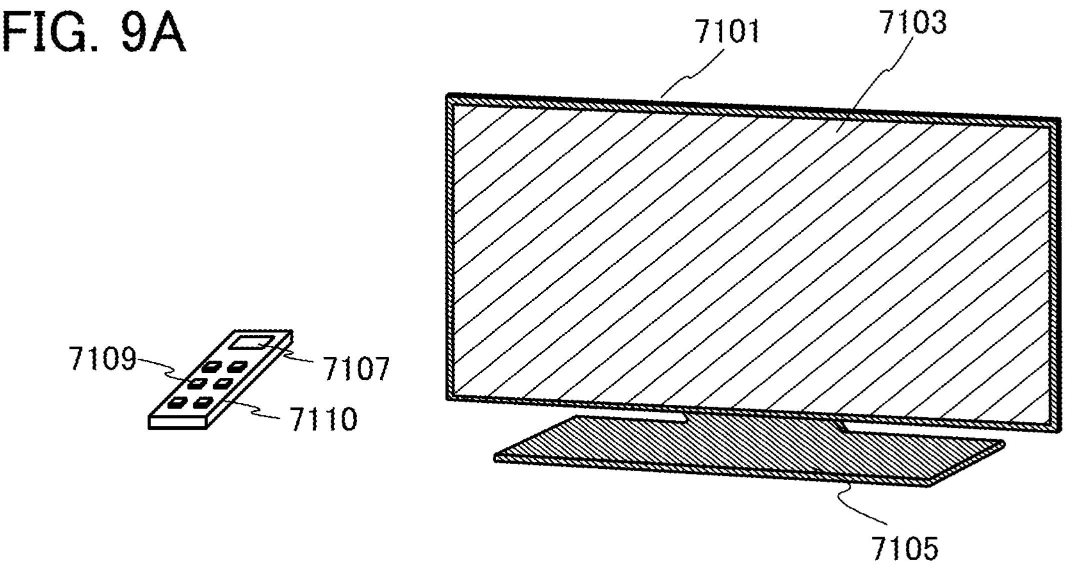
Figure 9A:
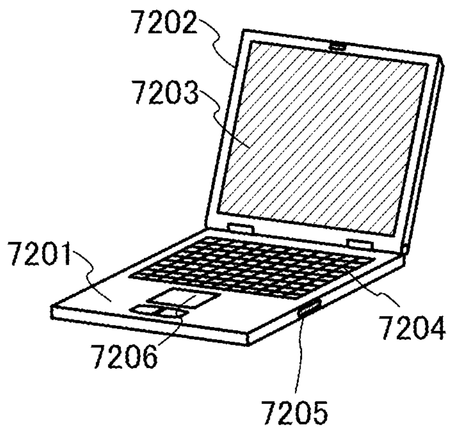
Figure 9A:
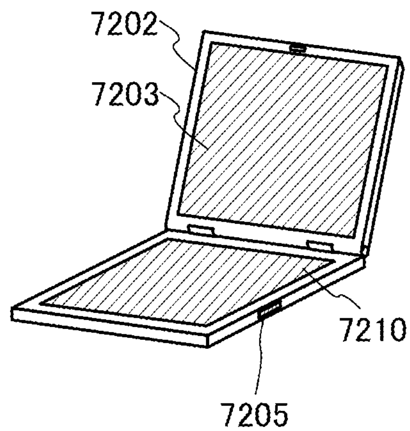

FIG. 9A illustrates an example of a television device. In the television device, a display portion 7103 is incorporated in a housing 7101. Here, a structure in which the housing 7101 is supported by a stand 7105 is illustrated. Images can be displayed on the display portion 7103, and the light-emitting devices described in Embodiment 1 and Embodiment 3 are arranged in a matrix in the display portion 7103.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, a structure may be employed in which the remote controller 7110 is provided with a display portion 7107 for displaying data output from the remote controller 7110.

Note that the television device has a structure including a receiver, a modem, and the like. With the use of the receiver, a general television broadcast can be received, and when the television device is further connected to a communication network with or without wires via the modem, one-way (from a sender to a receiver) or two-way (between a sender and a receiver or between receivers) data communication can be performed.

FIG. 9B1 illustrates a computer, which includes a main body 7201, a housing 7202, a display portion 7203, a keyboard 7204, an external connection port 7205, a pointing device 7206, and the like. Note that this computer is manufactured by arranging the light-emitting devices described in Embodiment 1 and Embodiment 3 in a matrix in the display portion 7203. The computer in FIG. 9B1 may be such a mode as illustrated in FIG. 9B2. A computer in FIG. 9B2 is provided with a second display portion 7210 instead of the keyboard 7204 and the pointing device 7206. The second display portion 7210 is of a touch-panel type, and input can be performed by operating display for input displayed on the second display portion 7210 with a finger or a dedicated pen. The second display portion 7210 can also display images other than the display for input. The display portion 7203 may also be a touch panel. Connecting the two screens with a hinge can prevent troubles such as a crack in or damage to the screens caused when the computer is being stored or carried.

Figure 9C:
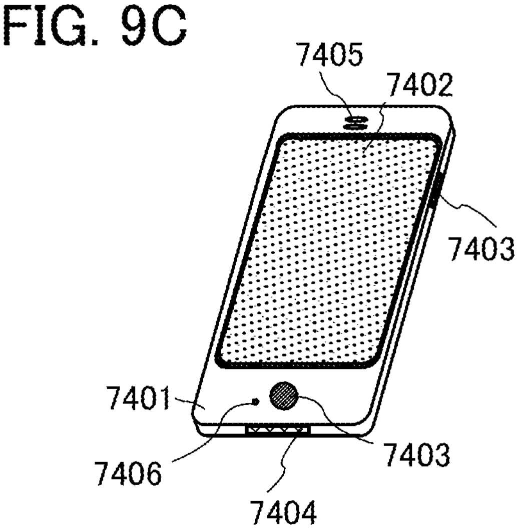

FIG. 9C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone includes the display portion 7402 which is manufactured by arranging the light-emitting devices described in Embodiment 1 and Embodiment 3 in a matrix.

The portable terminal illustrated in FIG. 9C may have a structure in which data can be input by touching the display portion 7402 with a finger or the like. In this case, operations such as making a call and creating an e-mail can be performed by touching the display portion 7402 with a finger or the like.

The display portion 7402 has mainly three screen modes. The first one is a display mode mainly for displaying images, and the second one is an input mode mainly for inputting information such as text. The third one is a display+input mode in which the two modes, the display mode and the input mode, are combined.

For example, in the case of making a call or creating an e-mail, a text input mode mainly for inputting text is selected for the display portion 7402 so that an operation of inputting text displayed on the screen may be performed. In this case, it is preferable to display a keyboard or number buttons on almost the entire screen of the display portion 7402.

When a sensing device including a sensor such as a gyroscope or an acceleration sensor for detecting inclination is provided inside the portable terminal, display on the screen of the display portion 7402 can be automatically changed in direction by determining the orientation (vertical or horizontal) of the portable terminal.

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is moving image data, the screen mode is switched to the display mode, and when the signal is text data, the screen mode is switched to the input mode.

Moreover, in the input mode, when input by the touch operation of the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Figure 10A:
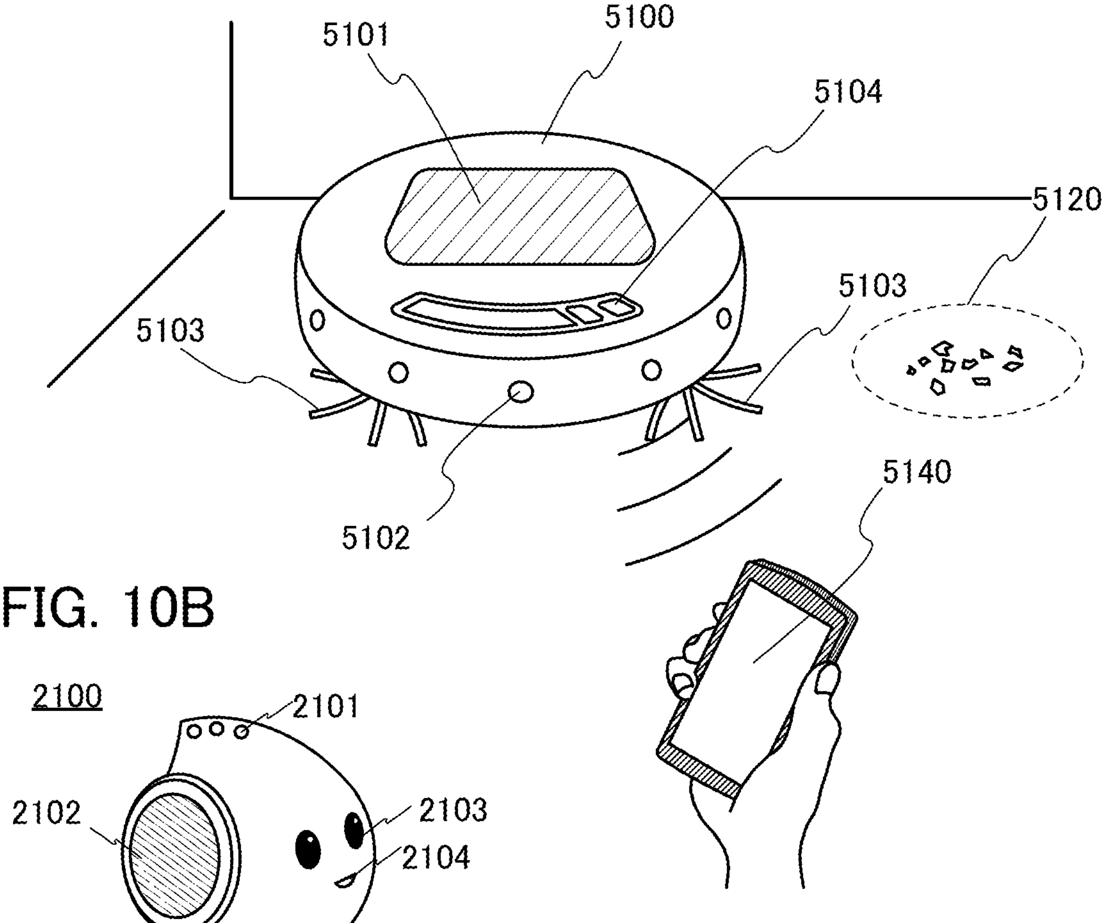
FIG. 10A, FIG. 10B, and FIG. 10C are perspective views showing examples of electronic devices.

FIG. 10A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. The cleaning robot 5100 also includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When an object such as a wire that is likely to be caught in the brush 5103 is detected by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor the room even when the owner is not at home. The display on the display 5101 can be checked by the portable electronic device such as a smartphone.

The light-emitting apparatus of one embodiment of the present invention can be used for the display 5101.

Figure 10B:
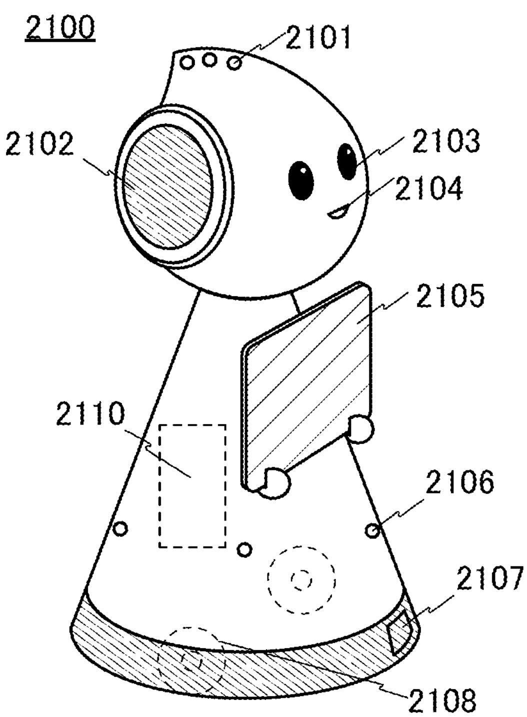

A robot 2100 illustrated in FIG. 10B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 10C:
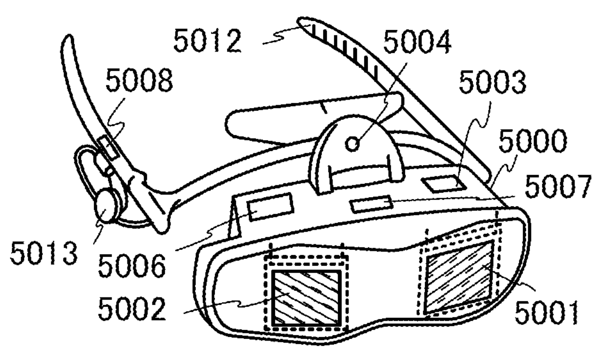

FIG. 10C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001.

Figure 11:
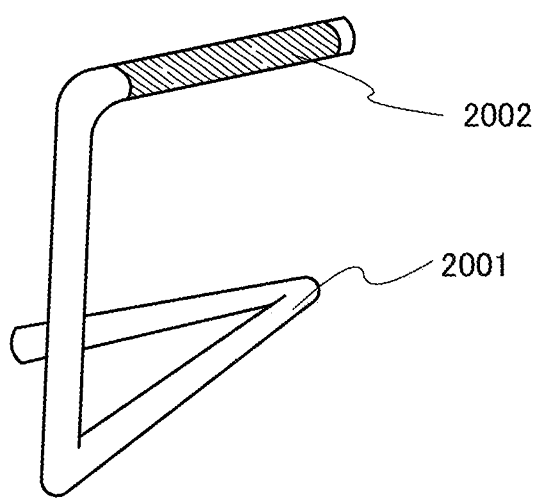
FIG. 11 is a perspective view showing an example of a lighting device.

FIG. 11 illustrates an example in which the light-emitting device described in Embodiment 1 and Embodiment 3 is used for a table lamp which is a lighting device. The table lamp illustrated in FIG. 11 includes a housing 2001 and a light source 2002, and the lighting device described in Embodiment 4 may be used for the light source 2002.

Figure 12:
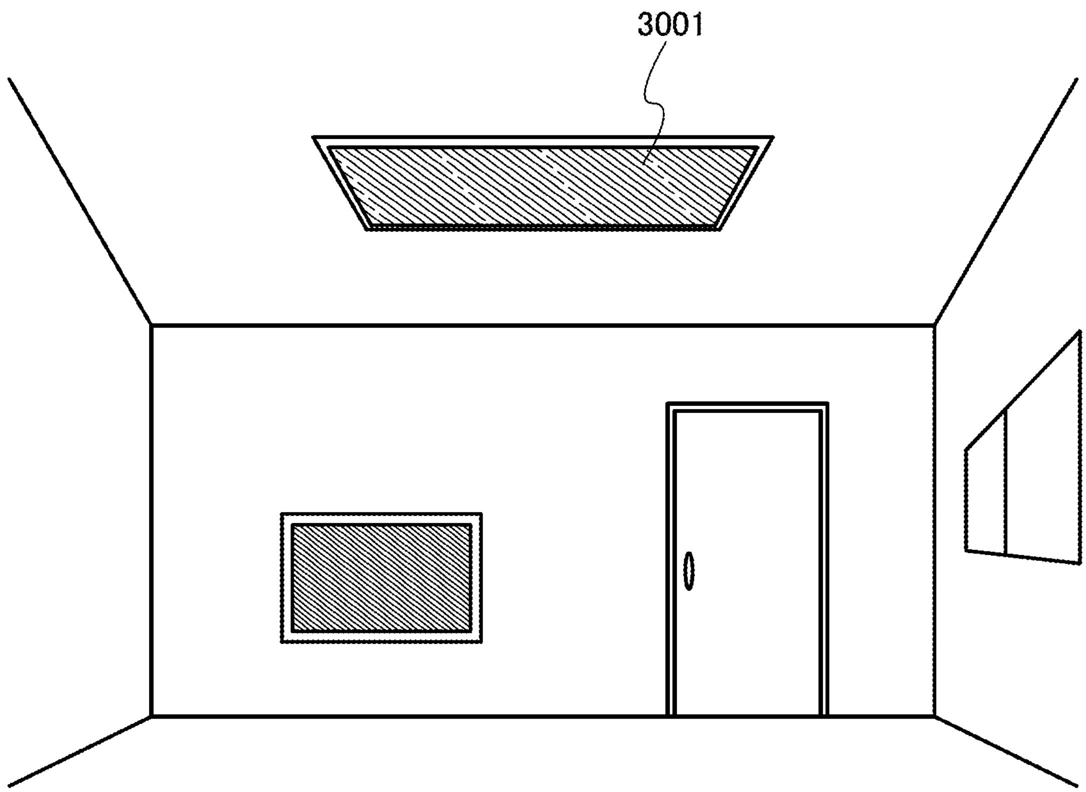
FIG. 12 is a schematic diagram showing an example of a lighting device.

FIG. 12 illustrates an example in which the light-emitting device described in Embodiment 1 and Embodiment 3 is used for an indoor lighting device 3001. Since the light-emitting device described in Embodiment 1 and Embodiment 3 has high reliability, the lighting device can have high reliability. Furthermore, the light-emitting device described in Embodiment 1 and Embodiment 3 can have a large area, and thus can be used as a large-area lighting device. Furthermore, the light-emitting device described in Embodiment 1 and Embodiment 3 is thin, and thus can be used as a lighting device having a reduced thickness.

Figure 13:
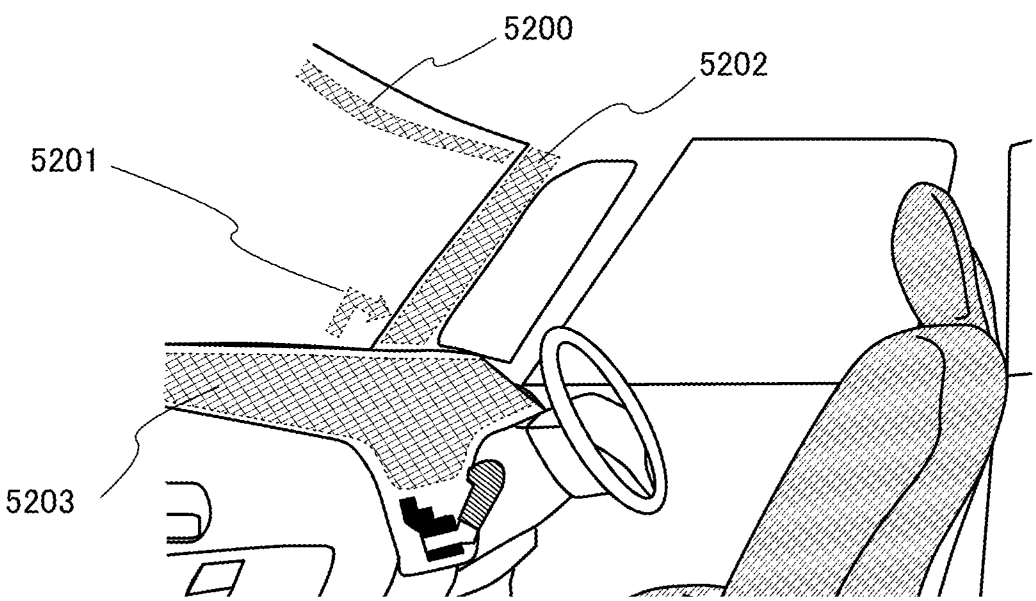
FIG. 13 is a schematic diagram showing examples of in-vehicle display devices.

The light-emitting device described in Embodiment 1 and Embodiment 3 can also be incorporated in an automobile windshield or an automobile dashboard. FIG. 13 illustrates one mode in which the light-emitting devices described in Embodiment 1 and Embodiment 3 are used for an automobile windshield or an automobile dashboard. A display region 5200 to a display region 5203 are each a display region provided using the light-emitting device described in Embodiment 1 and Embodiment 3.

The display region 5200 and the display region 5201 are display devices which are provided in the automobile windshield and in which the light-emitting devices described in Embodiment 1 and Embodiment 3 are incorporated. When the light-emitting devices described in Embodiment 1 and Embodiment 3 are fabricated using electrodes having light-transmitting properties as an anode and a cathode, what is called see-through display devices, through which the opposite side can be seen, can be obtained. Such see-through display can be provided even in the automobile windshield without hindering the view. Note that in the case where a driving transistor or the like is provided, a transistor having a light-transmitting property, such as an organic transistor including an organic semiconductor material or a transistor including an oxide semiconductor, is preferably used.

The display region 5202 is a display device which is provided in a pillar portion and in which the light-emitting device described in Embodiment 1 and Embodiment 3 is incorporated. The display region 5202 can compensate for the view hindered by the pillar by displaying an image taken by an imaging means provided in the car body. Similarly, the display region 5203 provided in the dashboard portion can compensate for the view hindered by the car body by displaying an image taken by an imaging means provided on the outside of the automobile, which leads to elimination of blind areas and enhancement of safety. Showing an image so as to compensate for the area that cannot be seen makes it possible to confirm safety more naturally and comfortably.

The display region 5203 can provide a variety of kinds of information such as navigation data, a speedometer, a tachometer, a state of air-condition setting, and the like. The content or layout of the display can be changed freely in accordance with the preference of a user. Note that such information can also be displayed on the display region 5200 to the display region 5202. The display region 5200 to the display region 5203 can also be used as lighting devices.

Figure 14A:
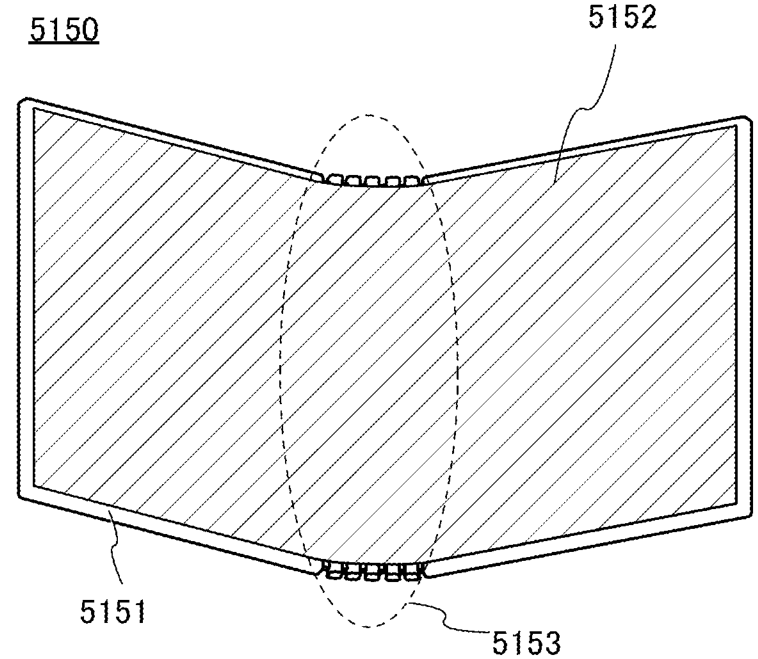
FIG. 14A and FIG. 14B are perspective views showing an example of an electronic device.
Figure 14B:
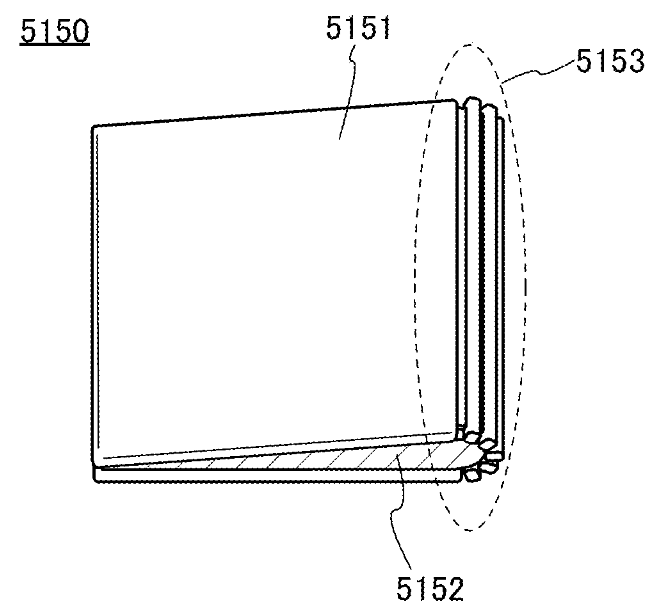

FIG. 14A and FIG. 14B illustrate a foldable portable information terminal 5150. The foldable portable information terminal 5150 includes a housing 5151, a display region 5152, and a bend portion 5153. FIG. 14A illustrates the portable information terminal 5150 that is opened. FIG. 14B illustrates the portable information terminal that is folded.

The display region 5152 can be folded in half with the bend portion 5153. The bend portion 5153 includes a flexible member and a plurality of supporting members, and when the display region is folded, the flexible member expands and the bend portion 5153 has a radius of curvature of greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 15A:
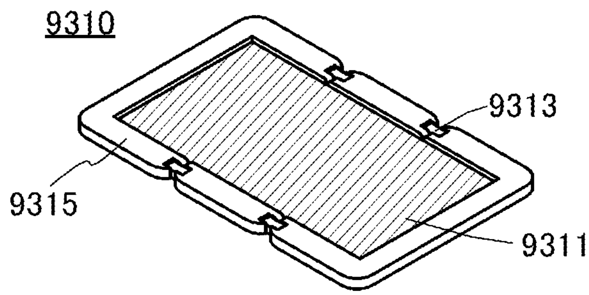
FIG. 15A, FIG. 15B, and FIG. 15C are perspective views showing an example of an electronic device.
Figure 15B:
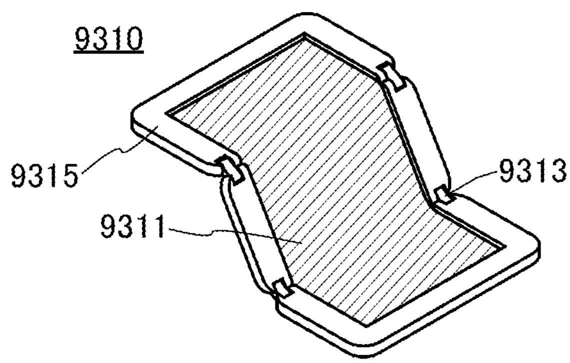
Figure 15C:
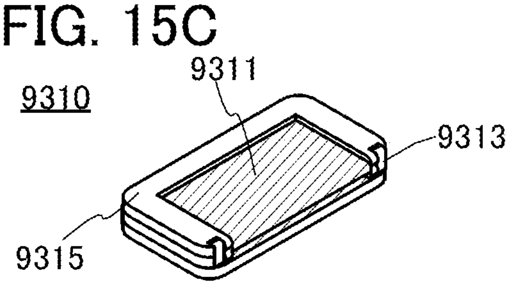

FIG. 15A to FIG. 15C illustrate a foldable portable information terminal 9310. FIG. 15A illustrates the portable information terminal 9310 that is opened. FIG. 15B illustrates the portable information terminal 9310 which is in the state of being changed from one of an opened state and a folded state to the other. FIG. 15C illustrates the portable information terminal 9310 that is folded. The portable information terminal 9310 is excellent in portability when folded, and is excellent in display browsability when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Note that the structure described in this embodiment can be combined with any of the structures described in Embodiment 1 to Embodiment 5 as appropriate.

Example

In this example, synthesis methods of the following compounds will be described.

[Chemical Formula 25]

(100)

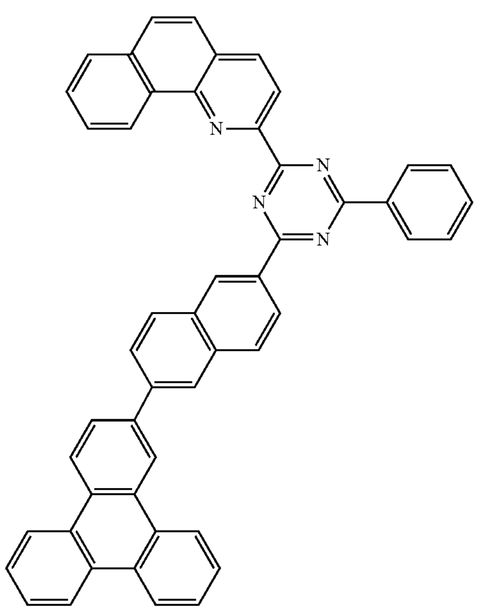

-continued (116)

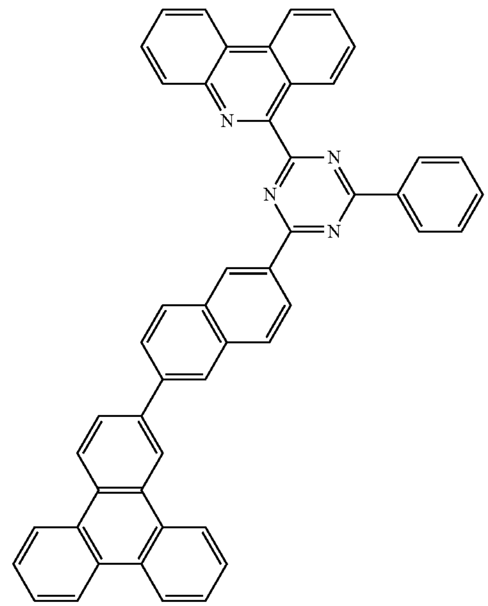

(130)

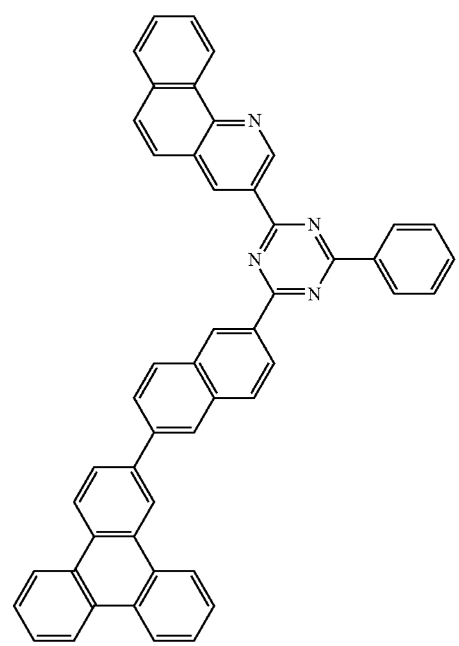

-continued
(105)
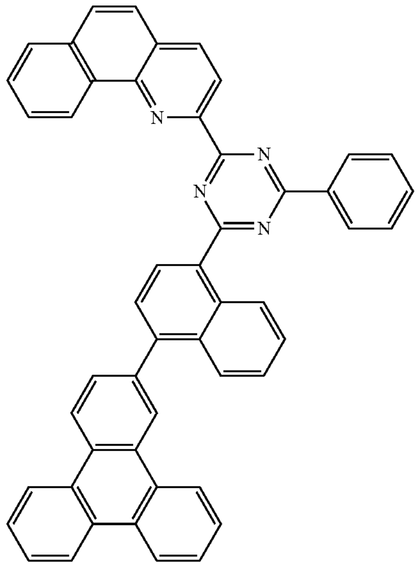
(158)
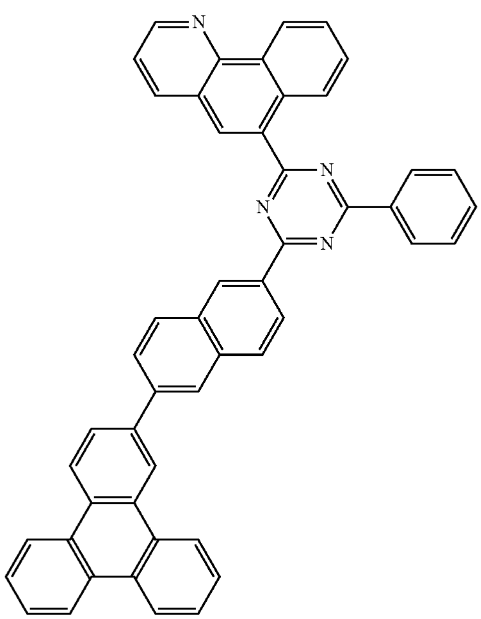
-continued
[Chemical Formula 26]
(128)
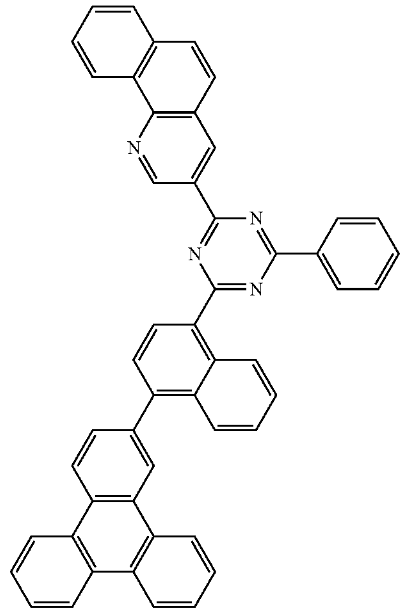
(121)
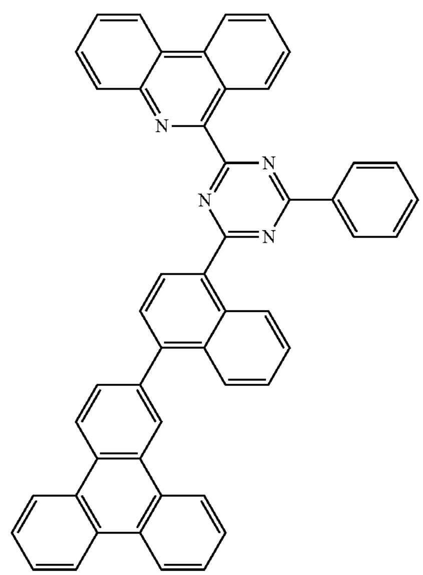

-continued (156)

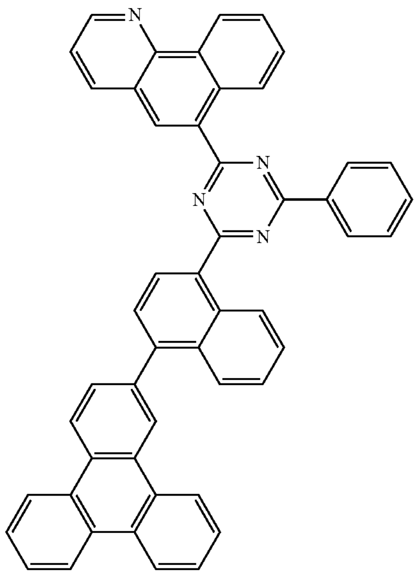

First, a synthesis method of the compound (100) will be described.

Step 1: Synthesis of 2-(6-bromonaphthalen-2-yl)triphenylene

Into a three-neck flask equipped with a cooling tube, a three-way cock, and a ground stopper were put 10 mmol of 4,4,5,5-tetramethyl-2-(triphenylen-2-yl)-1,3,2-dioxaborolane, 10 mmol of 2,6-dibromonaphthalene, 20 mmol of potassium carbonate, 10 mL of water, 40 mL of toluene, 10 mL of ethanol, 0.2 mmol of 2-dicyclophosphino-2'-6'-dimethoxybiphenyl, and 0.1 mmol of palladium(II) acetate, the air in the flask was replaced with nitrogen, and the mixture was stirred at room temperature to 60° C., whereby 6-bromonaphthalen-2-yltriphenylene, which was a target, was obtained. In this reaction, the temperature is preferably room temperature in order to inhibit generation of impurities in which two triphenylenyl groups are coupled with each other. On the other hand, a raw material having a triphenylene skeleton has low solubility, and thus is preferably heated. Accordingly, improvement in yield is expected when the above-mentioned amount of toluene is further increased. The reaction scheme of Step 1 is shown below.

[Chemical Formula 27]

(1-1)

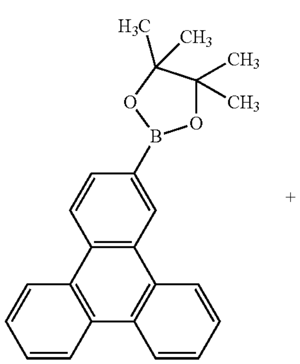

-continued

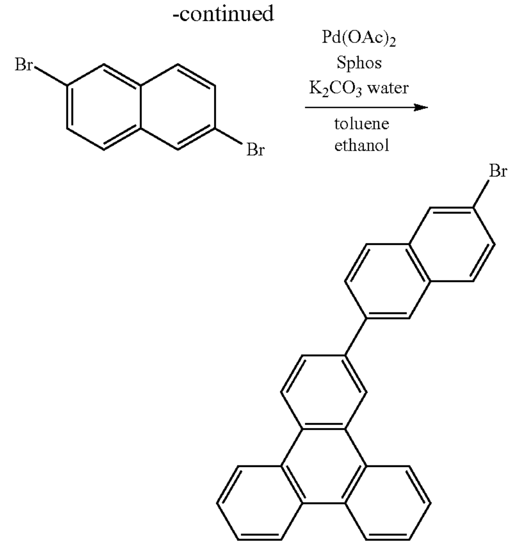

Step 2: Synthesis of 4,4,5,5-tetramethyl-2-[6-(triphenylen-2-yl)naphthyl]-1,3,2-dioxaborolane Into a three-neck flask equipped with a cooling tube, a three-way cock, and a ground stopper were put 10 mmol of 2-(6-bromonaphthalen-2-yl)triphenylene obtained in Step 1, 10 mmol of bis(pinacolate)diborane, 20 mmol of potassium acetate, 50 mL of 1,4-dioxane, 0.1 mmol of [1,1'-bis(diphenylphosphino)ferrocene]palladium(I) dichloride, the air in the system was replaced with nitrogen, and the mixture was stirred at 80° C. to 100° C., whereby 4,4,5,5-tetramethyl-2-[6-(triphenylen-2-yl)naphthyl]-1,3,2-dioxaborolane, which was a target, was obtained. In this reaction, solubility of a triphenylene skeleton is low, and thus a diluted reaction condition is preferable. Accordingly, approximately 100 mL of xylene may be used as a solvent (the concentration is approximately 0.1 M). The reaction scheme of Step 2 is shown below.

[Chemical Formula 28]

(2-1)

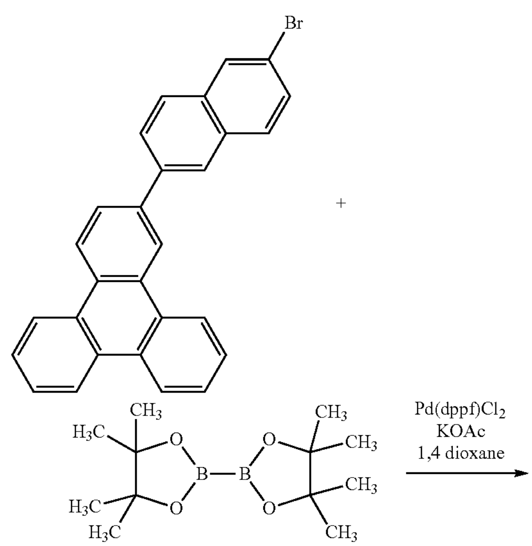

-continued

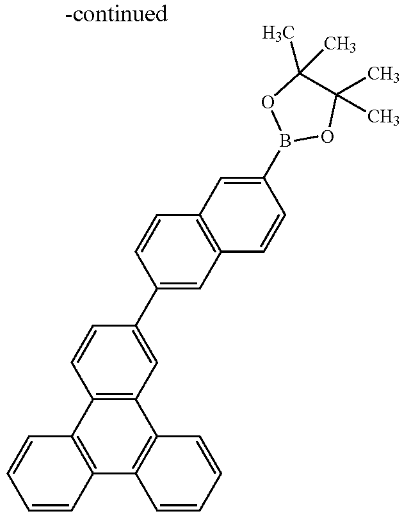

Step 3: Synthesis of 4,4,5,5-tetramethyl-2-(benzo[h]quinolin-2-yl)-1,3,2-dioxaborolane Into a three-neck flask equipped with a cooling tube, a three-way cock, and a ground stopper were put 10 mmol of 2-chlorobenzo[h]quinoline, 10 mmol of bis(pinacolate)diborane, 20 mmol of potassium acetate, 50 mL of 1,4-dioxane, 0.1 mmol of [1,1'-bis(diphenylphosphino)ferrocene]palladium(II) dichloride, the air in the system was replaced with nitrogen, and the mixture was stirred at 80° C. to 100° C., whereby 4,4,5,5-tetramethyl-2-(benzo[h]quinolin-2-yl)-1,3,2-dioxaborolane, which was a target, was obtained. In this reaction, a reaction solvent is desired to have high polarity since a benzo[h]quinoline skeleton has high polarity, and thus the target can be obtained in a high yield by using a high-polar solvent such as DMF. The reaction scheme of Step 3 is shown below.

[Chemical Formula 29]

(3-1)

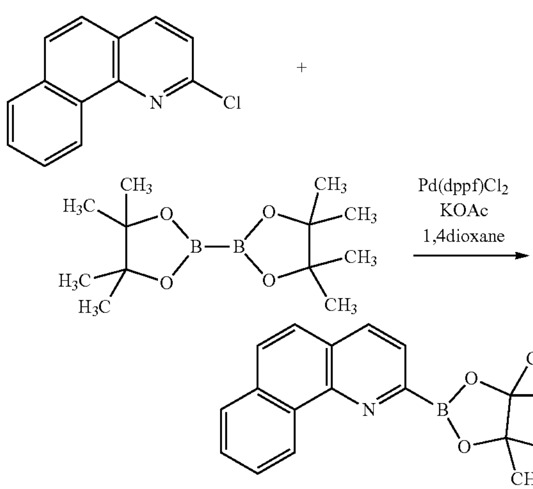

Step 4: Synthesis of 2-chloro-4-phenyl-6-[6-(triphenylen-2-yl)naphthalen-2-yl]-1,3,5-triazine Into a three-neck flask equipped with a cooling tube, a three-way cock, and a ground stopper were put 10 mmol of 4,4,5,5-tetramethyl-2-[6-(triphenylen-2-yl)naphthyl]-1,3,2-dioxaborolane obtained in Step 2, 10 mmol of 2,4-dichloro-1,3,5-triazine, 20 mmol of cesium carbonate, 50 mL of xylene, 0.1 mmol of tetrakis(triphenylphosphine)palladium (0), the air in the system was replaced with nitrogen, and the mixture was stirred at 80° C. to 150° C., whereby 2-chloro-4-phenyl-6-[6-(triphenylen-2-yl)naphthalen-2-yl]-1,3,5-triazine, which was a target, was obtained. In this reaction, coupling is preferably performed under a diluted condition in order to inhibit generation of impurities in which two 6-bromonaphthalen-2-yltriphenylene are coupled with each other. Accordingly, approximately 100 mL of xylene may be used as a solvent (the concentration is approximately 0.1 M). The reaction scheme of Step 4 is shown below.

[Chemical Formula 30]

(4-1)

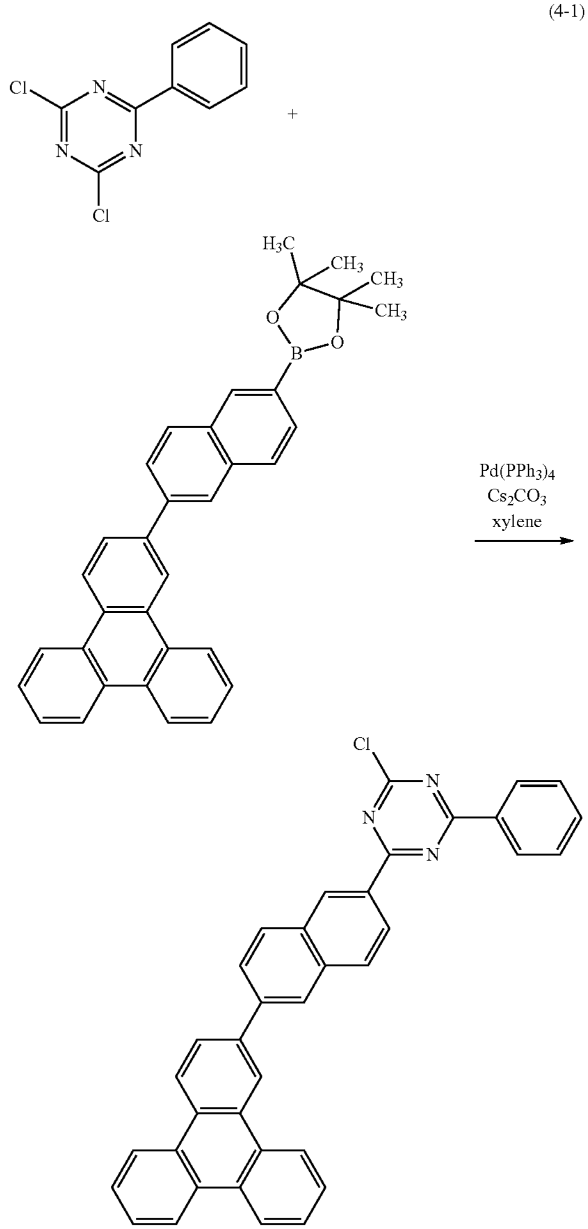

Step 5: Synthesis of 2-(benzo[h]quinolin-2-yl-4-phenyl-6-[6-(triphenylen-2-yl)naphthalen-2-yl]-1,3,5-triazine (the compound (100))

Into a three-neck flask equipped with a cooling tube, a three-way cock, and a ground stopper were put 10 mmol of 4,4,5,5-tetramethyl-2-(benzo[h]quinolin-2-yl)-1,3,2-dioxaborolane obtained in Step 3, 2-chloro-4-phenyl-6-[6-(triphenylen-2-yl)naphthalen-2-yl]-1,3,5-triazine obtained in Step 4, 20 mmol of cesium carbonate, 50 mL of xylene, 0.1 mmol of tetrakis(triphenylphosphine)palladium(0), the air in the system was replaced with nitrogen, and the mixture was stirred at 80° C. to 150° C., whereby 2-(benzo[h]quinolin-2-yl-4-phenyl-6-[6-(triphenylen-2-yl)naphthalen-2-yl]-1,3,5-triazine (the compound (100)), which was a target, was obtained. In this reaction, coupling is preferably caused under a diluted condition since solubility of the target and that of the raw materials are probably both low. Accordingly, approximately 100 mL of xylene may be used as a solvent (the concentration is approximately 0.1 M). Since 4,4,5,5-tetramethyl-2-(benzo[h]quinolin-2-yl)-1,3,2-dioxaborolane, which is the raw material, is a heterocycle having a high polarity, a polar solvent such as DMF may be used. The reaction scheme of Step 5 is shown below.

[Chemical Formula 31]

(5-1)

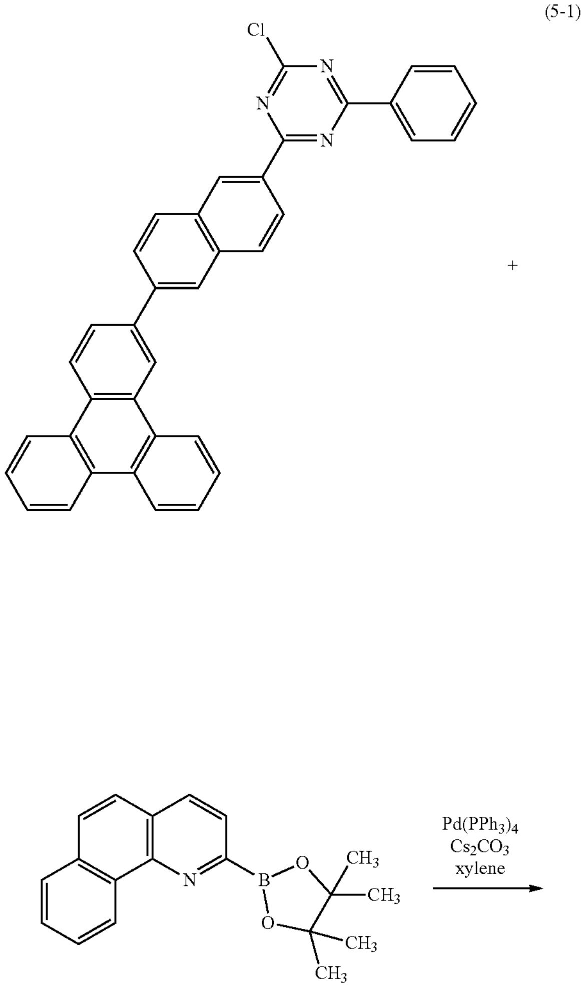

-continued

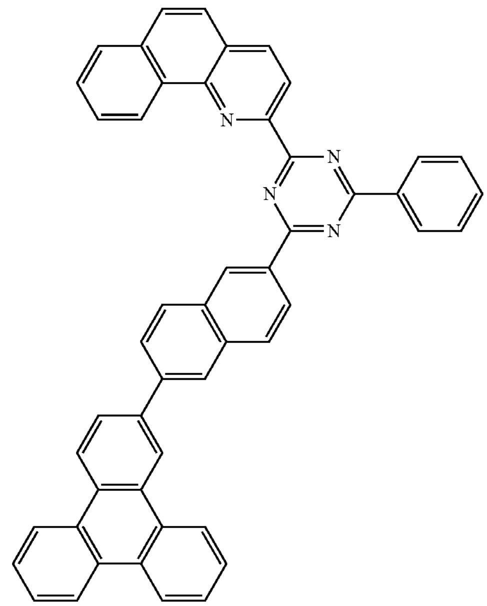

(100)

In the above manner, the target substance (100) can be synthesized in accordance with Steps 1 to 5. Note that Steps 1 to 5 are the synthesis method similar to the method based on Reaction Schemes (b-1) to (b-2) shown in Embodiment 1. The synthesis method of the compound (100) is not limited to the above; for example, the compound (100), which is the target substance, can also be obtained in such a manner that a cross-coupling reaction between 4,4,5,5-tetramethyl-2-(benzo[h]quinolin-2-yl)-1,3,2-dioxaborolane and 2,4-dichloro-1,3,5-triazine in a molar ratio of 1:1 is caused first, and then, a cross-coupling reaction between the target substance obtained by the above-described reaction and 4,4,5,5-tetramethyl-2-[6-(triphenylen-2-yl)naphthyl]-1,3,2-dioxaborolane is caused, in accordance with Reaction Schemes (a-1) to (a-2) shown in Embodiment 1.

Through a similar reaction, the compounds (116), (130), (105), (158), (128), (121), and (156) can also be synthesized. For example, through Reaction Scheme (1-2) or (1-3) below similar to that of Step 1, 2-(bromonaphthyl)triphenylene having a substituent at an arbitrary position can be obtained. Specifically, in Step 1, 2-(4-bromonaphthalen-2-yl)triphenylene can be obtained when 1,4-dibromonaphthalene is used instead of 2,6-dibromonaphthalene (Reaction Scheme (1-2)), and 2-(5-bromonaphthalen-2-yl)triphenylene can be obtained when 1,5-dibromonaphthalene is used instead of 2,6-dibromonaphthalene (Reaction Scheme (1-3)). Reaction Schemes (1-2) and (1-3) are shown below.

[Chemical Formula 32]

(1-2)

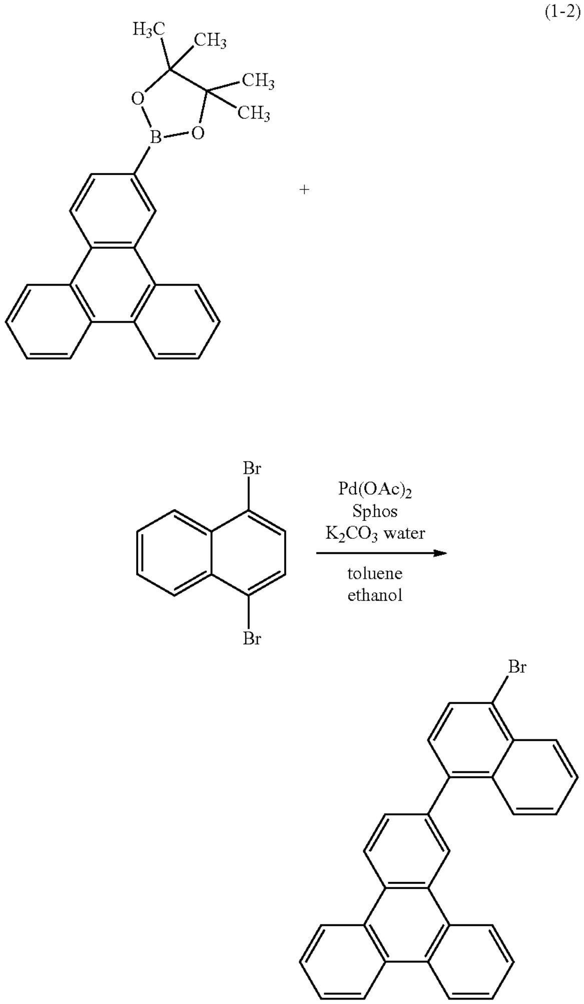

(1-3)

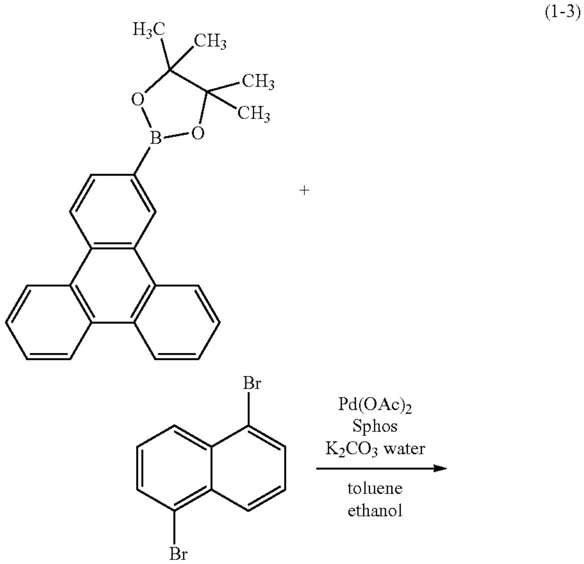

-continued

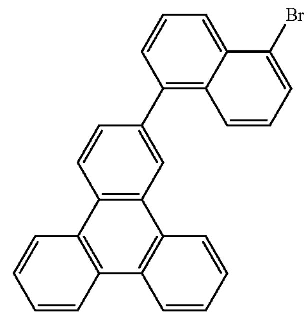

Next, a reaction is caused in accordance with Reaction Schemes (2-2) and (2-3) in a manner similar to that of Step 2, whereby 2-4,4,5,5-tetramethyl-2-(triphenylenylnaphthalene-diyl)-1,3,2-dioxaborolane having a substituent at an arbitrary position can be obtained. Specifically, in Step 2, 4,4,5,5-tetramethyl-2-[4-(triphenylen-2-yl)naphthyl]-1,3,2-dioxaborolane can be obtained when 2-(4-bromonaphthalen-2-yl)triphenylene is used instead of 2-(6-bromonaphthalen-2-yl)triphenylene (Reaction Scheme (2-2)), and 4,4,5,5-tetramethyl-2-[5-(triphenylen-2-yl)naphthyl]-1,3,2-dioxaborolane can be obtained when 2-(5-bromonaphthalen-2-yl)triphenylene is used instead of 2-(6-bromonaphthalen-2-yl)triphenylene (Reaction Scheme (2-3). Reaction Schemes (2-2) and (2-3) are shown below.

[Chemical Formula 33]

(2-2)

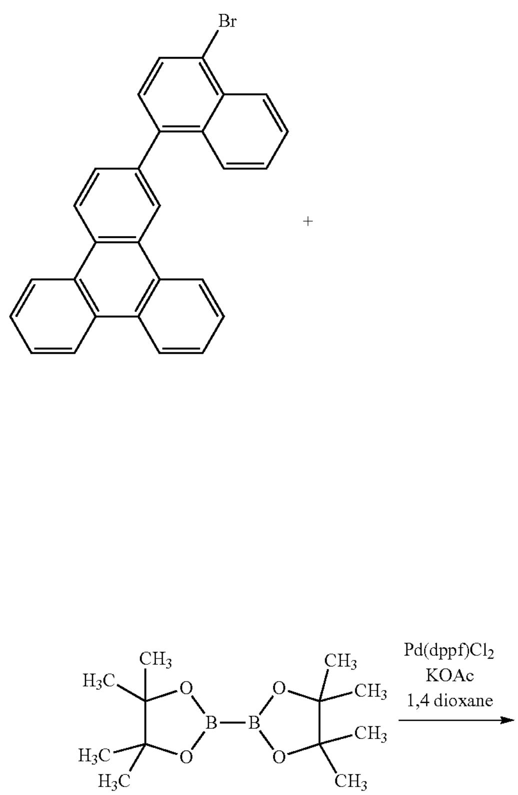

-continued

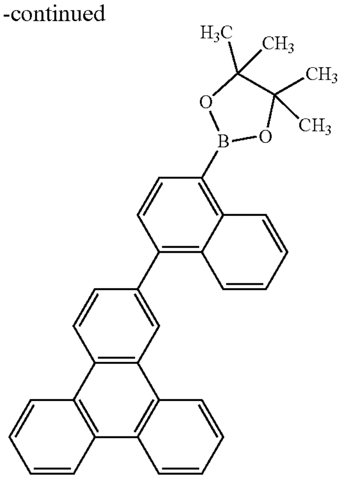

(2-3)

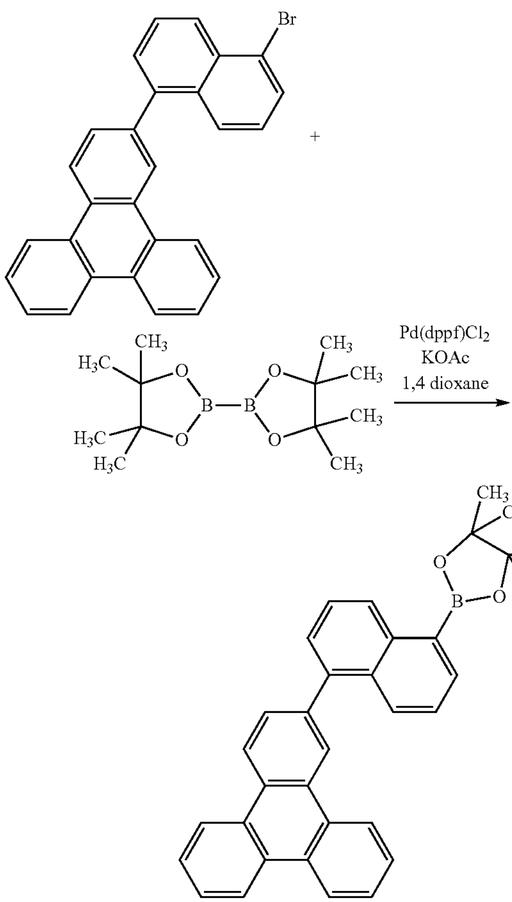

Next, a reaction is caused in accordance with Reaction Schemes (3-2) to (3-6) in a manner similar to that of Step 3, whereby 4-4,5,5-tetramethyl-2-(benzoquinolinyl)-1,3,2-dioxaborolane or 4-4,5,5-tetramethyl-2-(benzoisoquinolinyl)-1,3,2-dioxaborolane both having a substituent at an arbitrary position can be obtained. Specifically, 4,4,5,5-tetramethyl-2-(benzo[h]quinolin-3-yl)-1,3,2-dioxaborolane can be obtained when 3-iodobenzo[h]quinoline is used instead of 2-chlorobenzo[h]quinoline (Reaction Scheme (3-2)); 4,4,5,5-tetramethyl-2-(benzo[h]quinolin-6-yl)-1,3,2-dioxaborolane can be obtained when 6-chlorobenzo[h]quinoline or 6-bromobenzo[h]quinoline is used instead of 2-chlorobenzo[h]quinoline (Reaction Schemes (3-3) and (3-4)); and 4,4, 5,5-tetramethyl-2-(phenanthridin-6-yl)-1,3,2-dioxaborolane can be obtained when 6-chlorophenanthridine or 6-bromophenanthridine is used instead of 2-chlorobenzo[h]quinoline (Reaction Schemes (3-5) and (3-6)). Reaction Schemes (3-2) to (3-6) are shown below.

[Chemical Formula 34]

(3-2)

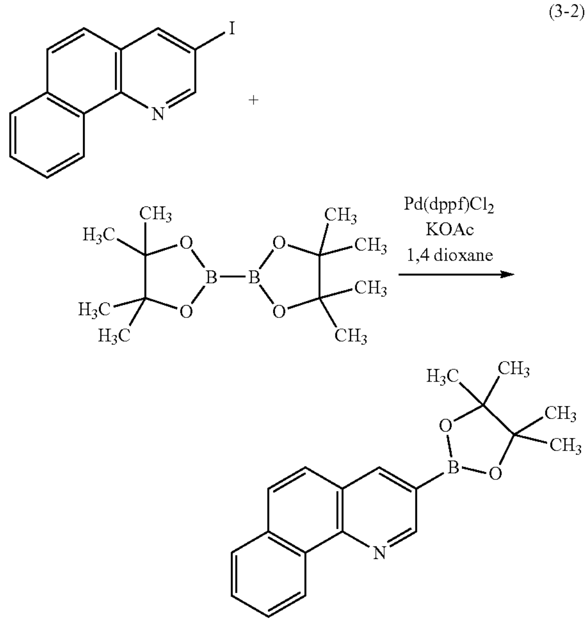

(3-3)

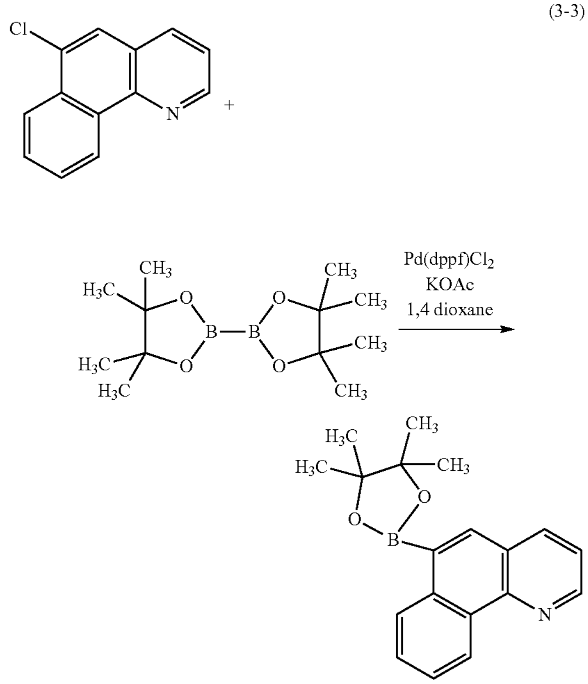

(3-4)

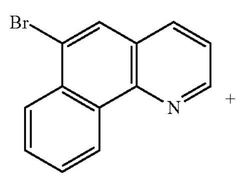

-continued

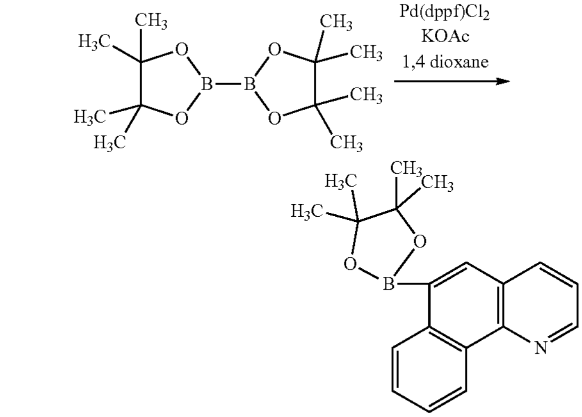

(3-5)

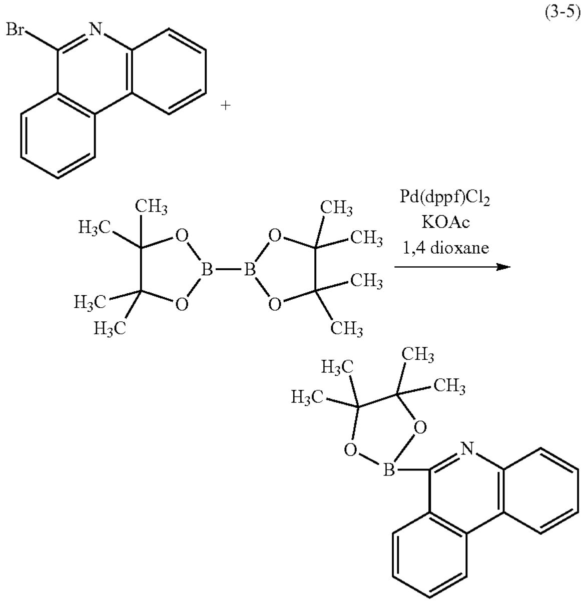

(3-6)

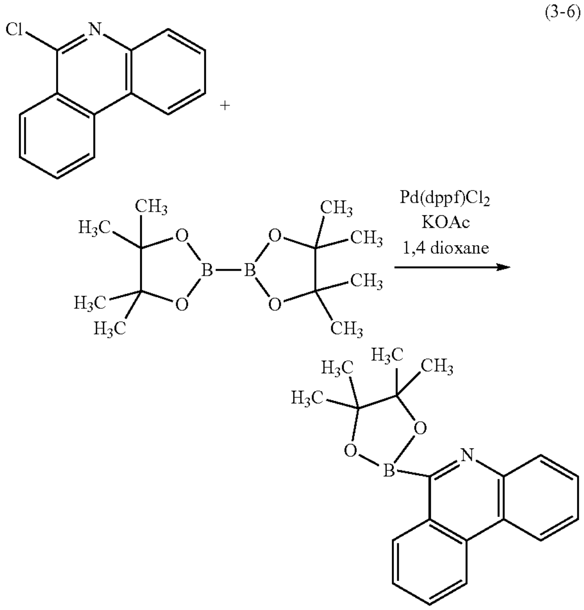

Next, a reaction is caused in accordance with Reaction Schemes (4-2) and (4-3) in a manner similar to that of Step 4, whereby 2-chloro-4-phenyl-6-(2-triphenylenyl)naphthyl-1,3,5-triazine having a substituent at an arbitrary position can be obtained. Specifically, in Step 4, 2-chloro-4-phenyl-6-[4-(2-triphenylenyl)naphthyl-1-yl]-1,3,5-triazine can be obtained when 4,4,5,5-tetramethyl-2-[4-(2-triphenylenyl)naphthyl]-1,3,2-dioxaborolane is used instead of 4,4,5,5-tetramethyl-2-[6-(2-triphenylenyl)naphthyl]-1,3,2-dioxaborolane (Reaction Scheme (4-2)), and 2-chloro-4-phenyl-6-[5-(2-triphenylenyl)naphthyl-1-yl]-1,3,5-triazine can be obtained when 4,4,5,5-tetramethyl-2-[5-(2-triphenylenyl)naphthyl]-1,3,2-dioxaborolane is used instead of 4,4,5,5-tetramethyl-2-[6-(2-triphenylenyl)naphthyl]-1,3,2-dioxaborolane (Reaction Scheme (4-3)). Reaction Schemes (4-2) to (4-3) are shown below.

[Chemical Formula 35]

(4-2)

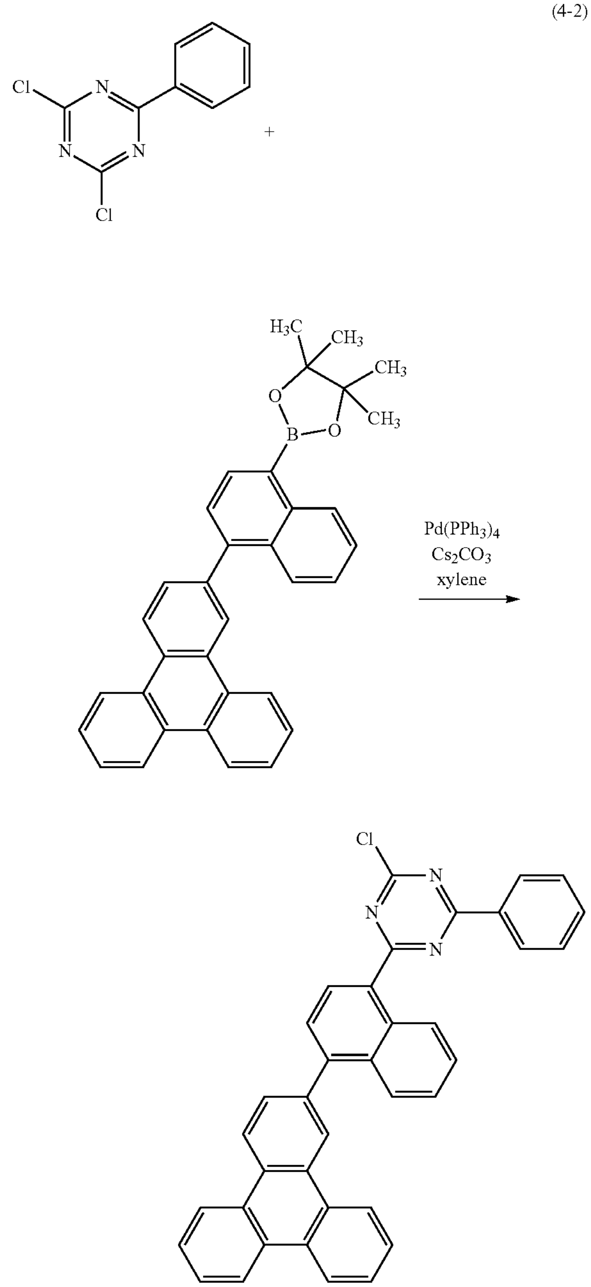

-continued (4-3)

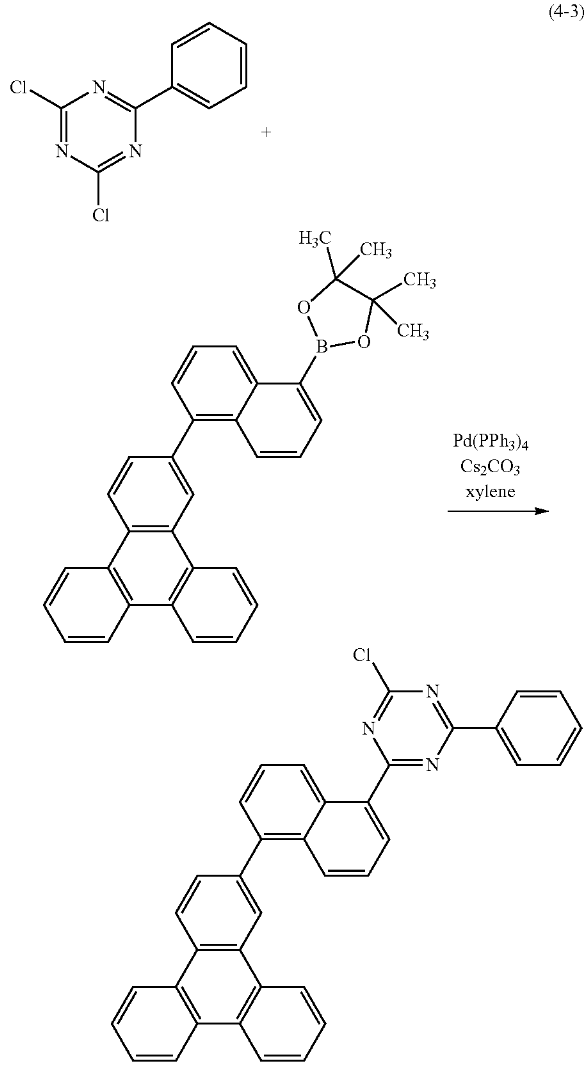

Next, a reaction is caused in accordance with Reaction Schemes (5-2) to (5-12), in a manner similar to that of Step 5, whereby the target compounds (130), (158), (116), (105), (128), (156), (121), (106), (129), (157), and (123) can be obtained. Specifically, the target compound (130) can be obtained when 4,4,5,5-tetramethyl-2-(benzo[h]quinolin-3-yl)-1,3,2-dioxaborolane is used instead of 4,4,5,5-tetramethyl-2-(benzo[h]quinolin-2-yl)-1,3,2-dioxaborolane (Reaction Scheme (5-2)); the target compound (158) can be obtained when 4,4,5,5-tetramethyl-2-(benzo[h]quinolin-6-yl)-1,3,2-dioxaborolane is used instead of 4,4,5,5-tetramethyl-2-(benzo[h]quinolin-2-yl)-1,3,2-dioxaborolane (Reaction Scheme (5-3)); the target compound (116) can be obtained when 4,4,5,5-tetramethyl-2-(phenanthridin-6-yl)-1,3,2-dioxaborolane is used instead of 4,4,5,5-tetramethyl-2-(benzo[h]quinolin-2-yl)-1,3,2-dioxaborolane (Reaction Scheme (5-4)); the target compound (105) can be obtained when 2-chloro-4-phenyl-6-[4-(triphenylen-2-yl)naphthalen-1-yl]-1,3,5-triazine is used instead of 2-chloro-4-phenyl-6-[6-(triphenylen-2-yl)naphthalen-2-yl]-1,3,5-triazine (Reaction Scheme (5-5)); the target compound (128) can be obtained when 2-chloro-4-phenyl-6-[4-(triphenylen-2-yl)naphthalen-1-yl]-1,3,5-triazine is used instead of 2-chloro-4-phenyl-6-[6-(triphenylen-2-yl)naphthalen-2-yl]-1,3,5-triazine and 4,4,5,5-tetramethyl-2-(benzo[h]quinolin-3-yl)-1,3,2-dioxaborolane is used instead of 4,4,5,5-tetramethyl-2-(benzo[h]quinolin-2-yl)-1,3,2-dioxaborolane (Reaction Scheme (5-6)); the target compound (156) can be obtained when 2-chloro-4-phenyl-6-[4-(triphenylen-2-yl)naphthalen-1-yl]-1,3,5-triazine is used instead of 2-chloro-4-phenyl-6-[6-(triphenylen-2-yl)naphthalen-2-yl]-1,3,5-triazine and 4,4,5,5-tetramethyl-2-(benzo[h]quinolin-6-yl)-1,3,2-dioxaborolane is used instead of 4,4,5,5-tetramethyl-2-(benzo[h]quinolin-2-yl)-1,3,2-dioxaborolane (Reaction Scheme (5-7)); the target compound (121) can be obtained when 2-chloro-4-phenyl-6-[4-(triphenylen-2-yl)naphthalen-1-yl]-1,3,5-triazine is used instead of 2-chloro-4-phenyl-6-[6-(triphenylen-2-yl)naphthalen-2-yl]-1,3,5-triazine and 4,4,5,5-tetramethyl-2-(phenanthridin-6-yl)-1,3,2-dioxaborolane is used instead of 4,4,5,5-tetramethyl-2-(benzo[h]quinolin-2-yl)-1,3,2-dioxaborolane (Reaction Scheme (5-8)); the target compound (106) can be obtained when 2-chloro-4-phenyl-6-[5-(triphenylen-2-yl)naphthalen-1-yl]-1,3,5-triazine is used instead of 2-chloro-4-phenyl-6-[6-(triphenylen-2-yl)naphthalen-2-yl]-1,3,5-triazine (Reaction Scheme (5-9)); the target compound (129) can be obtained when 2-chloro-4-phenyl-6-[5-(triphenylen-2-yl)naphthalen-1-yl]-1,3,5-triazine is used instead of 2-chloro-4-phenyl-6-[6-(triphenylen-2-yl)naphthalen-2-yl]-1,3,5-triazine and 4,4,5,5-tetramethyl-2-(benzo[h]quinolin-3-yl)-1,3,2-dioxaborolane is used instead of 4,4,5,5-tetramethyl-2-(benzo[h]quinolin-2-yl)-1,3,2-dioxaborolane (Reaction Scheme (5-10)); the target compound (157) can be obtained when 2-chloro-4-phenyl-6-[5-(triphenylen-2-yl)naphthalen-1-yl]-1,3,5-triazine is used instead of 2-chloro-4-phenyl-6-[6-(triphenylen-2-yl)naphthalen-2-yl]-1,3,5-triazine and 4,4,5,5-tetramethyl-2-(benzo[h]quinolin-6-yl)-1,3,2-dioxaborolane is used instead of 4,4,5,5-tetramethyl-2-(benzo[h]quinolin-2-yl)-1,3,2-dioxaborolane (Reaction Scheme (5-11)); and the target compound (123) can be obtained when 2-chloro-4-phenyl-6-[5-(triphenylen-2-yl)naphthalen-1-yl]-1,3,5-triazine is used instead of 2-chloro-4-phenyl-6-[6-(triphenylen-2-yl)naphthalen-2-yl]-1,3,5-triazine and 4,4,5,5-tetramethyl-2-(phenanthridin-6-yl)-1,3,2-dioxaborolane is used instead of 4,4,5,5-tetramethyl-2-(benzo[h]quinolin-2-yl)-1,3,2-dioxaborolane (Reaction Scheme (5-12)). Reaction Schemes (5-2) to (5-12) are shown below.

[Chemical Formula 36]

(5-2)

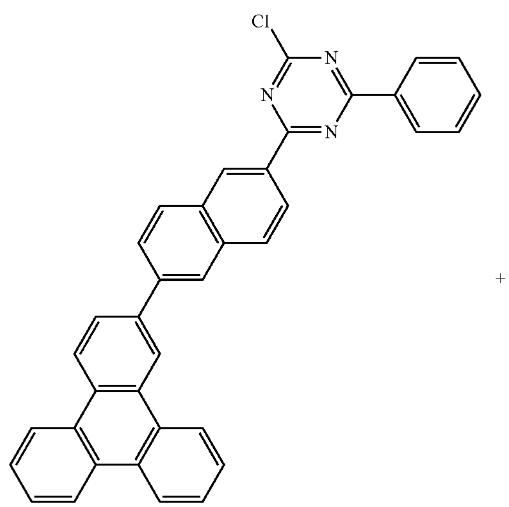

-continued
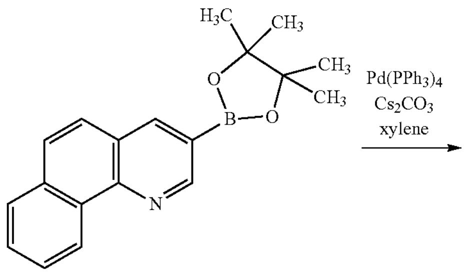
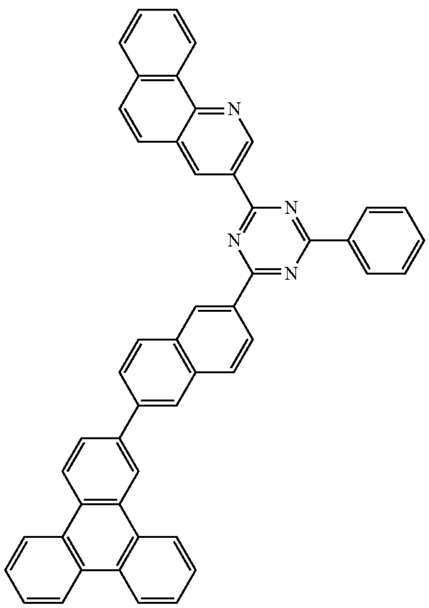
(130)
(5-3)
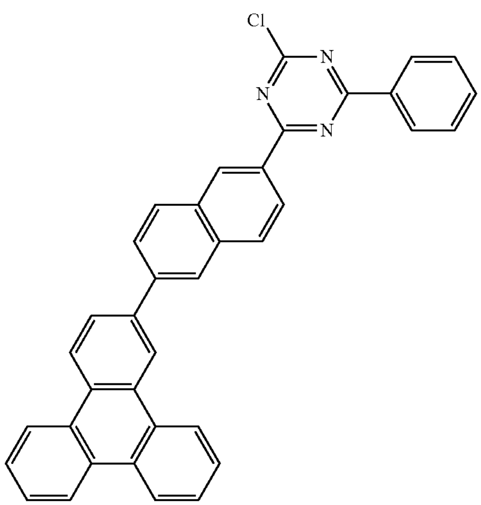
+
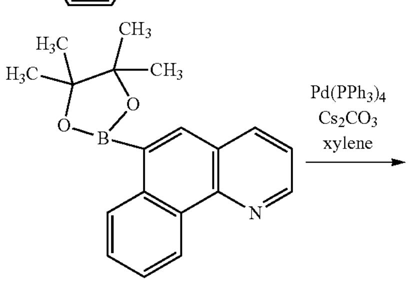
-continued
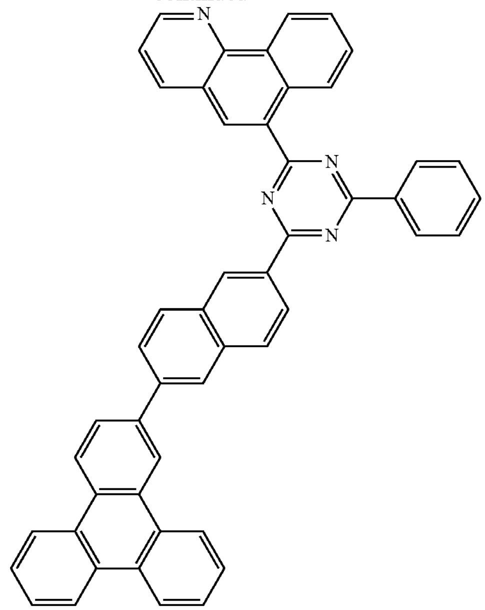
(158)
(5-4)
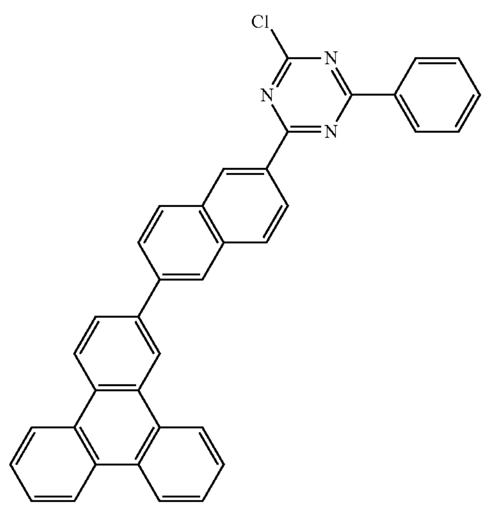
+
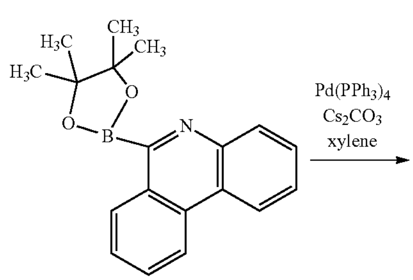

-continued
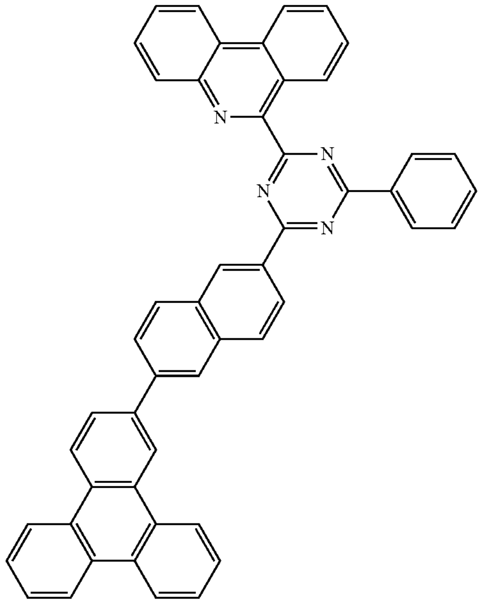
(116)
-continued
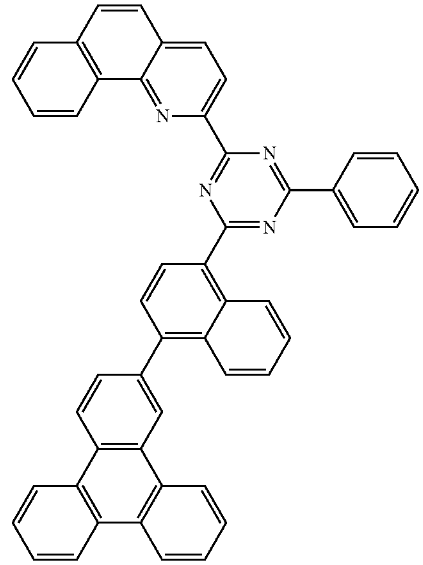
(105)
[Chemical Formula 37]
(5-5)
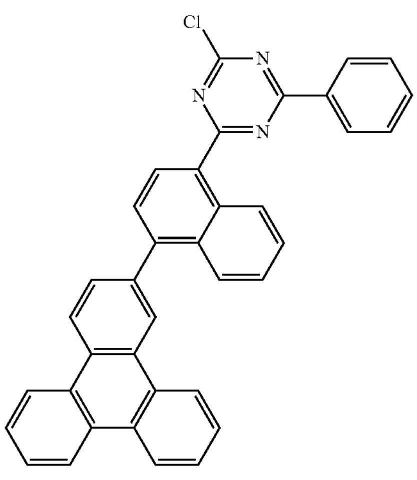
+
(5-6)
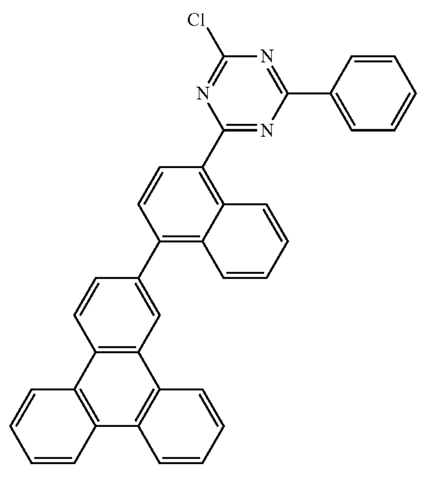
+
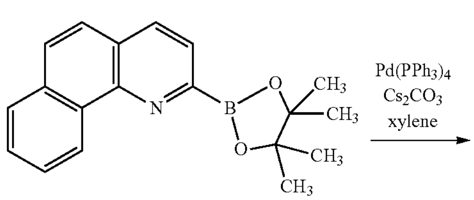
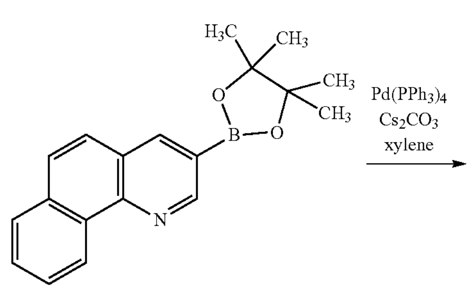

-continued
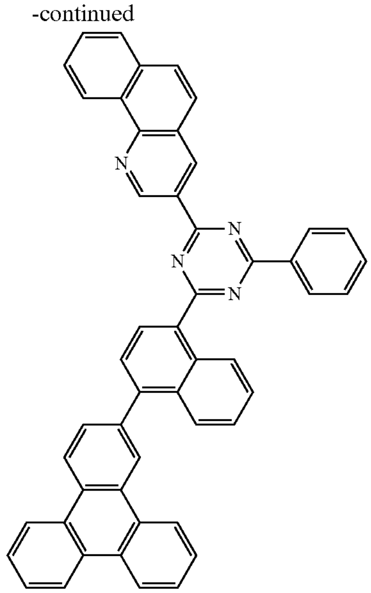
(128)
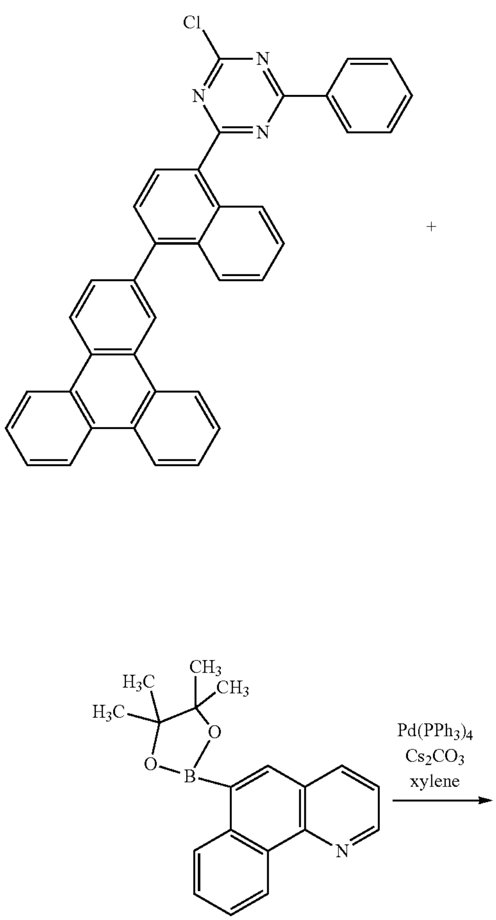
(5-7)
-continued
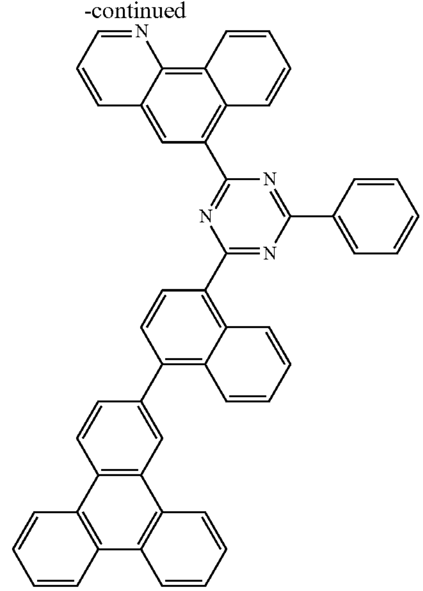
(156)
[Chemical Formula 38]
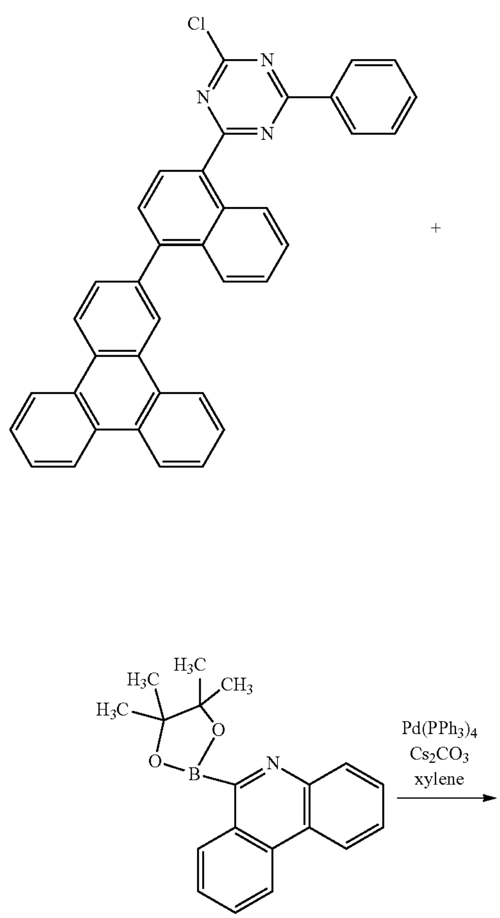
(5-8)

-continued
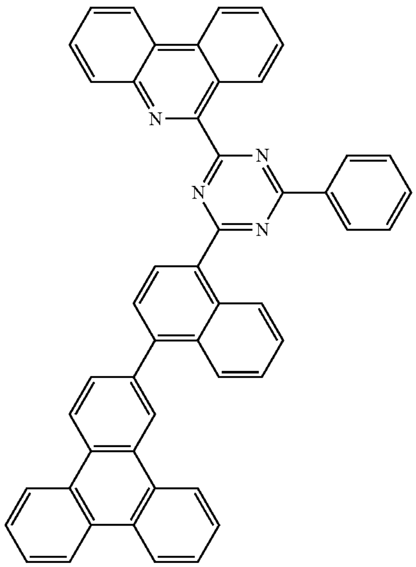
(121)
(5-9)
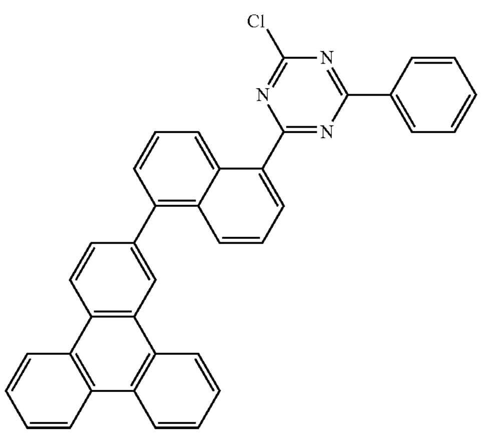
+
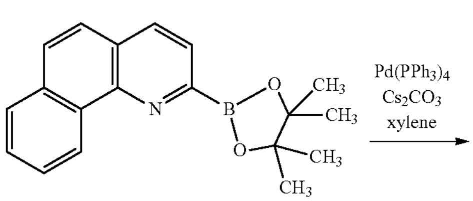
-continued
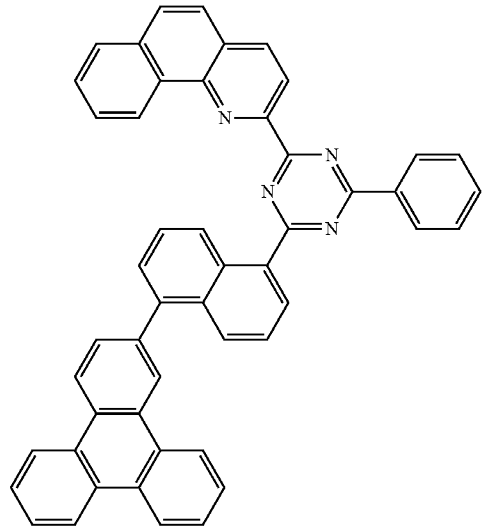
(106)
(5-10)
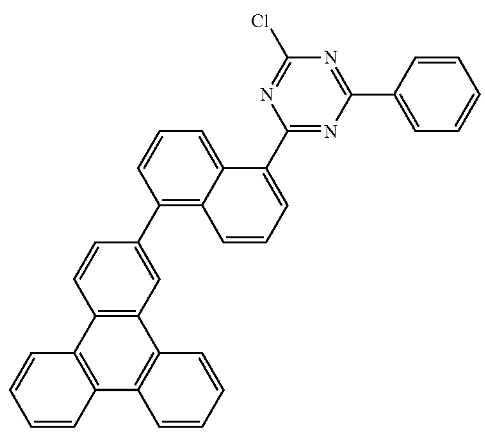
+
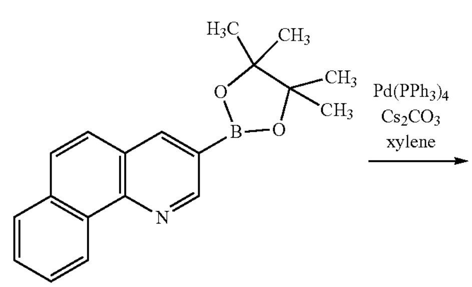

-continued
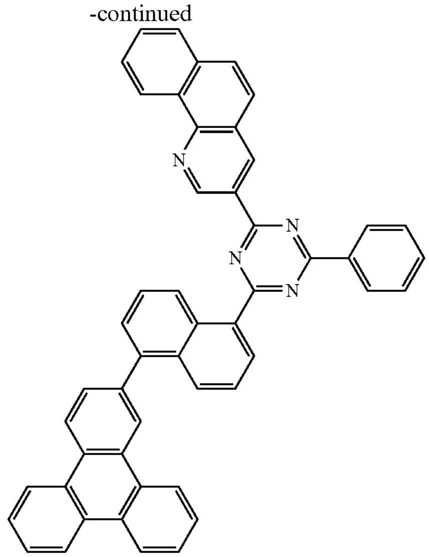
(129)
[Chemical Formula 39]
(5-11)
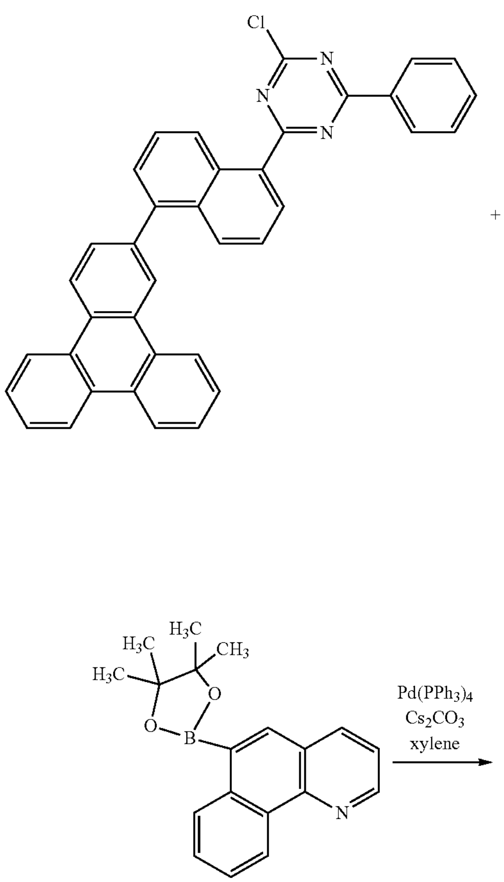
-continued
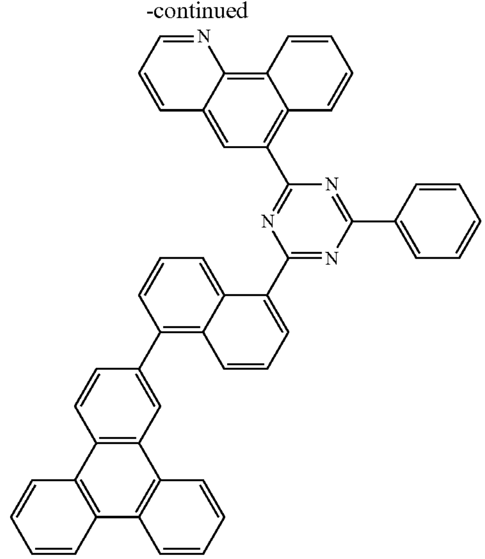
(157)
(5-12)
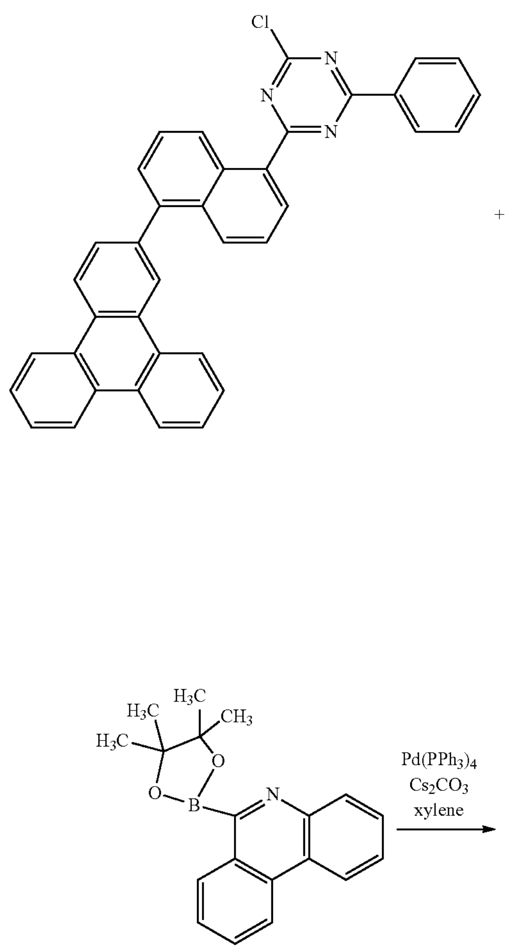

-continued

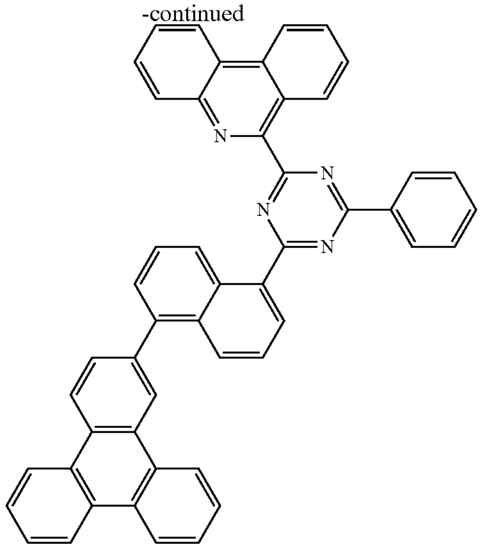

(123)

Note that the synthesis methods of the compounds (116), (130), (105), (158), (128), (121), and (156) are the synthesis methods similar to the method of the compound (100) based on Reaction Schemes (b-1) and (b-2) shown in Embodiment 1. The synthesis methods of the compounds (116), (130), (105), (158), (128), (121), and (156) are not limited to the above; for example, the compounds (116), (130), (105), (158), (128), (121), and (156), which are the target substances, can also be obtained in such a manner that a cross-coupling reaction between 4,4,5,5-tetramethyl-2-(benzoquinolinyl)-1,3,2-dioxaborolane or 4,4,5,5-tetramethyl-2-(benzoisoquinolinyl)-1,3,2-dioxaborolane and 2,4-dichloro-1,3,5-triazine in a molar ratio of 1:1 is caused first, and then, a cross-coupling reaction between the target substance obtained by the reaction and 4,4,5,5-tetramethyl-2-[6-(triphenylene-2-yl)naphthyl]-1,3,2-dioxaborolane is caused, in accordance with Reaction Schemes (a-1) and (a-2) shown in Embodiment 1.

The compounds (100), (116), (130), (105), (158), (128), (121), and (156) synthesized in the above manner can be purified to have the purity (higher than or equal to 99.9%) which is suitable for an organic EL element through sublimation purification by a train sublimation method after the purification to be highly purified by silica gel column chromatography, high-performance liquid chromatography (HPLC), supercritical fluid chromatography (SFC), recrystallization, or the like. The purification methods of the compounds of the present invention are not limited thereto.

Next, a calculation method of the HOMO level and the LUMO level of the compounds (100), (116), (130), (105), (158), (128), (121), and (156) on the basis of cyclic voltammetry (CV) measurement is shown below.

An electrochemical analyzer (model number: ALS model 600A or 600C, manufactured by BAS Inc.) can be used as a measurement apparatus. To prepare a solution for the CV measurement, dehydrated dimethylformamide (DMF) (manufactured by Sigma-Aldrich Inc., 99.8%, catalog No. 22705-6) is used as a solvent, tetra-n-butylammonium perchlorate (n-Bu4NClO4) (manufactured by Tokyo Chemical Industry Co., Ltd., catalog No. T0836) as a supporting electrolyte is dissolved at a concentration of 100 mmol/L, and the object to be measured is dissolved at a concentration of 2 mmol/L. A platinum electrode (PTE platinum electrode, manufactured by BAS Inc.) is used as a working electrode, another platinum electrode (Pt counter electrode for VC-3 (5 cm), manufactured by BAS Inc.) is used as an auxiliary electrode, and an Ag/Ag+ electrode (RE7 reference electrode for non-aqueous solvent, manufactured by BAS Inc.) is used as a reference electrode. Note that the measurement is conducted at room temperature (20 to 25° C.). The scan speed in the CV measurement is fixed to 0.1 V/sec, and an oxidation potential Ea [V] and a reduction potential Ec [V] with respect to the reference electrode are measured. Ea is an intermediate potential of an oxidation-reduction wave, and Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae: HOMO level [eV]=−4.94−Ea and LUMO level [eV]=−4.94−Ec.

Since the compounds (100), (116), (130), (105), (158), (128), (121), and (156) do not have a skeleton which is likely to accept holes and be oxidized in their molecular structures, they probably have a deep HOMO level. Specifically, it is estimated to be approximately −6.0 eV or deeper, and it is also anticipated that an oxidation wave is not observed in the above-described CV measurement. In the case where an oxidation wave is not observed, the LUMO level is probably deeper than −6.2 eV, and thus the compounds have an excellent hole-blocking property. On the other hand, the LUMO level is estimated to be approximately −3.0 eV due to a 1,3,5-triazine skeleton, and thus the above-described compounds have an electron-injection property and an electron-transport property, which are both extremely high. When a benzoquinoline skeleton or a benzoisoquinoline skeleton is bonded to a 1,3,5-triazine skeleton, the LUMO orbital becomes more stable, and thus, the LUMO level probably becomes deeper than −3.0 eV. From the above, when a HOMO-LUMO difference of the above-described compounds is considered, it can be inferred that the compounds have a wide band gap which is more than or equal to 3.0 eV.

Thus, a light-emitting device using the compound represented by General Formula (G1) above for an electron-transport layer or an electron-injection layer has an excellent electron-injection property to a light-emitting layer, and also has an excellent hole-blocking property. Since the electron-transport property is high and holes can be prevented from going through the light-emitting layer to the electron-transport layer side, high emission efficiency and low driving voltage can be achieved at the same time. A light-emitting layer of a light-emitting device using the compound of the present invention for an electron-transport layer or an electron-injection layer has an excellent electron-injection property to a light-emitting layer, and thus adjustment of the carrier balance of the light-emitting layer is important. In that case, it is preferable for the transport property of the light-emitting layer that both an electron-transport host and a hole-transport host, not only one kind of a bipolar host, be included and the carrier balance of the light-emitting layer be optimally adjusted by the mixture ratio of the hosts. Since the electron-transport host has a deep LUMO level and the hole-transport host has a shallow HOMO level, when these materials with such properties are mixed to be used for the host material, an exciplex is formed in the light-emitting layer as an element is driven in many cases due to the interaction between the LUMO level of the electron-transport host and the HOMO level of the hole-transport host. The S1 level and the T1 level of the exciplex are very close, and reverse intersystem crossing can occur. Since energy can be directly transferred from Si of the exciplex to T1 of a light-emitting layer guest (a phosphorescent substance), light emission can be obtained through a minimum necessary excited state while maintaining high efficiency without loss of excitation energy, whereby a long driving lifetime element can be obtained.

Thus, a light-emitting layer guest (a light-emitting substance) used for the light-emitting device of the present invention is preferably a phosphorescent substance which can efficiently convert excitation energy of the host into light emission. In the case where a bipolar host is used instead of a mixed host, a TADF (thermally activated delayed fluorescent) host having a feature similar to an exciplex is used and thus an element which efficiently converts T1 energy of the host into a light-emitting substance can also be obtained. An element including the above-described light-emitting layer can be achieved in not only as a single element but also as a tandem element. Thus, the compound of the present invention can be suitably used for a charge-generation layer (intermediate layer) of a tandem element.

REFERENCE NUMERALS

101: anode, 102: cathode, 103: EL layer, 111: hole-injection layer, 112: hole-transport layer, 113: light-emitting layer, 113-1: light-emitting region, 114: electron-transport layer, 114-1: non-light-emitting recombination region, 115: electron-injection layer, 116: charge-generation layer, 117: p-type layer, 118: electron-relay layer, 119: electron-injection buffer layer, 201: anode, 202: cathode, 210: first layer, 211: second layer, 212: third layer, 300: absorption spectrum of light emitting material, 301: emission spectrum of exciplex, 302: emission spectrum of second organic compound, 303: emission spectrum of first organic compound, 400: substrate, 401: anode, 403: EL layer, 404: cathode, 405: sealant, 406: sealant, 407: sealing substrate, 412: pad, 420: IC chip, 501: anode, 502: cathode, 511: first light-emitting unit, 512: second light-emitting unit, 513: charge-generation layer, 601: driver circuit portion (source line driver circuit), 602: pixel portion, 603: driver circuit portion (gate line driver circuit), 604: sealing substrate, 605: sealant, 607: space, 608: wiring, 609: FPC (flexible printed circuit), 610: element substrate, 611: switching FET, 612: current controlling FET, 613: anode, 614: insulator, 616: EL layer, 617: cathode, 618: light-emitting device, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: anode, 1024R: anode, 1024G: anode, 1024B: anode, 1025: partition, 1028: EL layer, 1029: cathode, 1031: sealing substrate, 1032: sealant, 1033: transparent base material, 1034R: red coloring layer, 1034G: green coloring layer, 1034B: blue coloring layer, 1035: black matrix, 1036: overcoat layer, 1037: third interlayer insulating film, 1040: pixel portion, 1041: driver circuit portion, 1042: peripheral portion, 2001: housing, 2002: light source, 2100: robot, 2110: arithmetic device, 2101: illuminance sensor, 2102: microphone, 2103: upper camera, 2104: speaker, 2105: display, 2106: lower camera, 2107: obstacle sensor, 2108: moving mechanism, 3001: lighting device, 5000: housing, 5001: display portion, 5002: second display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5150: portable information terminal, 5151: housing, 5152: display region, 5153: bend portion, 5120: dust, 5200: display region, 5201: display region, 5202: display region, 5203: display region, 7101: housing, 7103: display portion, 7105: stand, 7107: display portion, 7109: operation keys, 7110: remote controller, 7201: main body, 7202: housing, 7203: display portion, 7204: keyboard, 7205: external connection port, 7206: pointing device, 7210: second display portion, 7401: housing, 7402: display portion, 7403: operation button, 7404: external connection port, 7405: speaker, 7406: microphone, 9310: portable information terminal, 9311: display panel, 9313: hinge, 9315: housing This application is based on Japanese Patent Application Serial No. 2019-087091 filed on Apr. 30, 2019, the entire contents of which are hereby incorporated herein by reference.

The invention claimed is:

1. A light-emitting device comprising an anode, a cathode, and an EL layer, wherein the EL layer is positioned between the anode and the cathode, wherein the EL layer comprises a light-emitting layer and an electron-transport layer, wherein the electron-transport layer is positioned between the light-emitting layer and the cathode, wherein the light-emitting layer comprises a host material and an emission center substance, wherein an absorption band positioned on the longest wavelength in an absorption spectrum of the emission center substance overlaps with a peak of an emission spectrum of the host material, and wherein the electron-transport layer comprises an organic compound represented by General Formula (G1):

(G1)

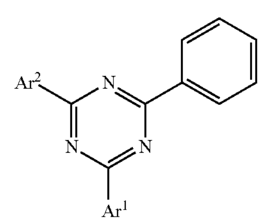

wherein $Ar^1$ represents a benzoquinolyl group or a benzoisoquinolyl group, and wherein $Ar^2$ represents a triphenylenylnaphthylene group or a naphthylenyltriphenylene-diyl group.

2. The light-emitting device according to claim 1, wherein the $Ar^1$ is any of groups represented by Structural Formulae (1-1) to (1-11):

(1-1)

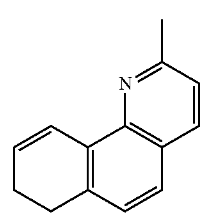

-continued
(1-2)
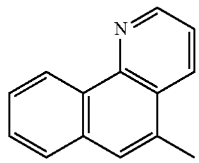
(1-3)
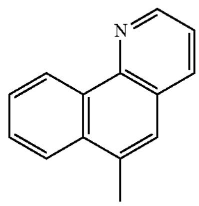
(1-4)
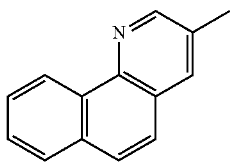
(1-5)
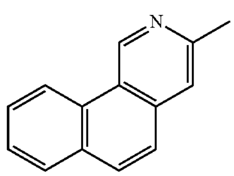
(1-6)
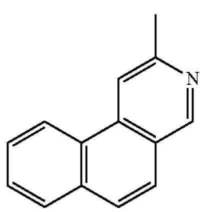
(1-7)
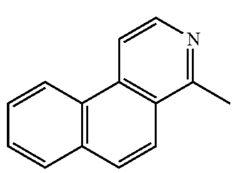
(1-8)
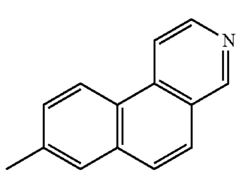
(1-9)
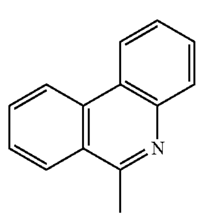
-continued
(1-10)
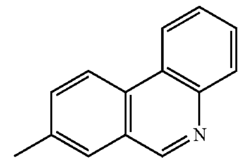
(1-11)
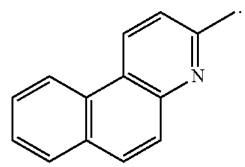
3. The light-emitting device according to claim 1, wherein the $Ar^2$ is any of groups represented by Structural Formulae (2-1) to (2-12):
(2-1)
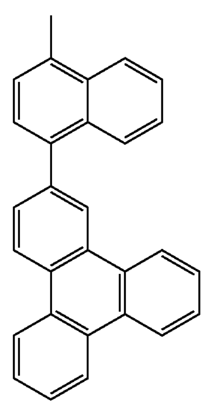
(2-2)
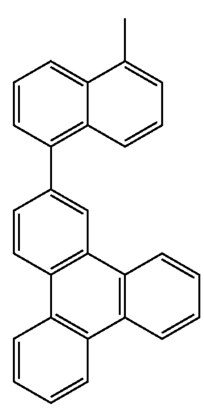

-continued
(2-3)
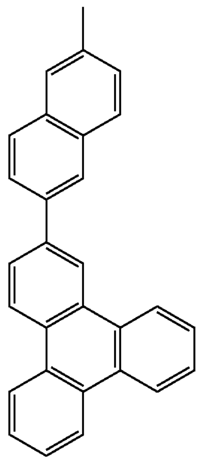
(2-4)
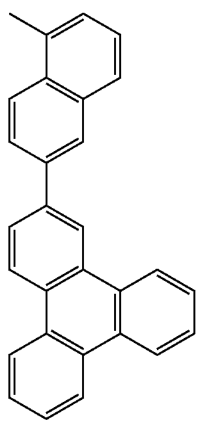
(2-5)
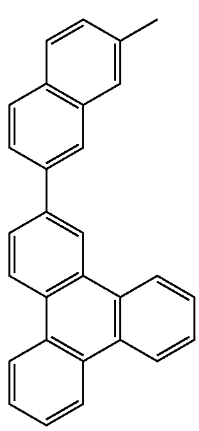
-continued
(2-6)
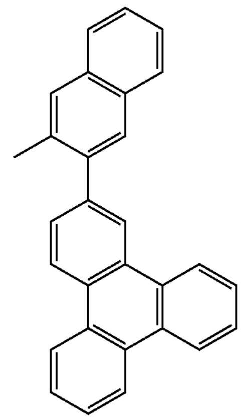
(2-7)
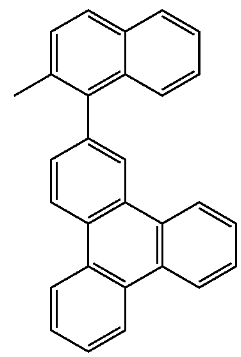
(2-8)
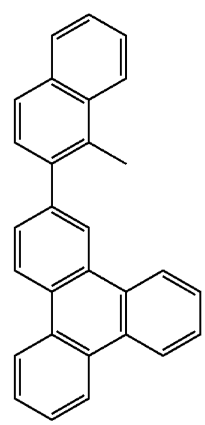
(2-9)
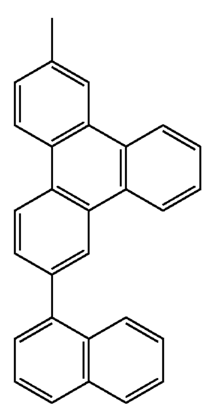

-continued (2-10)

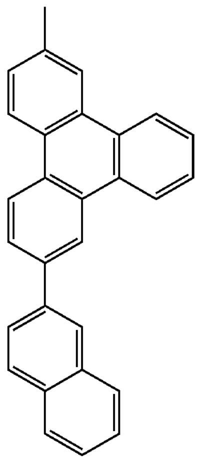

(2-11)

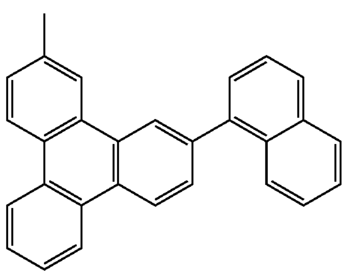

(2-12)

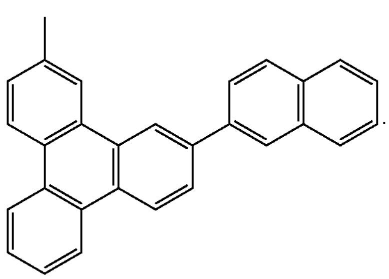

4. The light-emitting device according to claim 1, wherein the organic compound represented by the General Formula (G1) is an organic compound represented by Structural Formula (100):

(100)

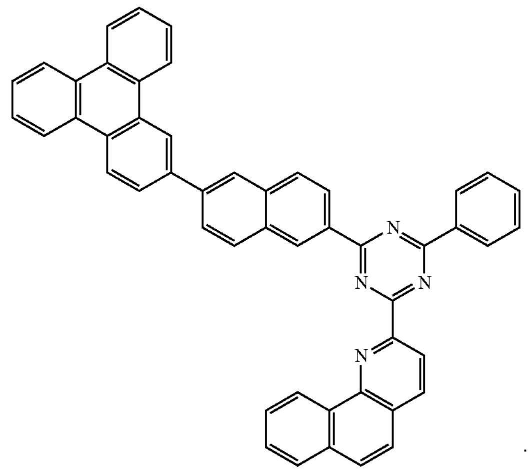

5. The light-emitting device according to claim 1, wherein the emission center substance is a phosphorescent substance.

6. The light-emitting device according to claim 1, wherein the first organic compound is an organic compound having an electron-transport property, and wherein the second organic compound is an organic compound having a hole-transport property.

7. An electronic device comprising the light-emitting device according to claim 1, and a sensor, an operation button, a speaker, or a microphone.

8. A light-emitting apparatus comprising the light-emitting device according to claim 1, and a transistor or a substrate.

9. A light-emitting apparatus comprising a plurality of light-emitting devices comprising a first light-emitting device and a second light-emitting device, wherein the first light-emitting device comprises a fluorescent light-emitting layer and an electron-transport layer in contact with the fluorescent light-emitting layer, wherein the second light-emitting device comprises a phosphorescent light-emitting layer and an electron-transport layer in contact with the phosphorescent light-emitting layer, wherein the electron-transport layers of the first light-emitting device and the second light-emitting device are continuous, and wherein the second light-emitting device is the light-emitting device a according to claim 1.

10. The light-emitting apparatus according to claim 9, wherein the fluorescent light-emitting layer comprises a fluorescent substance and an organic compound having an anthracene skeleton.

11. A lighting device comprising the light-emitting device according to claim 1, and a housing.

12. A light-emitting device comprising an anode, a cathode, and an EL layer, wherein the EL layer is positioned between the anode and the cathode, wherein the EL layer comprises a light-emitting layer and an electron-transport layer, wherein the electron-transport layer is positioned between the light-emitting layer and the cathode, wherein the light-emitting layer comprises a first organic compound, a second organic compound, and an emission center substance, wherein the first organic compound and the second organic compound form an exciplex, and wherein the electron-transport layer comprises an organic compound represented by General Formula (G1):

(G1)

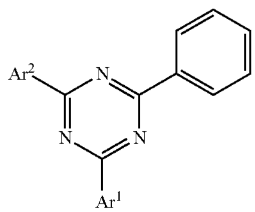

wherein $Ar^1$ represents a benzoquinolyl group or a benzoisoquinolyl group, and wherein $Ar^2$ represents a triphenylenylnaphthylene group or a naphthylenyltriphenylene-diyl group.

13. The light-emitting device according to claim 12, wherein an absorption band positioned on the longest wavelength in an absorption spectrum of the emission center substance overlaps with a peak of an emission spectrum of the exciplex.

14. The light-emitting device according to claim 12, wherein the $Ar^1$ is any of groups represented by Structural Formulae (1-1) to (1-11):

(1-1)

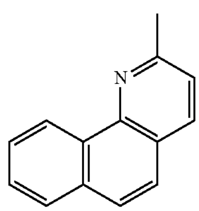

(1-2)

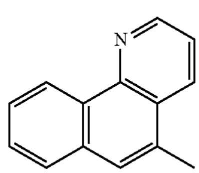

(1-3)

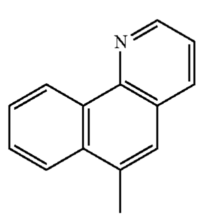

(1-4)

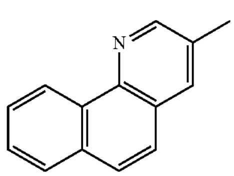

-continued (1-5)

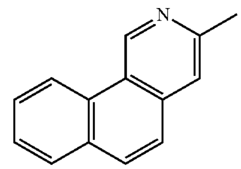

(1-6)

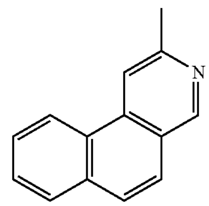

(1-7)

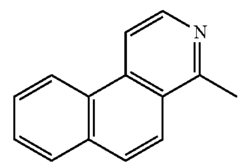

(1-8)

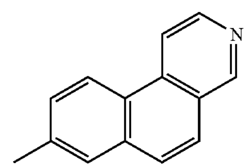

(1-9)

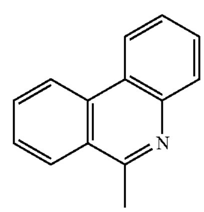

(1-10)

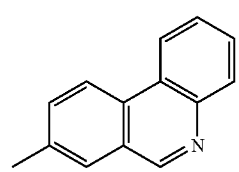

(1-11)

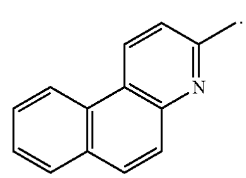

15. The light-emitting device according to claim 12, wherein the $Ar^2$ is any of groups represented by Structural Formulae (2-1) to (2-12):

-continued
(2-1)
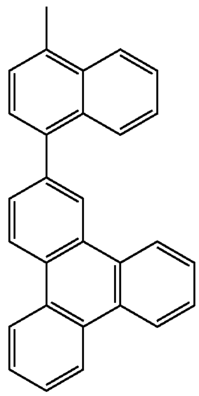
(2-2)
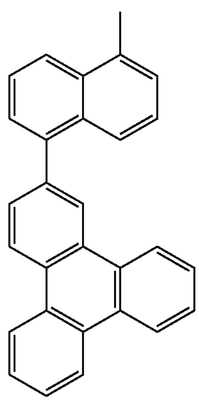
(2-3)
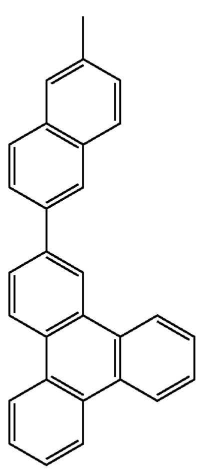
(2-4)
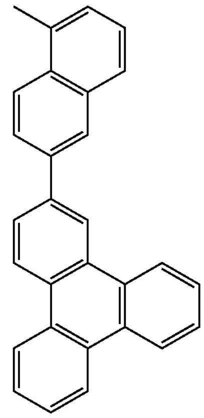
(2-5)
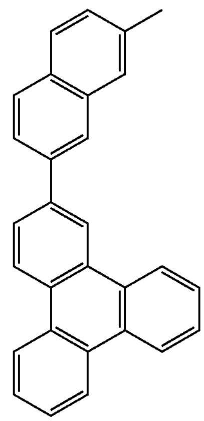
(2-6)
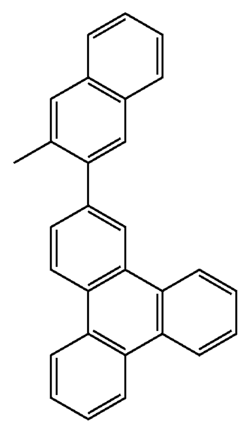
(2-7)
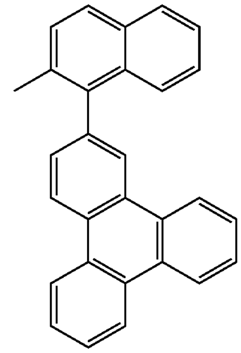

-continued (2-8)

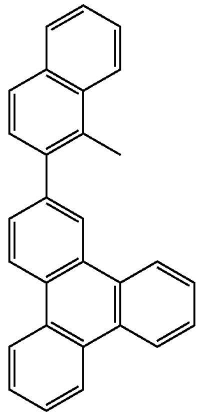

(2-9)

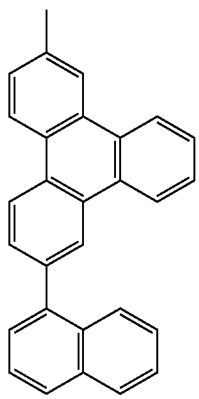

(2-10)

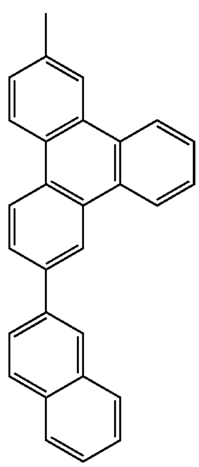

-continued (2-11)

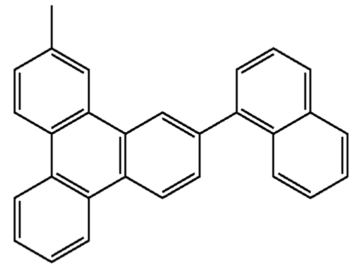

(2-12)

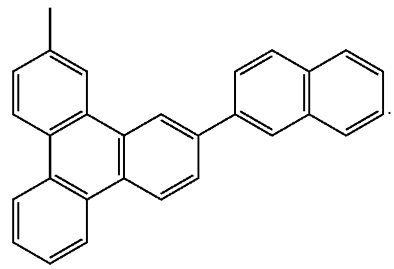

.

16. The light-emitting device according to claim 12, wherein the emission center substance is a phosphorescent substance.

17. The light-emitting device according to claim 12, wherein the first organic compound is an organic compound having an electron-transport property, and wherein the second organic compound is an organic compound having a hole-transport property.

18. An electronic device comprising the light-emitting device according to claim 12, and a sensor, an operation button, a speaker, or a microphone.

19. A light-emitting apparatus comprising the light-emitting device according to claim 12, and a transistor or a substrate.

20. A light-emitting apparatus comprising a plurality of light-emitting devices comprising a first light-emitting device and a second light-emitting device, wherein the first light-emitting device comprises a fluorescent light-emitting layer and an electron-transport layer in contact with the fluorescent light-emitting layer, wherein the second light-emitting device comprises a phosphorescent light-emitting layer and an electron-transport layer in contact with the phosphorescent light-emitting layer, wherein the electron-transport layers of the first light-emitting device and the second light-emitting device are continuous, and wherein the second light-emitting device comprises the light-emitting device according to claim 12.

* * * * *